(12) United States Patent
Nakano et al.

(10) Patent No.: US 8,305,553 B2
(45) Date of Patent: Nov. 6, 2012

(54) EXPOSURE APPARATUS AND DEVICE MANUFACTURING METHOD

(75) Inventors: Katsushi Nakano, Kumagaya (JP); Tsuneyuki Hagiwara, Tokyo (JP)

(73) Assignee: Nikon Corporation, Tokyo (JP)

( * ) Notice: Subject to any disclaimer, the term of this patent is extended or adjusted under 35 U.S.C. 154(b) by 1201 days.

(21) Appl. No.: 11/660,209

(22) PCT Filed: Aug. 17, 2005

(86) PCT No.: PCT/JP2005/015028
§ 371 (c)(1),
(2), (4) Date: Feb. 20, 2007

(87) PCT Pub. No.: WO2006/019124
PCT Pub. Date: Feb. 23, 2006

(65) Prior Publication Data
US 2007/0263182 A1  Nov. 15, 2007

(30) Foreign Application Priority Data

Aug. 18, 2004 (JP) ................................ 2004-238007
Oct. 25, 2004 (JP) ................................ 2004-309322
Mar. 28, 2005 (JP) ................................ 2005-091221

(51) Int. Cl.
*G03B 27/42* (2006.01)
*G03B 27/58* (2006.01)
(52) U.S. Cl. .......................................... 355/53; 355/72
(58) Field of Classification Search .................. 355/53, 355/72, 68
See application file for complete search history.

(56) References Cited

U.S. PATENT DOCUMENTS

| | | | |
|---|---|---|---|
| 3,648,587 | A | 3/1972 | Stevens |
| 4,346,164 | A | 8/1982 | Tabarelli et al. |
| 4,465,368 | A | 8/1984 | Matsuura et al. |
| 4,480,910 | A | 11/1984 | Takanashi et al. |
| 4,780,747 | A | 10/1988 | Suzuki et al. |
| 5,194,893 | A | 3/1993 | Nishi |
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |

(Continued)

FOREIGN PATENT DOCUMENTS

DE  221 563 A1  4/1985

(Continued)

OTHER PUBLICATIONS

International Search Report issued in International Application No. PCT/JP2005/015028 mailed on Nov. 22, 2005.

(Continued)

*Primary Examiner* — Peter B Kim
(74) *Attorney, Agent, or Firm* — Oliff & Berridge, PLC

(57) ABSTRACT

Provided is an exposure apparatus that is able to prevent liquid from remaining on a measuring part. An exposure apparatus comprises a measuring system (60), which has a first pattern (61) formed on the upper surface of a substrate stage, and a second area (S2) specified on the upper surface in the vicinity of a first area (S1), which includes the first pattern (61), and a second pattern (80) is formed in the second area (S2) so that the liquid (LQ) that has remained so as to span the first area (S1) and the second area (S2) retreats from the first area (S1) and collects in the second area (S2).

58 Claims, 34 Drawing Sheets

U.S. PATENT DOCUMENTS

| | | |
|---|---|---|
| 5,874,820 A | 2/1999 | Lee |
| 5,969,441 A | 10/1999 | Loopstra et al. |
| 6,208,407 B1 | 3/2001 | Loopstra |
| 6,262,796 B1 | 7/2001 | Loopstra et al. |
| 6,341,007 B1 | 1/2002 | Nishi et al. |
| 6,496,257 B1 | 12/2002 | Taniguchi et al. |
| 6,650,399 B2 | 11/2003 | Baselmans et al. |
| 6,819,414 B1 | 11/2004 | Takeuchi |
| 6,897,963 B1 | 5/2005 | Taniguchi et al. |
| 2002/0041377 A1 | 4/2002 | Hagiwara et al. |
| 2002/0061469 A1 | 5/2002 | Tanaka |
| 2002/0163629 A1 | 11/2002 | Switkes et al. |
| 2003/0011763 A1 | 1/2003 | Taniguchi et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0075895 A1 | 4/2004 | Lin |
| 2004/0090606 A1 | 5/2004 | Ishikawa |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Maria Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0233405 A1 | 11/2004 | Kato et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0007569 A1 | 1/2005 | Streefkerk et al. |
| 2005/0024609 A1 | 2/2005 | De Smit et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0042554 A1 | 2/2005 | Dierichs et al. |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0132914 A1 | 6/2005 | Mulkens et al. |
| 2005/0134815 A1 | 6/2005 | Van Santen et al. |
| 2005/0141098 A1 | 6/2005 | Schuster |
| 2005/0145803 A1 | 7/2005 | Hakey et al. |
| 2005/0146694 A1 | 7/2005 | Tokita |
| 2005/0146695 A1 | 7/2005 | Kawakami |
| 2005/0147920 A1 | 7/2005 | Lin et al. |
| 2005/0153424 A1 | 7/2005 | Coon |
| 2005/0158673 A1 | 7/2005 | Hakey et al. |
| 2005/0164502 A1 | 7/2005 | Deng et al. |
| 2005/0174549 A1 | 8/2005 | Duineveld et al. |
| 2005/0175940 A1 | 8/2005 | Dierichs |
| 2005/0185269 A1 | 8/2005 | Epple et al. |
| 2005/0190435 A1 | 9/2005 | Shafer et al. |
| 2005/0190455 A1 | 9/2005 | Rostalski et al. |
| 2005/0205108 A1 | 9/2005 | Chang et al. |
| 2005/0213061 A1 | 9/2005 | Hakey et al. |
| 2005/0213072 A1 | 9/2005 | Schenker et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0219481 A1 | 10/2005 | Cox et al. |
| 2005/0219482 A1 | 10/2005 | Baselmans et al. |
| 2005/0219488 A1 | 10/2005 | Nei et al. |
| 2005/0219499 A1 | 10/2005 | Maria Zaal et al. |
| 2005/0225737 A1 | 10/2005 | Weissenrieder et al. |
| 2005/0231694 A1 | 10/2005 | Kolesnychenko et al. |
| 2005/0237501 A1 | 10/2005 | Furukawa et al. |
| 2005/0237504 A1 | 10/2005 | Nagasaka et al. |
| 2005/0243292 A1 | 11/2005 | Baselmans et al. |
| 2005/0245005 A1 | 11/2005 | Benson |
| 2005/0253090 A1 | 11/2005 | Gau et al. |
| 2005/0259232 A1 * | 11/2005 | Streefkerk et al. ............... 355/53 |
| 2005/0259233 A1 | 11/2005 | Streefkerk et al. |
| 2005/0264778 A1 | 12/2005 | Lof et al. |
| 2005/0270505 A1 | 12/2005 | Smith |
| 2006/0077367 A1 | 4/2006 | Kobayashi et al. |
| 2006/0119813 A1 | 6/2006 | Hultermans et al. |
| 2006/0119816 A1 * | 6/2006 | Baselmans et al. ............. 355/53 |

FOREIGN PATENT DOCUMENTS

| | | |
|---|---|---|
| DE | 224 448 A1 | 7/1985 |
| EP | 0 060 729 A2 | 9/1982 |
| EP | 1 079 223 A1 | 2/2001 |
| EP | 1 420 299 A2 | 5/2004 |
| EP | 1 571 695 A1 | 9/2005 |
| EP | 1 571 698 A1 | 9/2005 |
| EP | 1 571 699 A1 | 9/2005 |
| EP | 1 628 329 A1 | 2/2006 |
| JP | A 57-117238 | 7/1982 |
| JP | A-57-117238 | 7/1982 |
| JP | A-57-153433 | 9/1982 |
| JP | A 58-202448 | 11/1983 |
| JP | A-59-007949 | 1/1984 |
| JP | A 59-19912 | 2/1984 |
| JP | A 62-65326 | 3/1987 |
| JP | 62-183522 | 8/1987 |
| JP | A-62-183522 | 8/1987 |
| JP | A 63-157419 | 6/1988 |
| JP | A 4-65603 | 3/1992 |
| JP | A-4-65603 | 3/1992 |
| JP | A 4-277612 | 10/1992 |
| JP | A 4-305915 | 10/1992 |
| JP | A 4-305917 | 10/1992 |
| JP | A 5-62877 | 3/1993 |
| JP | A 6-53120 | 2/1994 |
| JP | A 6-124873 | 5/1994 |
| JP | A 6-188169 | 7/1994 |
| JP | A 7-176468 | 7/1995 |
| JP | A 7-220990 | 8/1995 |
| JP | A 8-37149 | 2/1996 |
| JP | A 8-166475 | 6/1996 |
| JP | A 8-316125 | 11/1996 |
| JP | A 8-330224 | 12/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-16816 | 1/1999 |
| JP | A 11-135400 | 5/1999 |
| JP | A 11-176727 | 7/1999 |
| JP | A-11-283903 | 10/1999 |
| JP | A 2000-58436 | 2/2000 |
| JP | A 2000-505958 | 5/2000 |
| JP | A 2000-164504 | 6/2000 |
| JP | A 2001-345245 | 12/2001 |
| JP | A 2002-14005 | 1/2002 |
| JP | A 2002-71514 | 3/2002 |
| JP | A 2002-198303 | 7/2002 |
| JP | A-2004-207696 | 7/2004 |
| JP | A 2004-207696 | 7/2004 |
| JP | A-2004-207711 | 7/2004 |
| JP | A 2005-116571 | 4/2005 |
| JP | A 2005-183656 | 7/2005 |
| JP | A 2005-277363 | 10/2005 |
| JP | A 2005-303316 | 10/2005 |

| | | |
|---|---|---|
| WO | WO 99/49504 | 9/1999 |
| WO | WO 99-60361 | 11/1999 |
| WO | WO 01/35168 A1 | 5/2001 |
| WO | WO 02/091078 A1 | 11/2002 |
| WO | WO 03/077037 A1 | 9/2003 |
| WO | WO 2004/019128 A2 | 3/2004 |
| WO | WO 2004/053953 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/105107 A1 | 12/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 A2 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A2 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |

OTHER PUBLICATIONS

Written Opinion issued in International Application No. PCT/JP2005/015028 on Nov. 22, 2005.
Office Action issued in European Patent Application No. 05780490.8 on Sep. 8, 2010.
Office Action issued in European Patent Application No. 05780490.8 on Sep. 26, 2008.
Supplementary European Search Report issued in European Patent Application No. 05780490.8 on May 7, 2008.
Jun. 21, 2011 Office Action issued in Japanese Patent Application No. 2006-531833.
Nikon Corporation, Immersion Lithography Workshop, Dec. 11, 2002, "Immersion lithography", Soichi Owa, 24 pages (slides 1-24).
May 31, 2007 Office Action issued in U.S. Appl. No. 11/284,187.
Feb. 14, 2008 Notice of Allowance issued in U.S. Appl. No. 11/284,187.
Emerging Lithographic Technologies VI, Proceedings of SPIE, vol. 4688 (2002), "Semiconductor Foundry, Lithography, and Partners", B.J. Lin, pp. 11-24.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, $3^{rd}$ 157 nm symposium, Sep. 4, 2002, "Nikon F2 Exposure Tool", Soichi Owa et al., 25 pages (slides 1-25).
Nikon Corporation, Litho Forum, Jan. 28, 2004, "Update on 193 nm immersion exposure tool", S. Owa et al., 51 pages (slides 1-51).
Nikon Corporation, NGL Workshop, Jul. 10, 2003, "Potential performance and feasibility of immersion lithography", Soichi Owa et al., 33 pages, slides 1-33.
Optical Microlithography XV, Proceedings of SPIE, vol. 4691 (2002), "Resolution Enhancement of 157 nm Lithography by Liquid Immersion", M. Switkes et al., pp. 459-465.
Optical Microlithography XVI, Proceedings of SPIE vol. 5040 (2003), "Immersion lithography; its potential performance and issues", Soichi OWA et al., pp. 724-733.
Nikon Corporation, Immersion Workshop, Jan. 27, 2004, "Update on 193nm immersion exposure tool", S. Owa et al., 38 pages (slides 1-38).

* cited by examiner

EXPOSURE APPARATUS AND DEVICE MANUFACTURING METHOD

TECHNICAL FIELD

The present invention relates to an exposure apparatus that exposes a substrate via a liquid and to a device manufacturing method that uses that exposure apparatus.

The present application claims priority on Japanese Patent Application No. 2004-238007 filed on Aug. 18, 2004, Japanese Patent Application No. 2004-309322 filed on Oct. 25, 2004, and Japanese Patent Application No. 2005-091221 filed on Mar. 28, 2005, and the contents thereof are incorporated herein by reference.

BACKGROUND ART

A semiconductor device or a liquid crystal display device is manufactured by the technique known as photolithography, in which a pattern formed on a mask is transferred onto a photosensitive substrate. The exposure apparatus used in this photolithography process has a mask stage that supports a mask and a substrate stage that supports a substrate, and it transfers the pattern of the mask to the substrate via a projection optical system while sequentially moving the mask stage and the substrate stage. In recent years, higher resolutions for projection optical systems have been in demand to deal with farther high integration of device patterns. The resolution of the projection optical system becomes higher the shorter the exposure wavelength used and the larger the numerical aperture of the projection optical system. For this reason, the exposure wavelengths used in the exposure apparatus are becoming shorter year by year, and the numerical apertures of projection optical systems are also increasing. In addition, the mainstream exposure wavelength at present is the 248 nm of a KrF excimer laser, but a shorter wavelength, the 193 nm of an ArF excimer laser, is also coming into practical application. In addition, when exposure is performed, the depth of focus (DOF) is also important as well as the resolution. The resolution R and the depth of focus δ are restively expressed by the equations below.

$$R = k_1 \cdot \lambda / NA \quad (1)$$

$$\delta = \pm k_2 \cdot \lambda / NA^2 \quad (2)$$

Here, λ is the exposure wavelength NA is the numerical aperture of the projection optical system, and $k_1$ and $k_2$ are process coefficients. Based on Equation (1) and Equation (2), it is apparent that when the exposure wavelength λ is made shorter to increase the numerical are NA in order to increase the resolution R, the depth of focus δ becomes narrower.

When the depth of focus δ becomes too narrow, it becomes difficult to match the substrate surface to the image plane of the projection optical system, and there is concern that the focus margin during the exposure operation will be inadequate. Therefore, the liquid immersion method disclosed in Patent Document 1 below, for example, has been proposed as a method of effectively shortening the exposure wavelength and widening the depth of focus. This liquid immersion method fills the space between the lower surface of the projection optical system and tee substrate surface with a liquid such as water or an organic solvent to form a liquid immersion area, and it uses the fact that the wavelength of the exposure light in liquid becomes 1/n that in air (n is normally approximately 1.2 to 1.6 at the refractive index of the liquid) to increase the resolution as it increases the depth of focus by approximately n times.

Patent Document 1: PCT International Publication No. 99/49504

DISCLOSURE OF INVENTION

Problems to be Solved by the Invention

The various measuring parts, which measure light that has passed through the projection optical system, are provided on the substrate stage. In a liquid immersion exposure apparatus filling the space between the projection optical system and a measuring part with a liquid to form a liquid immersion area on the measuring part and measuring the light via the liquid of that liquid immersion area are conceivable. In that case, when, for example, the liquid remains on the measuring part after the operation of removal of the liquid on the measuring part, there is concern that liquid adherence traces (to be called "water marks" hereunder, even in cases in which the liquid is not pure water) also will be formed on the measuring part after that remaining liquid has vaporized. Since water marks act as foreign matter, there is concern that this will lead to deterioration of the measuring accuracy of the measuring system that has the measuring part.

A purpose of some aspects of the invention is to provide an exposure apparatus that is able to perform highly accurate measurement by forming a liquid immersion area on the measuring part as well as a device manufacturing method that uses that exposure apparatus.

In addition, another purpose is to provide an exposure apparatus that is able to prevent the liquid from remaining on the measuring part as well as a device manufacturing method that uses that exposure apparatus.

In addition, the purpose is to provide an exposure apparatus that is able to prevent the liquid from remaining on the measuring part as well as a device manufacturing method that uses that exposure apparatus.

Means for Solving the Problem

According to a first aspect of the present invention, there is provided an exposure apparatus that exposes a substrate via a liquid: comprising a measuring system , which has a first pattern formed on a prescribed surface, and a second area defined on the prescribed surface in the vicinity of a first area, which includes the first pattern, and a second pattern is formed in the second area so that the liquid that has remained and extended across the first area and the second area retreats from the first area and collects in the second area.

According to the first aspect of the present invention, in the case in which the liquid has remained and extended over the first area, which includes the first pattern of the measuring system, and the second area defined in the vicinity thereof, the liquid retreats from the first area and collects in the second area due to the second pattern formed in the second area. Therefore, it is possible to prevent the liquid from remaining on the first area, which includes the first pattern. Therefore, it is possible to prevent water marks from being formed on the first pattern of the measuring system, and it is possible to prevent deterioration of the measuring accuracy of the measuring system attributable to the remaining liquid and/or water marks.

According to a second aspect of the present invention, there is provided an exposure apparatus that exposes a substrate via a liquid: comprising a measuring system in which a measuring part is arranged on a prescribed surface, a first area, defined on the prescribed surface so as to include the measuring part, and a second area defined on the prescribed surface in the vicinity of the first area, and wherein the prescribed processing is performed for the surface of the first area or the surface of the second area, or both so that the liquid that has remained and extended over the first area and the second area retreats from the first area and collects in the second area.

According to the second aspect of the present invention, the prescribed processing is performed for the first area defined so as to include the measuring part or the second area defined in the vicinity thereof or both. Therefore, in the case in which the liquid has remained and extended across the first area and the second area, the liquid retreats from the first area and collects in the second area. Thus, it is possible to prevent the liquid from remaining on the first area, which includes the measuring part. Accordingly, it is possible to prevent water marks from being formed on the measuring part of the measuring system, and it is possible to prevent deterioration of the measuring accuracy of the measuring system attributable to the remaining liquid and/or water marks.

According to a third aspect of the present invention, there is provided an exposure apparatus that exposes a substrate via a liquid: comprising a measuring system in which a measuring part is arranged on a prescribed surface, a first area defined on the prescribed surface so as to include the measuring part, and a second area defined on the prescribed surface to be larger than the first area so as to include the first area, and wherein the first area is defined at a position separated from the center of the second area so that the liquid that has remained and extended over the first area and the second area retreats from the first area and collects in the second area.

According to the third mode of the present invention, even if the liquid remains and extends across the first area and the second area, the liquid retreats from the first area and collects in the second area, thus it is possible to prevent the liquid from remaining in the first area, which includes the measuring part. Therefore, it is possible to prevent water marks from being formed on the measuring part of the measuring system, and it is possible to prevent deterioration of the measuring accuracy of the measuring system.

According to a fourth aspect of the present invention, there is provided an exposure apparatus that exposes a substrate via a liquid: comprising a measuring system in which a measuring part is arranged on a prescribed surface, and a first area defined on the prescribed surface so as to include the measuring part, and wherein the first area is inclined so the liquid that has remained in the first area retreats from the first area.

According to the fourth mode of the present invention, by tilting the first area, which is defined so as to include the measuring part, even in the case in which the liquid has remained on the first ma, it is possible to cause that liquid that has remained to retreat from the first area. Therefore, it is possible to prevent the liquid from remaining on the first area, which includes the measuring part. Therefore, it is possible to prevent water marks from being formed on the measuring part of the measuring system, and it is possible to prevent deterioration of the measuring accuracy of the measuring system attributable to the remaining liquid and/or water marks.

According to a fifth aspect of the present invention, there is provided an exposure apparatus that exposes a substrate via a liquid: comprising a measuring system in which a measuring part is arranged on a prescribed surface, and a first area defined on the prescribed surface so as to include the measuring part, and wherein a gas flow onto the first area is produced so that the liquid that has remained in the first area retreats from the first area.

According to the fifth aspect of the present invention, it is possible to cause the liquid that has remained to retreat from the first area by producing a gas flow onto the first area, which is defined so as to include the measuring part. Therefore, it is possible to prevent liquid from remaining on the first area, which includes the measuring part. Therefore, it is possible to prevent water marks from being formed on the measuring part of the measuring system, and it is possible to prevent deterioration of the measuring accuracy of the measuring system attributable to the remaining liquid and/or water marks.

According to a sixth aspect of the present invention, there is provided an exposure apparatus that exposes a substrate via a liquid comprising a measuring system in which a measuring part is arranged on a prescribed surface, a first area defined on the prescribed surface so as to include the measuring part, and a second area in the vicinity of the first area, and wherein a liquid repellent is formed on the surface of the second area, and a liquid repellent film is not formed on the surface of the first area.

According to the sixth aspect of the present invention, a liquid repellent film is not formed on the measuring part, so it is possible to prevent deterioration in measuring accuracy attributable to degradation of the liquid repellent film.

According to a seventh aspect of the present invention, there is provided a device manufacturing method that uses an exposure apparatus of the above aspects.

According to the seventh aspect of the present invention, it is possible to perform measurement processing in a status in which deterioration of the measuring accuracy of the measuring system has been prevented, so it is possible to perform exposure processing for the manufacture of devices well based on those measurement results. Therefore, it is possible to provide a device that has the desired performance.

BEST MODE FOR CARRYING OUT THE INVENTION

Figure 1:
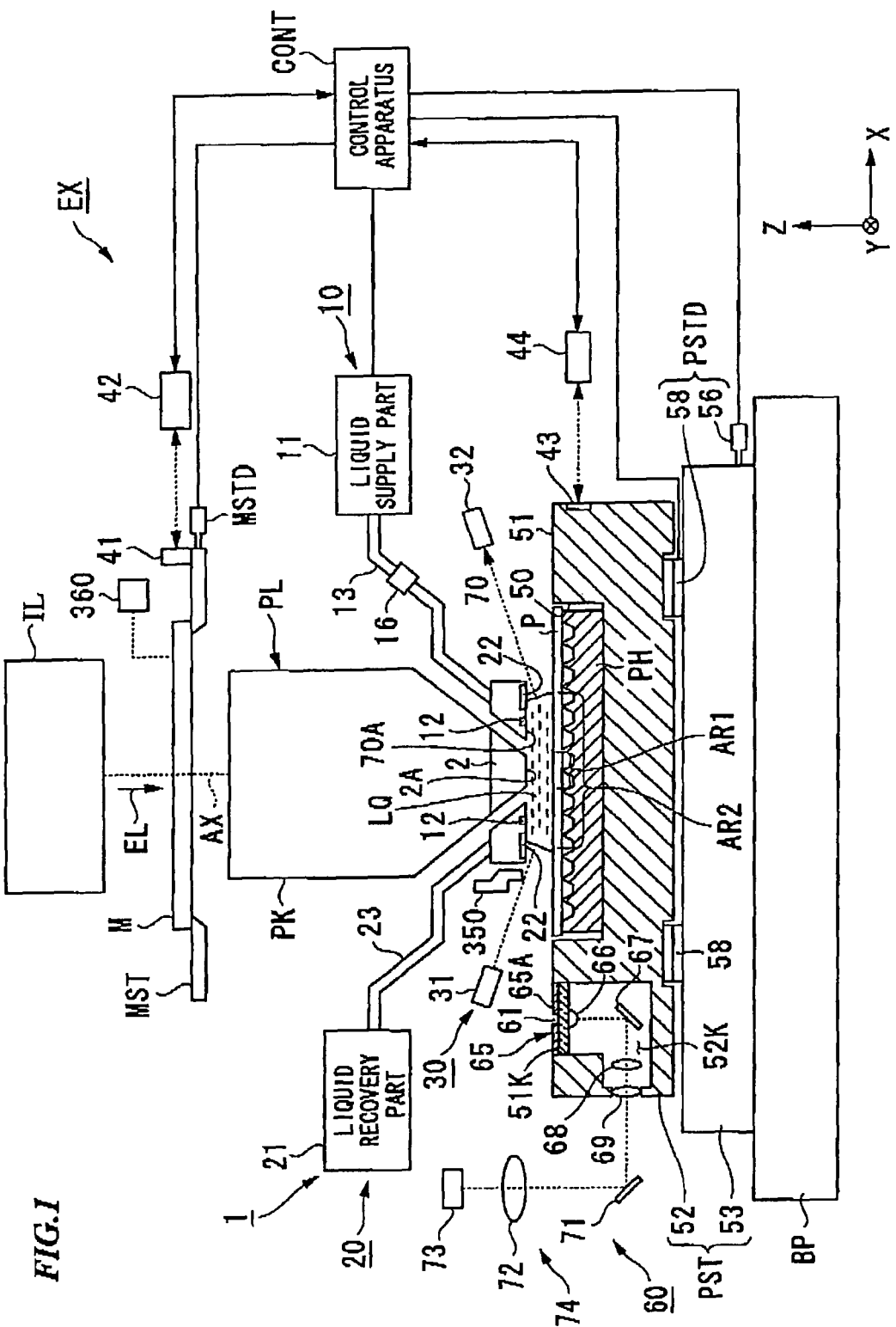
FIG. 1 is a schematic block diagram that shows an exposure apparatus relating to the first embodiment of the present invention.

Embodiments of the exposure apparatus relating to the present invention will be explained below while referring to the drawings.

First Embodiment

FIG. 1 is a schematic block diagram that shows an exposure apparatus EX relating to the first embodiment of the present invention. In FIG. 1, the exposure apparatus EX comprises a mask stage MST that is movable while supporting a mask M, a substrate stage PST that has a substrate holder PH for holding the substrate P, and that is movable while holding the substrate P on the substrate holder PH, an illumination optical system IL that illuminates the mask M that is supported by the mask stage MST with exposure light EL, a projection optical system PL that projects the pattern image of the mask M illuminated by the exposure light EL onto the substrate P supported by the substrate stage PST, and a control apparatus CONT that comprehensively controls operation of the entire exposure apparatus EX. In addition, the exposure apparatus EX comprises a spatial image measuring system 60 used in measurement of the image formation characteristics (optical characteristics) of the projection optical system PL. The spatial image measuring system 60 comprises a slit plate 65, which has a slit part 61 arranged on the image plane side of the projection optical system PL, a light receiving element 73 consisting of a photoelectric conversion element, and an optical system 74, which guides light that has passed through the slit plate 65 to the light receiving element 73. The light receiving element 73 receives the light (the exposure light EL) that has passed through the projection optical system PL via the slit plate 65 and the optical system 74.

The exposure apparatus EX of the present embodiment is a liquid immersion exposure apparatus that applies the liquid immersion method to effectively shorten the exposure wavelength to improve resolution while effectively widening the depth of focus. The exposure apparatus DC comprises a liquid immersion mechanism 1 that forms a liquid immersion area AR2 of the liquid LQ on the image plane side of the projection optical system PL. The liquid immersion mechanism 1 comprises a liquid supply mechanism 10, which supplies the liquid LQ to the image plane side of the projection optical system PL, and a liquid recovery apparatus 20, which recovers the liquid LQ of the image plane side of the projection optical system FL. In the present embodiment, pure water or purified water is used as the liquid LQ. The exposure apparatus EX locally forms a liquid immersion area AR2 that is larger than the projection area AR1 and smaller than the substrate P on at least a portion of the substrate P that includes the projection area AR1 of the projection optical system PL using the liquid LQ supplied from a liquid supply mechanism 10 at least while the pattern image of the mask M is being projected onto the substrate P. Specifically, the exposure apparatus EX fills the space between the optical element 2 of the front end of the image plane side of the projection optical system PL and the surface (exposure surface) of the substrate P to form the liquid immersion area AR2 with the liquid LQ, and it exposes the substrate P by projecting the pattern image of the mask M onto the substrate P via the projection optical system PL and this liquid LQ between the projection optical system FL and the substrate P.

A nozzle member 70, which comprises a part of the liquid immersion mechanism 1, is arranged in the vicinity of the image plane side of the projection optical system PL, specifically, in the vicinity of the optical element 2 of the front end of the image plane side of the projection optical system PL. The nozzle member 70 is a ring-shaped member provided so as to surround the periphery of the front end of the projection optical system PL above the substrate P (substrate stage PST).

Here, in the present embodiment, an explanation will be given which uses as an example the case of a scanning type exposure apparatus (a so-called scanning stepper) that, as the exposure apparatus EX, synchronously moves the mask M and the substrate P in mutually different directions (opposite directions) in the scanning direction (prescribed direction) while exposing the substrate P using the pattern formed on the mask M. In the following explanation, the synchronous movement direction (scanning direction, prescribed direction) of the mask M and the substrate P within the horizontal plane is the X axis direction, the direction perpendicular to the X axis direction within the horizontal plane is the Y axis direction (non-scanning direction), a direction that is perpendicular to the X axis and the Y axis and that matches the optical axis AX of the projection optical system PL is the Z axis direction. In addition, the mutation (tilting) directions around the X axis, the Y axis and the Z axis are the X, Y and Z directions respectively. Note that the "substrate" discussed here includes those in which a resist has been coated onto a semiconductor wafer, and "mask" includes reticles on which a device pattern to be reduction-projected onto a substrate has been formed.

The illumination optical system IL illuminates the mask M that is supported on the mask stage MST with exposure light EL. The illumination optical system IL has an exposure light source, an optical integrator that uniformizes the illumination of the light flux radiated from the exposure light source, a condenser lens that condenses the exposure light EL from the optical integrator, a relay lens system, and a field stop that sets the illumination area on the mask M illuminated with the exposure light EL. The prescribed illumination area on the mask M is illuminated by exposure light EL having a uniform illuminance distribution by the illumination optical system IL. Those usable as the exposure light EL irradiated from the illumination optical system IL include, for example, ultraviolet emission lines (g-ray, h-ray, i-ray) radiated, for example, from a mercury lamp, far ultraviolet light beams (DUV light beams) such as the KrF excimer laser beam (wavelength: 248 nm), vacuum ultraviolet light beams (VUV light beams) such as the ArF excimer laser beam (wavelength: 193 nm), and the $F_2$ laser beam (wavelength: 157 nm). In this embodiment, the ArF excimer laser beam is used. As discussed above, the liquid LQ in the present embodiment is pure water, and even if the exposure light EL is ArF excimer laser light, it will be able to pass through. In addition, pure water can transmit deep ultraviolet light (DUV light) such as ultraviolet emission lines (g-rays, h-rays, i-rays) and KrF excimer laser light (wavelength of 248 nm).

The mask stage MST is movable while holding the mask M. The mask stage MST is movable two-dimensionally within a plane perpendicular to the optical axis AX of the projection optical system PL, that is, within the XY plane, and it is movable finely in the θZ axis direction. The mask stage MST is driven by a mask stage drive mechanism MSTD that includes a linear motor, etc. The mask stage drive mechanism MSTD is controlled by a control apparatus CONT. A movable mirror 41 is provided on the mask stage MST. In addition, a laser interferometer 42 is provided at a position that opposes the movable mirror 41. The position of the mask M on the mask stage MST in the two-dimensional direction and the angle of rotation are messed in real time by the laser interferometer 42, and the measurement results are output to the control apparatus CONT. The control apparatus CONT performs positioning of the mask M that is supported by the mask stage MST by driving the mask stage drive apparatus MSTD based on the measurement results of the laser interferometer 42.

The projection optical system PL projection exposes the pattern image of the mask M onto the substrate P at a prescribed projection magnification A, and it consists of a plurality of optical elements including an optical element 2 provided at the front end of the image plane side of the projection optical system PL, and these optical elements are supported by a lens barrel PK. In the present embodiment, the projection optical system PL is a reduction system in which the projection magnification β is ¼, ⅕ or ⅛ for example. Note that the projection optical system PL may be either a magnification system or a magnifying system. In addition, the projection optical system PL may also be any of a refracting system that does not include a reflecting element, a reflecting system that does not include a refract element, or a catadioptric system that includes both a reflecting element and a refracting element. In addition, the optical element 2 of the present embodiment is exposed from the lens barrel PK, and the liquid LQ of the liquid immersion area AR2 comes into contact with the optical element 2.

The substrate stage PST comprises a Z tilt stage 52, which is movable on the image plane side of the projection optical system PL and holds the substrate P by means of the substrate holder PH, and an XY stage 53, which supports the Z tilt stage 52. The XY stage 53 is movably supported on a base BP. The substrate stage PST is driven by a substrate stage drive mechanism PSTD. The substrate stage drive mechanism PSTD comprises an XY drive mechanism 56, which includes, for example, a linear motor, etc., and moves the Y stage 53 in the X axis direction, the Y axis direction and the θZ direction on the base BP, and Z drive mechanisms 58, which include, for example, a voice coil motor, and move the Z tilt stage 52 in the Z axis direction, the θX direction and the θY direction. Three Z drive mechanisms 58 are provided (however, not shown in the drawing is the Z drive mechanism 58 at the rear side of the surface of the paper), and the Z tilt stage 52 is supported at three points on the XY stage 53 by the three Z drive mechanisms 58. The substrate stage drive mechanism PSTD is controlled by the control apparatus CONT. With this configuration, the Z tilt stage 52 is able to move the substrate P held by the substrate holder PH in the Z axis direction, the θX direction and the θY direction, and the XY stage 53 is able to move the substrate P held by the substrate holder PH in the XY direction and the θZ direction via the Z tilt stage 52. Note that it is, of course, also possible to provide the Z tilt stage and the XY stage as an integrated body.

A concave portion 50 is provided on the Z tilt stage 52 (substrate stage PST), and the substrate holder PH is arranged in the concave portion 50. In addition, the upper surface 51 other than the concave portion 50 of the Z tilt stage 52 is a flat surface that it is substantially the same height (flush) as the surface of the substrate P held by the substrate holder PH. The upper surface 51 of the substrate stage PST has liquid repellency with respect to the liquid LQ. The upper surface 51, which is substantially flush with the surface of the substrate P, is provided in the vicinity of the substrate P. Therefore even when the edge area of the surface of the substrate P is liquid-immersion-exposed, it is possible to retain the liquid LQ on the image plane side of the projection optical system PL to form the liquid immersion area AR2 sufficiently. Note that if it is possible to keep the liquid immersion area AR2, it is permissible for there to be a level difference between the surface of the substrate P and the upper surface 51.

A movable mirror 43 is provided on the side surface of the Z tilt stage 52. In addition, a laser interferometer 44 is provided at a position that opposes the movable mirror 43. The position of the substrate P on the substrate stage PST in the two-dimensional direction and the angle of rotation are measured in real time by means of a laser interferometer 44, and the measurement results are output to the control apparatus CONT. The control apparatus CONT performs positioning of the substrate P, which is supported by the substrate stage PST, in the X axis direction and the Y axis direction by driving the XY stage 53 by means of the substrate stage drive mechanism PSTD (XY drive mechanism 56) within a two-dimensional coordinate system specified by the laser interferometer 44 based on the measurement results of the laser interferometer 44.

In addition, the exposure apparatus EX has a focus detection system 30, which detects surface position information of the surface of the substrate P. The focus detection system 30 has a light projecting part 31 and a light receiving part 32, and it detects the surface position information of the surface of the substrate P by projecting detection light La in a diagonal direction to the surface (exposure surface) of the substrate P from the light projecting part 31 via the liquid LQ while receiving the reflected light from that substrate P via the liquid LQ using the light receiving part 32. The control apparatus CONT controls the operation of the focus detection system 30 while detecting the position (focus position) of the surface of the substrate P in the Z axis direction with respect to the image plane of the projection optical system PL based on the light receiving results of the light receiving part 32. In addition, the focus detection system 30 is also able to obtain the inclination of the surface of the substrate P by obtaining the respective focus positions at the plurality of points on the surface of the substrate P, respectively. Note that it is possible to use a configuration for the focus detection system 30 disclosed in, for example, Japanese Unexamined Patent Application Publication No. H8-37149. Note that a focus detection system that detects surface position information of the surface of the substrate P not through the liquid LQ may also be used.

The control apparatus CONT controls the position (focus position) of the substrate P, which is held by the Z tilt stage 52, in the Z axis direction and the position in the θX and θY directions by driving the Z tilt stage 52 of the substrate stage PST by means of the substrate stage drive mechanism PSTD (Z drive mechanism 58). Specifically, the Z tilt stage 52 operates based on commands from the control apparatus CONT based on the detection results of the focus detection system 30 and controls the focus position (Z position) and inclination angle (θX, θY) of the substrate P to align the surface (exposure surface) of the substrate P with the image plane formed via the projection optical system PL and the liquid LQ.

A substrate alignment system 350, which detects an alignment mark on the substrate P or a first reference mark on a reference member provided on the Z tilt stage 52, is provided in the vicinity of the front end of the projection optical system PL. Note that, in the substrate alignment system 350 of the present embodiment, an FIA (field image alignment) system, such as that disclosed in, for example, Japanese Unexamined Patent Application Publication No. H4-65603, which irradiates illumination light such as white light from a halogen lamp onto a mark in a state in which the substrate stage PST is stationary, and picks up the obtained image of the mark within a prescribed image formation visual field by means of an image pickup element, and measures the position of the mark by image processing, is employed.

In addition, a mask alignment system 360, which detects a second reference mark on the reference member provided on the Z tilt stage 52 via the mask M and the projection optical system PL, is provided in the vicinity of the mask stage MST. Note that, in the mask alignment system 360 of the present embodiment, as disclosed, for example, in Japanese Unexamined Patent Application Publication No. H7-176468, a VRA (visual reticle alignment) system, which irradiates light to a mark and performs image processing of image data of the mark picked up by a CCD camera, etc. to detect the mark position, is employed.

The liquid supply mechanism 10 of the liquid immersion mechanism 1 is for supplying the liquid LQ to the image plane side of the projection optical system PL, and it comprises a liquid supply part 11, which is able to feed the liquid LQ, and a supply pipe 13, one end portion of which connects to the liquid supply part 11. The other end portion of the supply pipe 13 connects to the nozzle member 70. The liquid supply part 11 comprises a tank which accommodates the liquid LQ, a filter unit which removes foreign matter in the liquid LQ, a temperature adjustment apparatus which adjusts the temperature of the supplied liquid LQ, a pressurization pump, etc. Note that the liquid supply part 11 is not required to comprise all of the tank, the filter unit, the temperature adjustment apparatus, and the pump, and equipment such as that of the plant where the exposure apparatus EX is installed may be substituted.

In addition, provided along the path of the supply pipe 13 of the liquid supply part 11 is a flow volume control unit 16 called a mass flow controller, which controls the amount of liquid per unit time sent from the liquid supply part 11 and supplied to the image plane side of the projection optical system PL. Control of the liquid supply amount using this flow volume control unit 16 is performed according to the command signals of the control apparatus CONT.

The liquid recovery mechanism 20 of the liquid immersion mechanism 1 is for recovering the liquid LQ of the image plane side of the projection optical system PL, and it comprises a liquid recovery part 21, which is able to recover the liquid LQ, and a recovery pipe 23, one end portion of which is connected to the liquid recovery part 21. The other end portion of the recovery pipe 23 is connected to the nozzle member 70. The liquid recovery part 21 comprises a vacuum system (suction apparatus) such as a vacuum pump for example, a gas-liquid separator which separates the recovered liquid LQ and gas, a tank which accommodates the recovered liquid LQ, etc. Note that the liquid recovery part 21 is not required to comprise all of the vacuum system, the gas-liquid separator, the tank, etc., and equipment such as that of the plant where the exposure apparatus EX is installed may be substituted.

The nozzle member 70 is arranged in the vicinity of the optical element 2 that comes into contact with the liquid LQ, of the plurality of optical elements that comprise the projection optical system PL. The nozzle member 70 is an annular member provided above substrate P (substrate stage PST) so as to surround the side surface of the optical element 2. A gap is provided between the nozzle member 70 and the optical element 2, and the nozzle member 70 is supported by a prescribed support mechanism so that it is vibrationally separated from the optical element 2. The lower surface 70A of the nozzle member 70 opposes the surface of the substrate P (the upper surface 51 of the substrate stage PST). In addition, the respective lower surface 70A of the nozzle member 70 and lower surface 2A of the optical element 2 are substantially flat surfaces, and the lower surface 70A of the nozzle member 70 and lower surface 2A of the optical element 2 are substantially flush with each other. Through this configuration, it is possible to form the liquid immersion area AR2 within the desired area well. In addition, the liquid contact surface (lower surface) 2A, of the optical element 2 that comes into contact with the liquid LQ of the liquid immersion area AR2 and the liquid contact surface (lower surface) 70A of the nozzle member 70 that comes Into contact with the liquid LQ of the liquid immersion area AR2 have lyophilicity with respect to the liquid LQ.

Liquid supply ports 12, which supply the liquid LQ onto the substrate P, are provided on the lower surface 70A of the nozzle member 70. Liquid supply ports 12 are plurally provided on the lower surface 70A of the nozzle member 70. In addition, an internal flow path, which is connected to the other end portion of the supply pipe 13 and the liquid supply ports 12, is formed in the interior of the nozzle member 70.

In addition, liquid recovery ports 22, which recover the liquid LQ on the substrate P, are provided on the lower surface 70A of the nozzle member 70. In the present embodiment, the liquid recovery ports 22 are provided, at the lower surface 70A of the nozzle member 70, outside the liquid supply ports 12 with respect to the optical axis AX of the optical element 2 so as to surround the liquid supply ports 12. In addition, an internal flow path, which is connected to the other end portion of the recovery pipe 23 and the liquid recovery ports 22, is formed in the interior of the nozzle member 70.

Operations of the liquid supply part 11 and the liquid recovery part 21 are controlled by the control apparatus CONT. When the liquid immersion area AR2 of the liquid LQ is formed on the substrate P, the control apparatus CONT sends out the liquid LQ from the liquid supply part 11 and supplies the liquid LQ onto the substrate P from the liquid supply ports 12 provided above the substrate P via the supply pipe 13 and the internal flow path of the nozzle member 70. In addition, the liquid LQ on the substrate P is recovered from the liquid recovery ports 22 and is recovered by the liquid recovery part 21 via the internal flow path of the nozzle member 70 and the recovery pipe 23.

The spatial image measuring system 60 is used in measurement of the image formation characteristics (optical characteristics) of the projection optical system PL, and it comprises the slit plate 65 provided on the Z tilt stage 52, a first optical element 66 which is arranged at a position near the slit plate 65 in the internal space 52K of the Z tilt stage 52, a mirror 67 which bends the optical path of the light that has passed through the first optical element 66, a second optical element 68 which the light that has come via the mirror 67 enters, a third optical element 69 which sends the light that has passed through the second optical element 68 to outside the Z tilt stage 52, a mirror 71 which is provided outside the Z tilt stage 52 and bends the optical path of the light from the third optical element 69, a fourth optical element 72 which receives the light that has passed through the mirror 71, and the light receiving element (optical sensor) 73 which comprises a photoelectric conversion element and receives the light that has come via the fourth optical element 72. The optical system 74, which guides light that has passed through the slit plate 65 to the light receiving element 73, includes the first optical element 66, mirror 67, the second optical element 68, the third optical element 69, mirror 71, and the fourth optical element 72. Used as the light receiving element 73 is a photoelectric conversion element that is able to detect weak light with good accuracy, for example, a photomultiplier tube (PMT). The light receiving element 73 receives light (exposure light EL) that has passed through the projection optical system PL via the slit plate 65 and the optical system 74. Photoelectric conversion signals from the light receiving element 73 are sent to the control apparatus CONT via a signal processing apparatus, etc.

The upper surface 65A of the slit plate 65 is provided at substantially the same height (flush) as the surface of the substrate P, which is held by the substrate stage PST, and the upper surface 51 of the substrate stage PST (Z tilt stage 52).

Note that, for the specific configuration of the spatial image measuring system 60 and the measuring operations thereof, those disclosed in, for example, Japanese Unexamined Patent Application Publication No. 2002-14005 and Japanese Unexamined Patent Application Publication No. 2002-198303 can be used.

Figure 2:
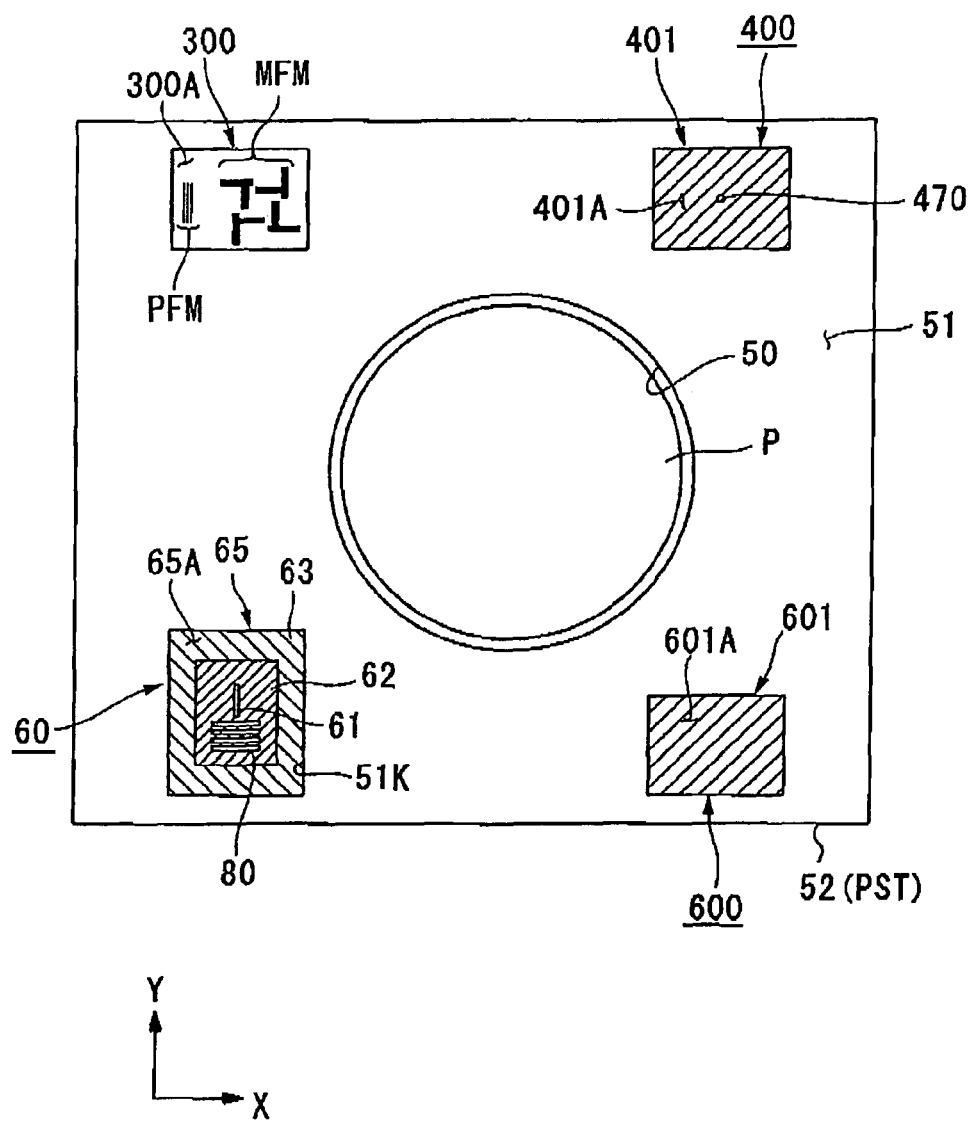
FIG. 2 is a plan view of the substrate stage as seen from above.

FIG. 2 is a plan view of the substrate stage PST (Z tilt stage 52), which holds the substrate P, as seen from above. On the substrate stage PST (Z tilt stage 52), the slit plate 65, which has the slit part 61 of the spatial image measuring system 60 such as that discussed above, is provided at a prescribed position outside the substrate P.

In addition, on the substrate stage PST, a reference member 300 is arranged at a prescribed position outside the substrate P. A reference mark PFM, which is detected by means of the substrate alignment system 350, and a reference mark MFM, which is detected by means of the mask alignment system 360, are provided on the reference member 300 in a prescribed positional relationship. The upper surface 300A of the reference member 300 is a substantially flat surface, and it is provided at substantially the same height (flush) as the surface of the substrate P, which is held by the substrate stage PST, and the upper surface 51 of the substrate stage PST (Z tilt stage 52). The upper surface 300A of the reference member 300 can be used as the reference plane of the focus detection system 30.

In addition, on the substrate stage PST, an upper plate 401, which comprises a portion of a illuminance non-uniformity sensor 400 such as that disclosed in, for example, Japanese Unexamined Patent Application Publication No. S57-117238, is arranged at a prescribed position outside the substrate P. The upper surface 401A of the upper plate 401 is a substantially flat surface, and it is provided at substantially the same height (flush) as the surface of the substrate P, which is held by the substrate stage PST, and the upper surface 51 of the substrate stage PST. A pinhole part 470, which is able to transmit light, is provided on the upper surface 401A of the upper plate 401. A light shielding film such as chrome is used to cover the upper surface 401A except for the pinhole part 470. Specifically, the pinhole part 470 is a concave portion formed on the light shielding film.

In addition, on the substrate stage PST, an upper plate 601, which comprises a portion of an irradiation amount sensor (illuminance sensor) 600, such as that disclosed in, for example, Japanese Unexamined Patent Application Publication No H11-16816, is arranged at a prescribed position outside the substrate P. The upper surface 601A of the upper plate 601 is also a nearly flat surface, and it is provided at substantially the same height (flush) as the surface of the substrate P, which is held by the substrate stage PST, and the upper surface 51 of the substrate stage PST. Also, a prescribed area of this upper plate 601 is provided so that it is able to receive (transmit) light.

Note that a reflecting surface used in measurement of the amount of reflected light incident to the projection optical system PL, such as that disclosed in Japanese Unexamined Patent Application Publication No. S62-183522, may also be arranged on the substrate stage PST.

Figure 3:
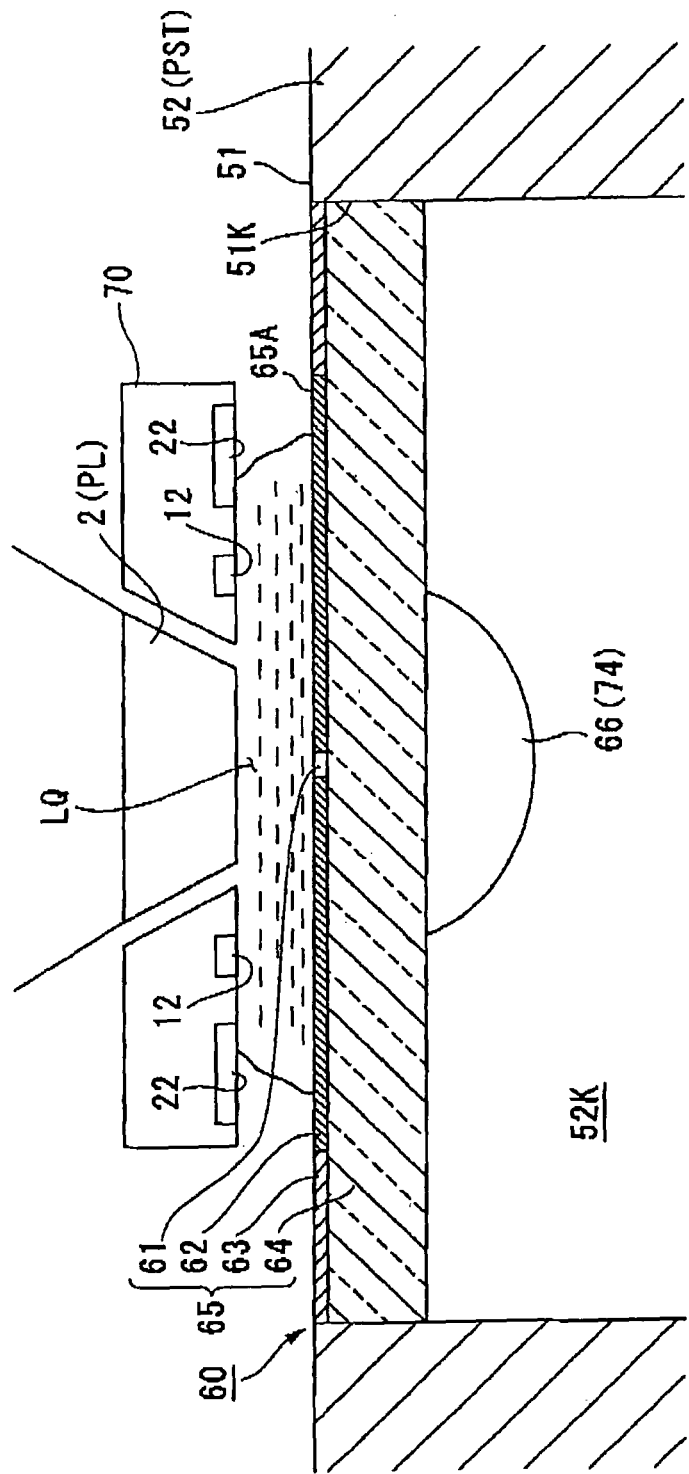
FIG. 3 is and enlarged cross sectional view of the vicinity of the slit plate.

Next, an example of this slit plate 65 of the spatial image measuring system 60 will be explained while referring to FIG. 3, FIG. 4 and FIG. 5. FIG. 3 is an enlarged cross sectional view of the vicinity of the slit plate 65, FIG. 4 is a plan view of the slit plate 65, and FIG. 5 a cross sectional view at the A-A arrows of FIG. 4.

Figure 4:
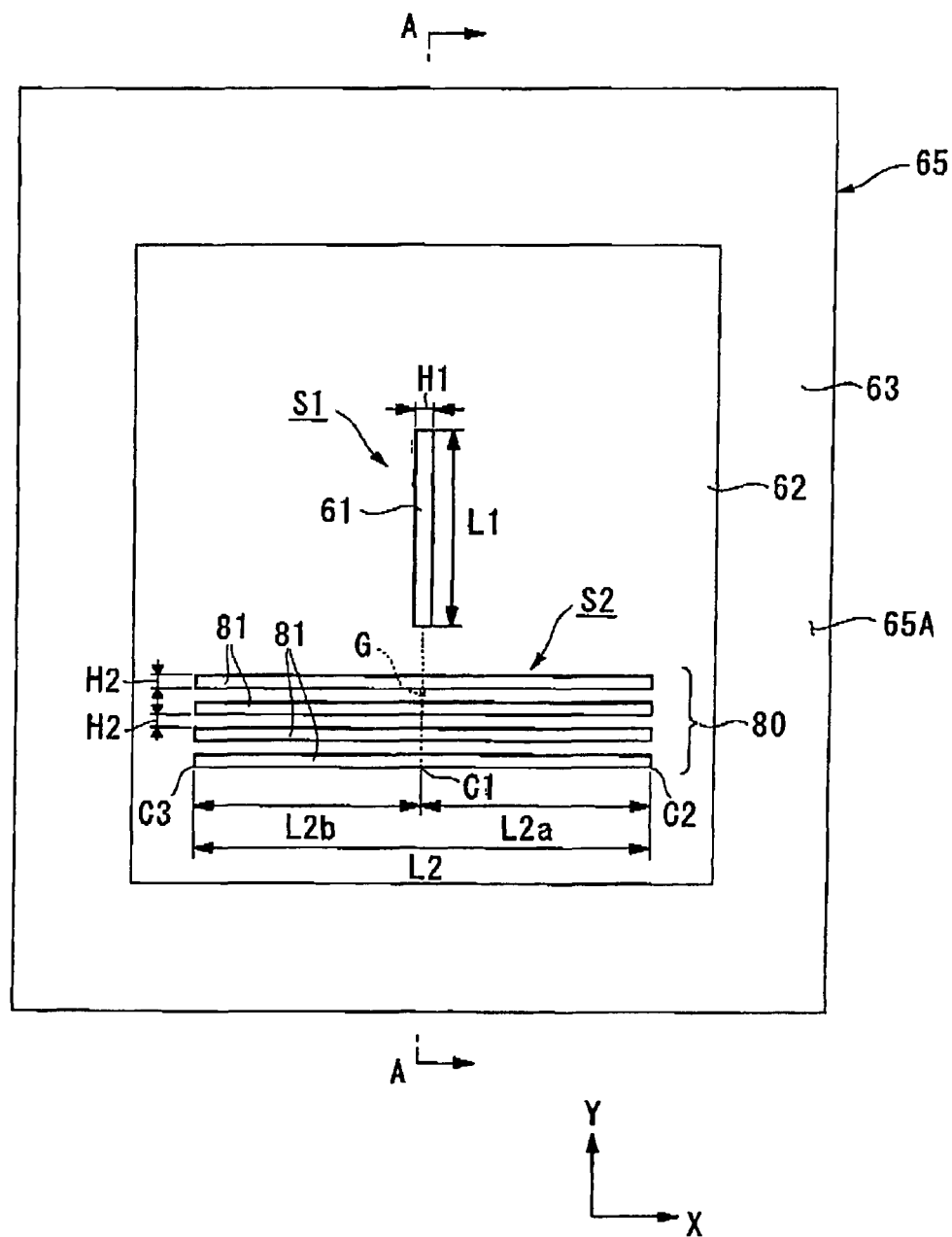
FIG. 4 is a plan view of the slit plate relating to the first embodiment.
Figure 5:
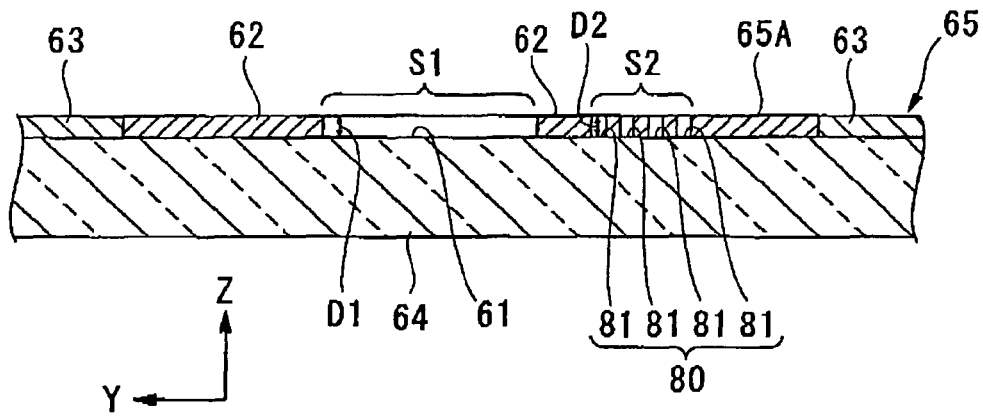
FIG. 5 is a cross sectional view at the A-A arrows of FIG. 4.

In FIG. 3, FIG. 4 and FIG. 5, the slit plate 65 comprises a light shielding film 62, which consists of chrome, etc. provided at the center of the upper surface of a glass plate member 64 with a rectangular shape in a planar view, a reflecting mirror 63, which consists of aluminum, etc. provided at the periphery of that light shielding film 62, specifically, at a portion of the upper surface of the glass plate member 64 that is outside the light shielding film 62, and a slit part 61, which is an aperture pattern formed in a portion of the light shielding film 62. At the slit part 61, the glass plate member 64, which is a transparent member, is exposed, and the light is able to pass through the slit part 61. In addition, the slit part 61 forms a concave portion in a portion of the light shielding film 62. Synthetic silica glass or calcium fluorite, etc. that has good transmittivity with respect to ArF excimer laser light or KrF excimer laser light is used as the material for forming the glass plate member 64. The slit part 61 may be formed by performing etching processing, for example, on the light shielding film 62.

A shown in FIG. 3, an aperture part 51K is formed in a portion of the upper surface 51 of the Z tilt stage 52, and the slit plate 65 is laid into the aperture part 51K In addition, the internal space 52K, which connects to the aperture part 51K, is formed in the interior of the Z tilt stage 52, and a portion of the optical system 74 of the spatial image measuring system 60 is arranged in the internal space 52K. The first optical element 66, which configures a portion of the optical system 74, is integrally attached to the glass plate member 64 below the slit part 61 in the internal space 52K of the Z tilt stage 52. Therefore, even in the case where the numerical aperture NA of the projection optical system PL is 1 or higher, it is possible to cause the light from the projection optical system PL to be incident to the first optical element 66 via the liquid LQ, the slit part 61, and the glass plate member 64 without passing through a gas portion.

As shown in FIG. 4, in the present embodiment, the slit part 61 formed on a portion of the light shielding film 62 is a rectangular line pattern which has the Y axis direction as its lengthwise direction, and it has a specified width H1 and has a specified length L1. In the explanation below, the slit part 61, which forms a line pattern that extends in the Y axis direction, is appropriately called the "first pattern 61." Note that the number, shape and size of the first patterns are not limited to a line pattern such as that of the present embodiment, and appropriate modification is possible according to the items of measurement by the spatial image measuring system 60.

Here, in the present embodiment, the upper surface 65A of the slit plate 65 includes the upper surface of the light shielding film 62 and the upper surface of the reflecting film 63. Therefore, the upper surface of the light shielding film 62, the upper surface of the reflecting film 63, and the upper surface 51 of the substrate stage PST become substantially flush, and the first pattern (slit part) 61 that constitutes the spatial image measuring system 60 has a configuration such that it is formed within a prescribed surface that includes the upper surface 51 of the substrate stage PST and the upper surface 65A of the slit plate 65.

At the upper surface 65A of the slit plate 65, a plurality of line patterns 81, which are arranged so that they extend in the X axis direction and are arrayed in the Y axis direction, are formed in a second area S2 specified in the vicinity of the first area S1, which includes the first pattern 61. In the present embodiment, there are four line patterns 81, but there may also be any plurality other than four.

As shown in FIG. 5, the line patterns 81 are concave portions formed in the light shielding film 62 in the same way as the first pattern 61. The line patterns 81 may also be formed by performing etching processing, for example, on the light shielding film 62 in the same way as the first pattern 61. In the present embodiment, the depth D1 of the first pattern 61 and the depth D2 of the line patterns S1 are substantially the same.

As shown n FIG. 4, the respective line patterns 81 are rectangular line patterns that have the X axis direction as the lengthwise direction, and they have a prescribed width H2 and have a prescribed length L2. In the following explanation, the plurality of line patterns 81 arranged so that they are arrayed in the Y axis direction is collectively appropriately referred to as the "second pattern 80."

In the present embodiment, the respective line patterns 81 have the same width H2 and the same length L2. In addition, the intervals of the respective line patterns 81 are also substantially the Same, and, in the present embodiment, the intervals of the line patterns 81 are also H2. In addition, the width H12 of the line patterns S1 and the width H1 of the first pattern 61 are also nearly the same (H1=H2). On the other hand, the length L2 of the line patterns 81 that comprise the second pattern 80 is longer than the length L1 of the first pattern 61.

Furthermore, the distance L2a between the position c1, at which the extended line of the first pattern 61 and a second pattern 80 (line patterns 81) intersect, and one end portion c2 of the line patterns 81 is longer than the length L1 of the first pattern 61 (L2a≧L1). In addition, the distance L2b between that position c1 and the other end portion c3 of the line patterns 81 is also longer than the length L1 of the first pattern 61 (L2b≧L1). Note that, in the present embodiment, due to provision in such a way that the extended line of the first pattern 61 and the center of the line patterns 81 intersect, distance L2a and distance L2b are substantially the same. Specifically, in the present embodiment, L2a=L2b≧L1.

In the present embodiment, the first pattern 61 and the second pattern 80 are provided so that they are separated by a prescribed distance, in addition, at the upper surface 65A of the slit plate 65, the first pattern 61 and the second pattern 80 are respectively formed in a prescribed positional relationship so that the position of the center of gravity (see code G in FIG. 4) of the diagram formed by the first pattern 61 and the second pattern 80 is provided outside the first pattern 61.

Figure 6:
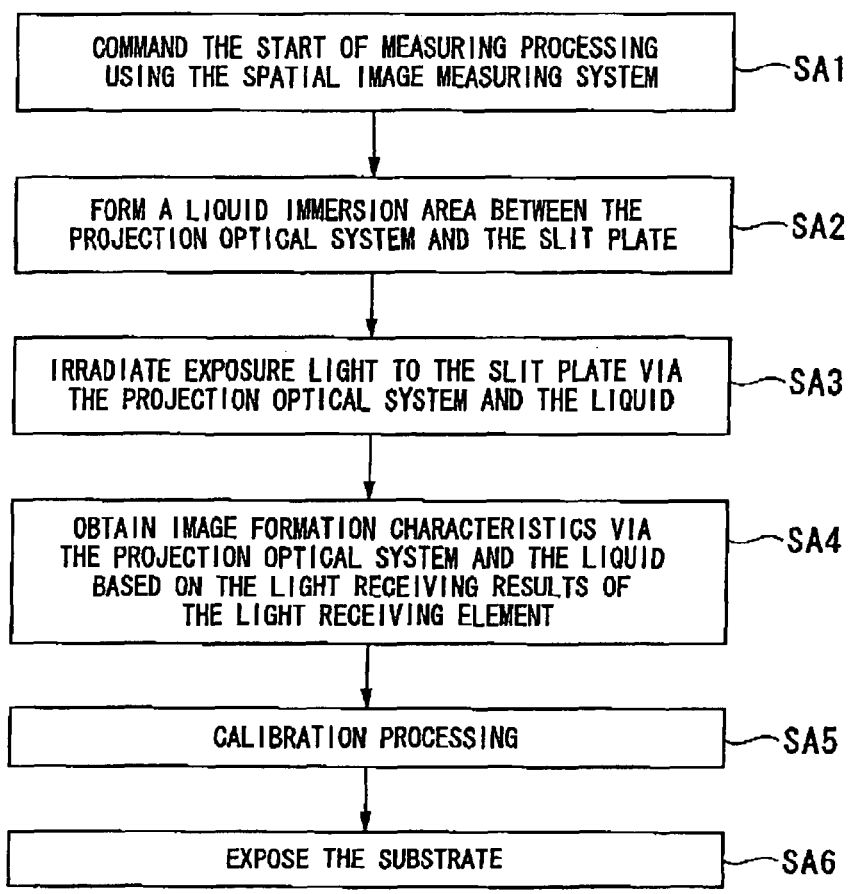
FIG. 6 is flow chart for explaining an example of the procedure for exposing the substrate.

Next, the procedure of exposing the substrate P using an exposure apparatus EX that has the configuration discussed above will be explained while referring to the flow chart of FIG. 6.

Before the substrate P is exposed, first, a processing in which the image formation characteristics of the projection optical system PL is measured using a spatial image measuring system 60 is performed. The control apparatus CONT commands of the start of measurement processing using the spatial image measuring system 60 (step SA1). In performing measurement processing using the spatial image measuring system 60, a mask for measuring, on which a spatial image measuring pattern has been formed, is held by the mask stage MST. In addition, the substrate P for forming a device is held goaded) in advance on the substrate sage PST (substrate holder PH).

The control apparatus CONT forms a liquid immersion area AR2 of the liquid LQ between the projection optical system PL and the slit plate 65 using the liquid immersion mechanism 1 (step SA2). The liquid immersion mechanism 1 forms the liquid immersion area AR2 on the slit plate 65 so that the first pattern (slit part) 61 is covered by the liquid LQ.

The control apparatus CONT causes exposure light EL to emerge from the illumination optical system IL. After the exposure light EL has passed through the mask for measuring, the projection optical system PL, and the liquid LQ of the liquid immersion area AR2, the exposure light EL is irradiated to the slit plate 65 (step SA3). The light that has passed through the first pattern 61 is incident to the first optical element 66 of the optical system 74.

Since the numerical aperture NA of the projection optical system improves due to the liquid LQ of the liquid immersion area AR2 between the projection optical system PL and the slit plate 65, if the numerical aperture NA of the first optical element 66 of the spatial image measuring system 60 is not also increased according the numerical aperture NA of the projection optical system PL, there is a possibility that the first optical element 66 will not be able to take in well (all of) the light that has passed through the projection optical system PL and that the light will not be able to be received, sufficiently. Therefore, in the present embodiment, the first optical element 66 is arranged so that the light that has passed through the first pattern 61 of the slit plate 65 does not pass through gas space, so the first optical element 66 is able to take in the light that has come via the projection optical system PL well.

The light that has been focused by the first optical element 66 is guided to a light receiving element 73 by the optical system 74 that includes this first optical element 66. In this way, the light receiving element 73 of the spatial image measuring system 60 receives the exposure light EL via the projection optical system PL, the liquid LQ of the liquid immersion area AR2, and the first pattern 61. The light receiving element 73 outputs photoelectric conversion signals (light quantity signals) according to the amount of light received to the control apparatus CONT via a signal processing apparatus. The control apparatus CONT performs the prescribed computation processing based on the light receiving results of the light receiving element 73, and it obtains the image formation characteristics resulting from passing through the projection optical system PL and the liquid LQ (step SA4).

After the measuring processing by the spatial image measuring system 60, in which the liquid immersion area AR2 has been formed on the slit plate 65 so that the first pattern 61 is covered, has been completed the control apparatus CONT moves the substrate stage PST in the XY direction to move the liquid immersion am AR2 of the liquid LQ formed on the image plane side of the projection optical system PL from on top of slit plate 65 to on top of the upper plate 401 of the illuminance non-uniformity sensor 400, for example. Then, the control apparatus CONT irradiates exposure light EL to the upper plate 401 via the projection optical system PL and the liquid LQ of the liquid immersion area AR2, and it obtains the illuminance non-uniformity of the exposure light EL in the projection area AR1 using the illuminance non-uniformity sensor 400. In addition, after the measuring processing by the illuminance non-uniformity sensor 400 has been completed, the control apparatus CONT moves the substrate stage PST in the XY direction to move the liquid immersion area AR2 of the liquid LQ formed on the image plane side of the projection optical system PL onto the upper plate 601 of the irradiation amount sensor 600, for example. Then, the control apparatus CONT irradiates exposure light EL to the upper plate 601 via the projection optical system PL and the liquid LQ of the liquid immersion area AR2 and obtains the illuminance of the exposure light EL using the irradiation amount sensor 600. In addition, after the measuring processing by the irradiation amount sensor 600 has been completed, the control apparatus CONT moves the substrate stage PST in the XY direction to move the liquid immersion area AR2 of the liquid LQ formed on the image plane side of the projection optical system PL onto the reference member 300, for example. Then, the control apparatus CONT uses the mask alignment system 360 to measure the reference mark MFM via the projection optical system PL and the liquid LQ of the liquid immersion area AR2. In addition, the control apparatus CONT uses the substrate alignment system 350 to measure the reference mark PFM, and thus the positional relationship (baseline amount) between the detection reference position of the substrate alignment system 350 and the projection position of the pattern image prior to exposing the substrate P.

Note that, here, an explanation was given in such a way the measuring processing was sequentially performed by moving the liquid immersion area AR2 of the liquid LQ sequentially onto the slit plate 65 of the spatial image measuring system 60, onto the upper plate 401 of the illuminance non-uniformity sensor 400, onto the upper plate 601 of the irradiation amount sensor 600, and onto the reference member 300, but the measuring sequence is not limited to the sequence discussed above, and it may be determined as desired. In addition, it is also possible to perform the measuring operations using only a part of the spatial image measuring system 60, the illumination non-uniformity sensor 400, the irradiation amount sensor 600, and the reference member 300, and a part of the measuring operations may be performed without forming a liquid immersion area ARM of the liquid LQ.

Also, the control Apparatus CONT performs adjustment processing (calibration processing), etc. of the image formation characteristics of the projection optical system PL based on the measuring processing performed using the spatial image measuring system 60 and/or the measuring processing performed using the illuminance non-uniformity sensor 400 and the irradiation amount sensor 600 (step SA5).

To perform exposure processing for the substrate P, the control apparatus CONT moves the substrate stage PST in the XY direction and moves the liquid immersion area ARM of the liquid LQ formed on the image plane side of the projection optical system PL onto the substrate P. When the substrate P is exposed for device manufacture, a mask M for forming the device is, of course held by the mask stage MST. Also, the control apparatus CONT irradiates the exposure light EL from the illumination optical system IL, illuminates the mask M using the exposure light EL, and projects the pattern image of the mask M onto the substrate P via the projection optical system PL and the liquid LQ of the liquid immersion area AR2 formed on the substrate P (step SA6).

Note that, here, the substrate stage PST is moved in the XY direction in a status in which a liquid immersion area AR2 has been formed on the image plane side of the projection optical system PL, so the liquid immersion area AR2 of the liquid LQ is moved to the desired position on the substrate stage PST, which includes the respective slit plate 65, upper plate 401, 601, reference member 300 and substrate P but when the position of the liquid immersion area AR2 is varied on the substrate stage PST, for example, after the liquid LQ of the liquid immersion area AR2 formed at the first position has been recovered using the liquid recovery mechanism 20, the substrate stage PST is moved, and then a liquid immersion area AR2 is formed at a second position that is different from the first position, so the supply and recovery operations of the liquid LQ by the liquid immersion mechanism 1 may be resumed. Specifically, after the measuring processing by the spatial image measuring system 60 via the liquid LQ, for example, has been completed, the control apparatus CONT recovers the liquid LQ on the slit plate 65 using the liquid immersion mechanism 1 (liquid recovery mechanism 20). Then, when performing liquid immersion exposure for the substrate P the control apparatus CONT may expose the substrate P after moving the substrate stage PST in the XY direction to cause the projection optical system PL and the substrate P to oppose each other, ring liquid LQ supply and recovery operations by the liquid immersion mechanism 1 in that status, and forming a liquid immersion area AR2 of the liquid LQ between the projection optical system PL and the substrate P.

After the measuring processing by the spatial image measuring system 60 has been completed, even though the liquid immersion mechanism 1 (liquid recovery mechanism 20) is used to perform the operation of recovery of the liquid LQ on the first pattern 61 (slit plate 65), or even though the substrate stage PST is moved in the XY direction to move the liquid LQ of the liquid immersion area AR2 from on the slit plate 65 to another position, there is a possibility that the liquid LQ will remain on the first pattern 61. When the liquid LQ that has remained on the first pattern 61 is left as is, there is concern that the liquid LQ will vaporize and cause water marks to form on the first pattern 61 and that the exposure light EL will not be able to pass the first pattern 61 well in the subsequent measurement processing, which will lead to a deterioration in measuring accuracy. In the present embodiment, a second pattern 80 is formed in the second area S2 specified in the vicinity of the first area S1, which includes the first pattern 61, so that the remaining liquid LQ retreats from the first area S1 and collects in the second area S2. Therefore, it is possible to cause the liquid LQ to retreat from on top of the first pattern 61 of the first area S1. An explanation in this regard will be given while referring to FIG. 7A in FIG. 7B.

Figure 7A:
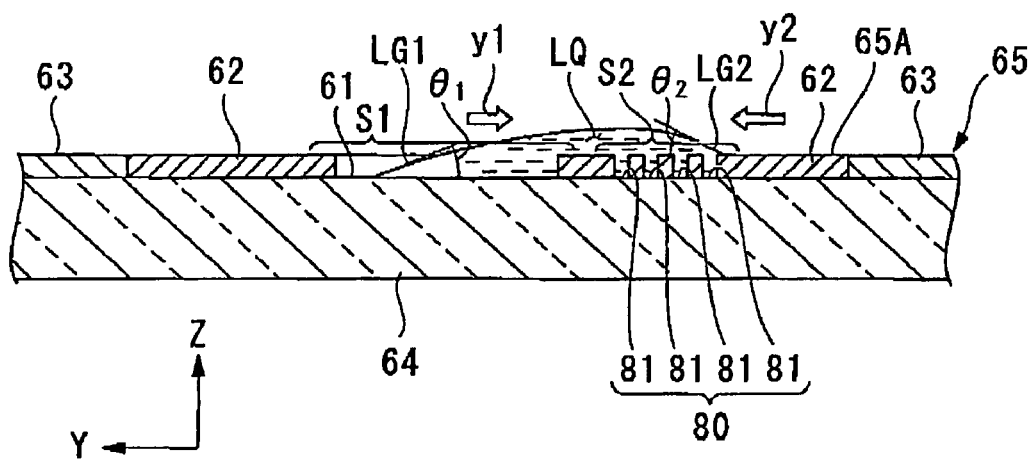
FIG. 7A is a cross sectional view that schematically shows the behavior of the liquid on the slit plate.

FIG. 7A is a cross sectional view that schematically shows a condition in which, after the measurement processing using the spatial image measuring system 60 has been completed, and the operation of removal of the liquid LQ on the slit plate 65 has been performed, the liquid LQ has remained on top of that slit plate 65. In FIG. 7A, the liquid LQ remains and extends over the first area S1, which includes the first pattern 61, and the second area S2, which has the second pattern 80. Specifically, in this status, the liquid LQ remains so that it continuously extend across the first pattern 61 of the first area S1 and the second pattern S0 of the second area S2. Then, as the liquid LQ dries with the passage of time, and the volume of the liquid LQ is reduced, the respective end part LG1 of the +Y side and end part LG2 of the −Y side of the ridgeline of the liquid LQ on the slit plate 65 move toward the center side of the liquid LQ (see arrows y1 and y2). Even during movement of the ridgeline, the contact angle 1 of the surface of the first area S1 with the liquid LQ and the contact angle 2 of the surface of the second area S2 with the liquid LQ are maintained. In FIG. 7A, the liquid LQ is in contact with the bottom part (specifically, the glass plate member 64) of the first pattern 61 in the first area S1, and during movement of the ridgeline, the contact angle 1 of the glass plate member 64 with the liquid LQ is maintained. Similarly, the liquid LQ is in contact with the light shielding film 62 at the second area S2, and during movement of the ridgeline, the contact angle θ2 of the light shielding film 62 with the liquid LQ is maintained. Note that, in the present embodiment, the affinity between the first area S1 and the liquid LQ (specifically, contact angle θ1) and the affinity between the second area S2 and the liquid LQ (specifically, contact angle θ2) are substantially the same.

Figure 7B:
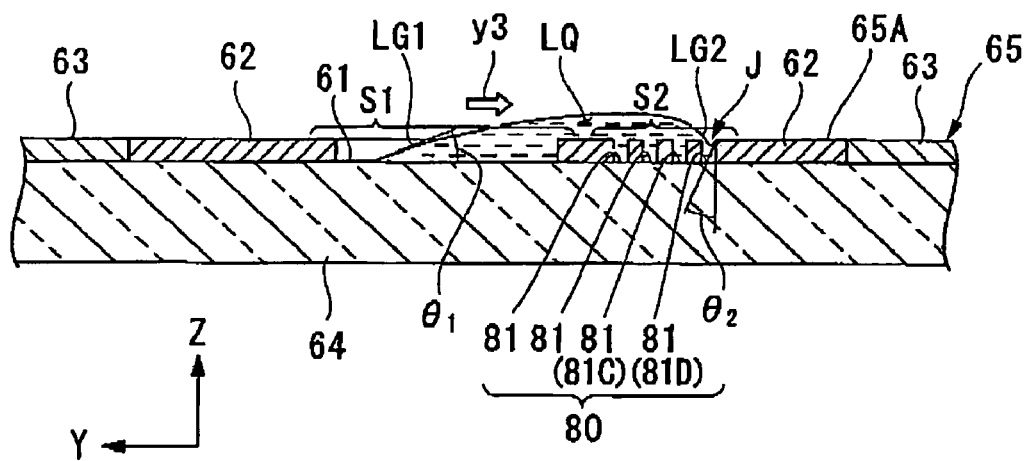
FIG. 7B is a cross sectional view that schematically shows the behavior of the liquid on the slit plate.

FIG. 7B is a cross sectional view that schematically shows the status of the liquid LQ after a pre bed time has elapsed from the status shown in FIG. 7A. With the movement of the ridgeline of the liquid LQ on the slit plate 65, eventually, as shown in FIG. 7B, the end part LG2 of the liquid LQ goes into the inner side of the line patterns 81 of the second pattern 60. Because it is such that, even in a status in which the end part LG2 of the liquid LQ has gone into the inner side of the line patterns 81, the contact angle θ2 of the light shielding film 62, which forms the inner side surface of the line pas 81, with the liquid LQ is maintained, a shown by code J in FIG. 7B, the ridgeline of the end part LG2 of the liquid LQ that has entered into the inner side of the line patterns 81 is deformed and sinks in. When this happens, a force that attempts to return area J, which has sunken in, to the origin (a force that attempts to cause swelling), specifically, a force that attempts to maintain the shape of the liquid LQ, by means of the surface tension of the liquid LQ while in contact with the inner surface side of the line patterns 81 is produced in the liquid LQ. Through this force, a phenomenon in which the end part LG1 of the liquid LQ that is in contact with the first pattern 61 moves to the line patterns 81 (second pattern 80) side is produced (see arrow y3). In this way, by providing a second pattern 80 comprising concave parts on the upper surface 65A of the slit plate 65, it becomes difficult for the liquid LQ in the second area S2 to move, and the second area S2, which has the second pattern 80, behaves in such a way that it has improved affinity with respect to the liquid LQ, and its ability to hold the liquid LQ increases.

In addition, in the case where the end part LG2 of the liquid LQ, in FIG. 7B, has moved from line pattern 81D of the extreme −Y side, for example, to the adjacent line pattern 81C of the +Y side thereof, the phenomenon discussed above occurs in the same way. Therefore, the velocity at which the end part LG2 arranged in the second area S2 of the liquid LQ moves toward the center side (first area S1 side) of the liquid LQ is slower than the velocity at which the end part LG1 arranged in the first area S1 of the liquid LQ moves toward center side (second area S2 side) of the liquid LQ. In addition, as in the present embodiment, by providing the time patterns 81, which have the X axis direction as the lengthwise direction, so that they are arrayed with respect to the Y axis direction in the vicinity of the first pattern 61 comprising a line pattern that has the Y axis direction as the lengthwise direction and repeatedly causing the above phenomenon, it is possible to cause the liquid LQ on the first pattern 61 to quickly retreat from the first area S1, which includes the first pattern 61, and collect in the second area S2.

Figure 8:
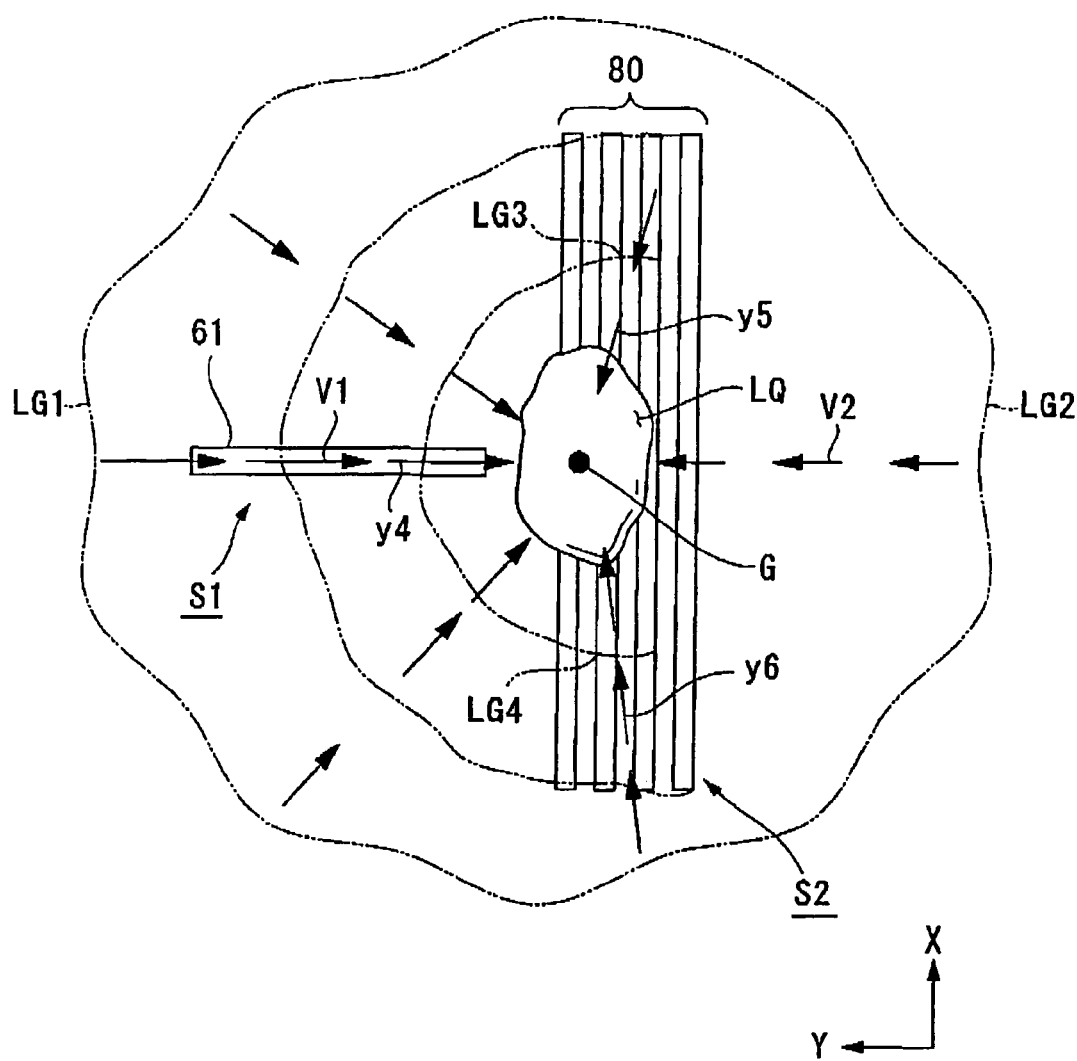
FIG. 8 is a plan view that schematically shows the behavior of the liquid on the slit plate.

FIG. 8 is a plan view that schematically shows the status of the liquid LQ after a tinnier prescribed time has elapsed from the status shown in FIG. 7B. As discussed above, the line patterns 81, which have the X axis direction as the lengthwise direction, are provided so that they are arrayed with respect to the Y axis direction in the vicinity of the first pattern 61 comprising a line pattern that has the Y axis direction as the lengthwise direction, so the velocity v2 at which the end part LG2 of the −Y side of the liquid LQ in the second area S2 moves toward the center side (first area S1 side) of the liquid LQ becomes adequately slower than the velocity v1 at which the end part LG1 of the +Y side of the ridgeline of the liquid LQ in the first area S1 moves toward center side (second area S2 side) of the liquid LQ. In this way, by forming the second pattern 80 in the second area S2, the liquid LQ that has remained and extended over the first area S1 and the second area S2 retreats from the first area S1, which includes the first pattern 61, and collects in the second area S2.

Due to the fact that the liquid LQ that has collected in the second area S2 vaporizes, there is a possibility that water marks will form in the second area S2, but the second area S2 is not used for the measurement of the spatial image measuring system 60, so even if water marks are formed in the second area S2, it will not be a problem. Of course, the liquid LQ that has collected (agglomerated) in the second area S2 may be recovered using a liquid recovery mechanism 20 without leaving it as is.

As explained above, in the case in which the liquid LQ has remained and extended over the first area S1, which includes the first pattern 61 that constitutes the spatial image measuring system 60, and the second area S2 specified in the vicinity thereof, due to the second pattern 80 formed in the second area S2, the liquid LQ retreats from the first area S1 and collects in the second area S2. Therefore, it is possible to prevent the liquid LQ from remains on top of the first area S1, which includes the first pattern 61. Therefore, it is possible to prevent water marks from forming on the first pattern 61 of the spatial image measuring system 60, and it is possible to prevent deterioration of the measuring accuracy of the spatial image measuring system 60 due to the remaining liquid LQ and/or water marks.

To prevent the liquid LQ from remaining in the first area S1, it is also possible to perform surface treatment (water repellence treatment) on the first area S1 using a water repellent material such as a fluorine resin, for example. However, in such a water repellent material, there is a strong possibility that the water repellency thereof will deteriorate with the passage of time due to the irradiation of the exposure light EL, which is ultraviolet light. Specifically, in a configuration that attempts to cause the liquid LQ that has remained in the first area S1 to smoothly retreat from that first area S1 by performing surface treatment on the first area S1 or the second area S2, the ability to cause the liquid LQ to retreat deteriorates over time. In the present embodiment, the configuration is such that the liquid is caused to retreat from the first area S1 by means of a second pattern 80 comprising concave parts, that is, using a physical shape formed in the second area S2, so it is possible to cause the liquid LQ to smoothly retreat from the first area S1, which includes the first pattern 61, without the ability to cause the liquid LQ to retreat deteriorating over time.

In addition, as explained while referring to FIG. 4, on top of the surface 65A of the slit plate 65, the position G of the center of gravity of the diagram formed by the first pattern 61 and a second pattern 80 is outside the first pattern 61, so the second pattern g0 is able to cause the liquid LQ that has remained and extended over the first area S1 and the second area S2 to retreat from the first pattern 61 and reliably collect outside the first pattern 61.

In addition, the length L2 of the line patterns 81 that form the second pattern 80 is longer than the length L1 of the first pattern 61, and the distances L2$a$, L2$b$ with respect to position c1 of the extended line of the first line pattern 61 and line patterns 81 and both end pas c2, c3 of the line patterns 81 are also longer than the length L1 of the first pattern 61, so it is possible to more reliably pull the liquid LQ that has remained on the first pattern 61 into the second area S2. Specifically, as shown in FIG. 8, as the movement components when the ridgeline of the liquid LQ moves toward position G of the second area S2, there are a component y4 that moves in substantially the X axis direction along the first pattern 61 and components y5, y6 that move in substantially the Y axis direction along the second pattern 80 (line patterns 81). Assuming that the lengths L2$a$, L2$b$ of the line patterns 81 that form the second pattern 80 are shorter than the length L1 of the first pattern 61, a phenomenon becomes likely to occur whereby, before the end part LG1 of the +Y side of the ridgeline of the liquid LQ that moves in the Y axis direction along the first pattern 61 is arranged in the second area S2 outside the first pattern 61, movement of the end part LG3 of the +X side and the end part LG4 of the −X side of the ridgeline of the liquid LQ that moves in the X axis direction along the second pattern 80 (e patterns 81) stops. When this happens, the possibility that movement of the end part LG1 will also stop in conjunction with the stoppage of the movement of end parts LG3 and LG4 becomes greater, so there is concern that it will no longer be possible to cause the liquid LQ to completely retreat from on top of the first pattern 61. In the present embodiment, the respective distances L2$a$, L2$b$ between the position c1 of the extended line of the first pattern 61 and the line patterns 81 and the both end parts c2, c3 of the line patterns 81 are longer than the length L1 of the first pattern 61, so it is possible to continue the movement of the end parts LG1, LG3 and LG4 until the liquid LQ retreats from on top of the first pattern 61, and it is possible to more reliably pull the liquid LQ that has remained on the first pattern 61 into the second area S2.

Second Embodiment

Next, a second embodiment will be explained while referring to FIG. 9. In the explanation below, identical codes are assigned to constituent portions that are identical to or equivalent to those of the embodiment discussed above, and explanations thereof have been omitted.

Figure 9:
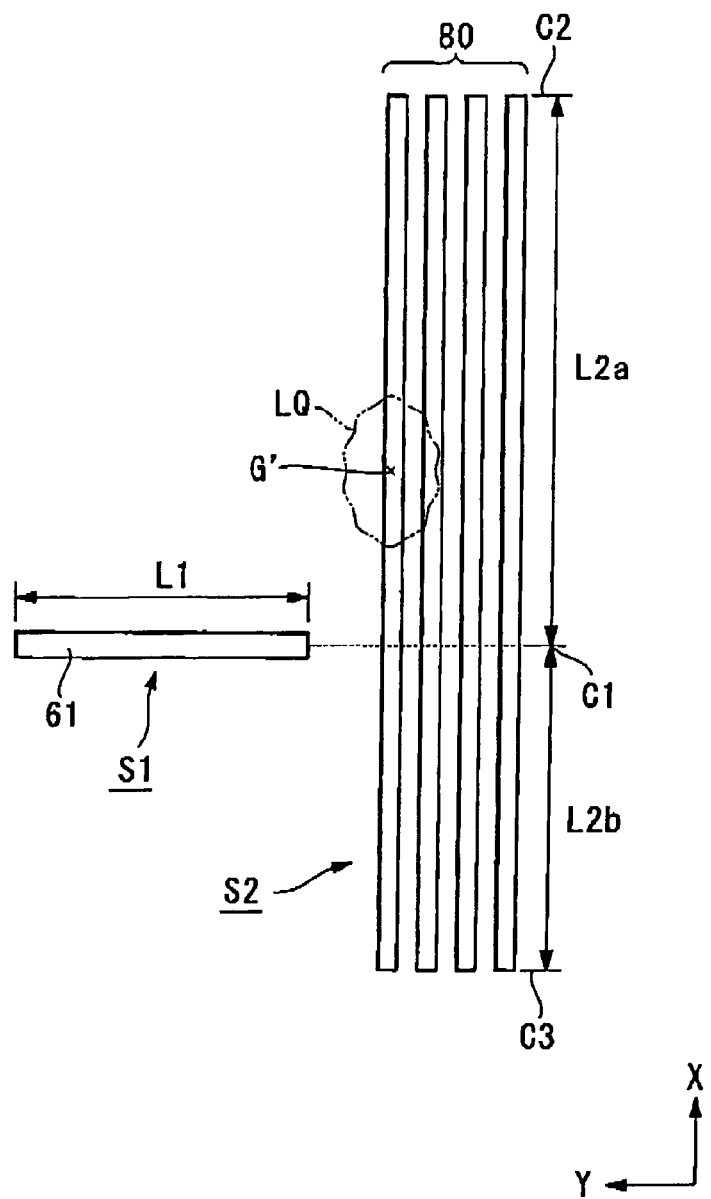
FIG. 9 is a plan view of the slit plate relating to the second embodiment.

In FIG. 9, the distance L2$a$ between the position c1, at which the extended line of the first pattern 61 and the second pattern 80 (line patterns X1) intersect, and one end portion 2 of the line patterns 81 is longer than the length L2 of the first pattern 61. In addition, the distance L2$b$ between that position c1 and the other end portion c3 of the line patterns 81 is also longer than the length L1 of the first pattern 61. Also, the distance L2$a$ between the position c1 and the one end portion c2 of the line patterns 81 is also longer than the distance L2$b$ between the position one and the other end portion c3 of the line patterns 81. Specifically, in the present embodiment, L2$a$≧L2$b$≧L1. Through this, the position G' of the center of gravity in the drawing specified by the first pattern 61 and the second pattern 80 is provided at a position that is outside the first pattern 61 and separated from the extended line of the first pattern 61. By employing such a configuration, the second pattern 80 is such that the liquid LQ that has remained and extended over the first area S1 and the second area S2 can retreat from the first pattern 61 and collect at a position that is outside the first pattern 61 and separated from the extended line of the first pattern 61. Therefore, even in a case in which the liquid LQ has temporarily spread after it has collected in the second area S2, it is possible to reduce the possibility that the spread liquid LQ will again be on the first pattern 61.

Third Embodiment

Figure 10:
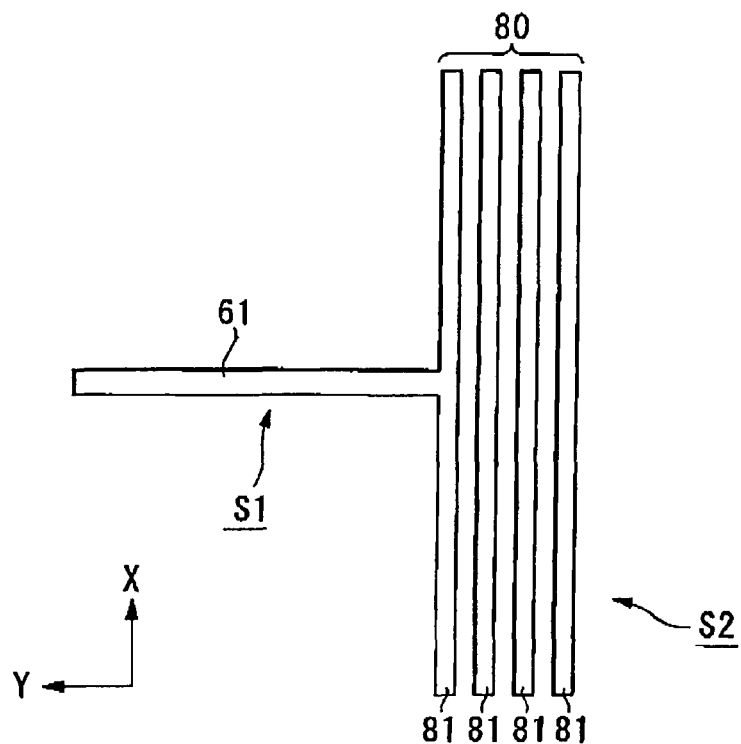
FIG. 10 is a plan view of the slit plate relating to the third embodiment.

Next, a third embodiment will be explained while referring to FIG. 10. In FIG. 10, one end portion of the −Y side of the first pattern 61 and the center part of the line patterns 81 arranged on the extreme +Y side of the second pattern 80 are connected. In addition, the distance between the connection position where the end portion of the first pattern 61 and the second pattern 80 are connected and the end portions of the second pattern 80 is longer than the first pattern 61. By using this type of configuration as well, due to the second pattern 80, it is possible to cause the liquid LQ that has remained and extended over the first area S1 and the second area S2 to retreat from the first area S1 and collect in the second area S2.

Fourth Embodiment

Figure 11:
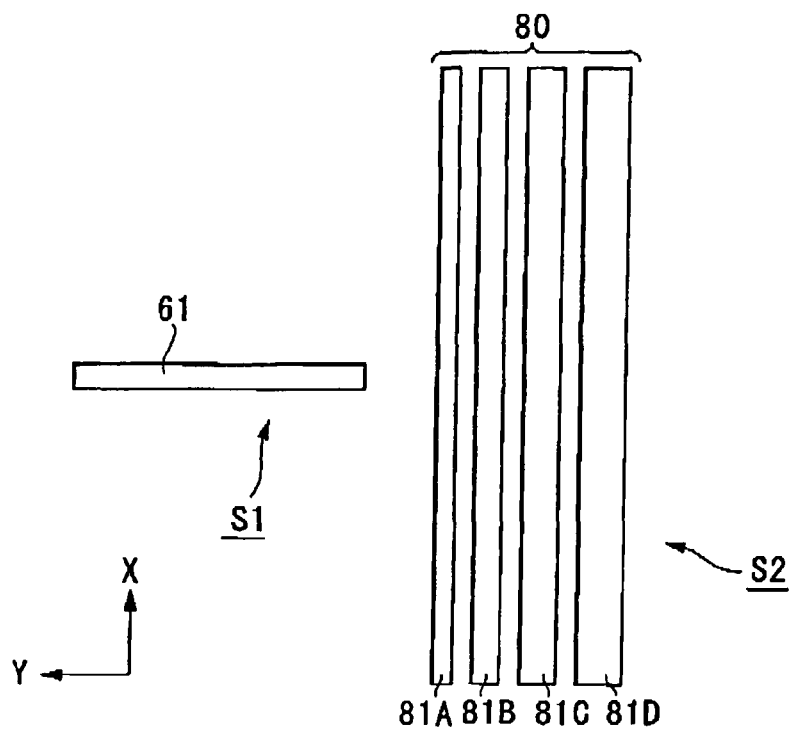
FIG. 11 is a plan view of the slit plate relating to the fourth embodiment

Next, a fourth embodiment will be explained while referring to FIG. 11. In FIG. 11, the respective widths of the plurality of line patterns 81A to 81D that constitute the second pattern 80 are mutually different. Specifically, of the plurality of line patterns 81A to 81D arrayed in the Y axis direction, the width of line pattern 81A, which is formed nearest the first line pattern 61 (formed on the extreme +Y side), is the narrowest, and the width of the pattern becomes gradually wider toward the −Y side. Also, in the present embodiment, the width of the first pattern 61 and the width of line pattern 81B are the same. In this way, even if the configuration is such that the widths of line patterns 81, which constitute the second pattern 80, arm different from the width of the first pattern 61 or the respective widths of the plurality of line patterns 81 are mutually different, due to second pattern 80, it is possible to cause the liquid LQ that has remained and extended over the first area S1 and the second area S2 to retreat from the first area S1 and collect in the second area S2.

Fifth Embodiment

Figure 12:
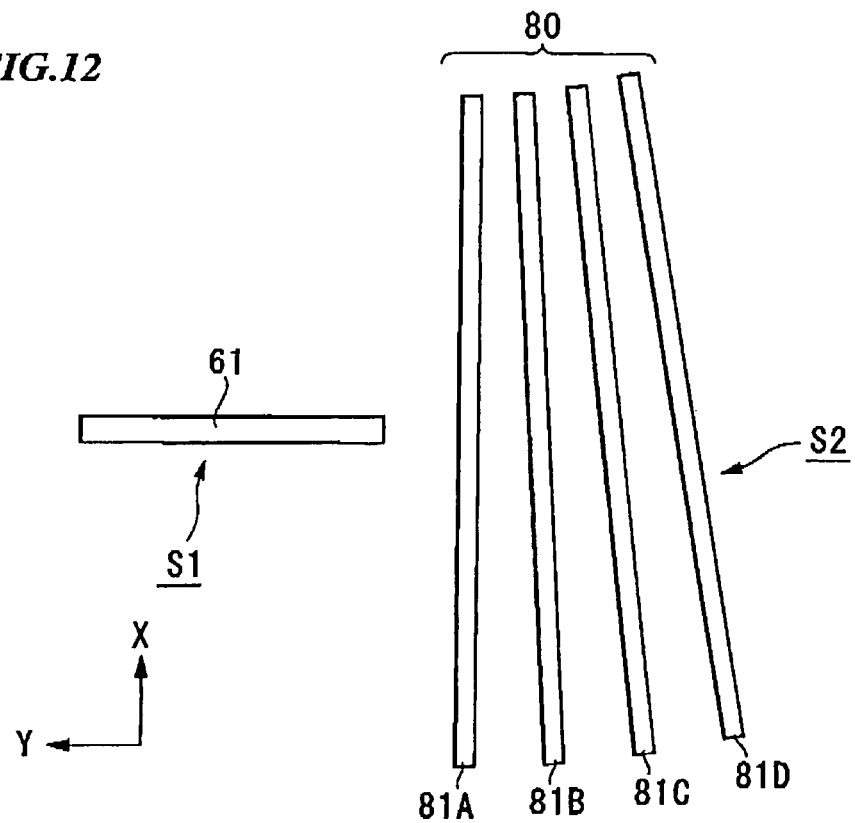
FIG. 12 is a plan view of the slit plate relating to the fifth embodiment

Next, a fifth embodiment will be explained while referring to FIG. 12. In FIG. 12, the respective line patterns 81A to 81D that constitute the second pattern 80 are formed at mutually different angles with respect to the Y axis. Specifically, of the plurality of line patterns 81A to 81D arrayed in the Y axis direction, the line pattern 81A, which is formed nearest the first line pattern 61 (formed on the extreme +Y side), is substantially parallel to the Y axis direction, and the angle with respect to the Y axis direction gradually becomes larger toward the −Y side. By employing this type of configuration as well, due to the second pattern 80, it is possible to cause the liquid LQ that has remained and extended over the first area S1 and the second area S2 to retreat from the first area S1 and collect in the second area S2.

Sixth Embodiment

Figure 13:
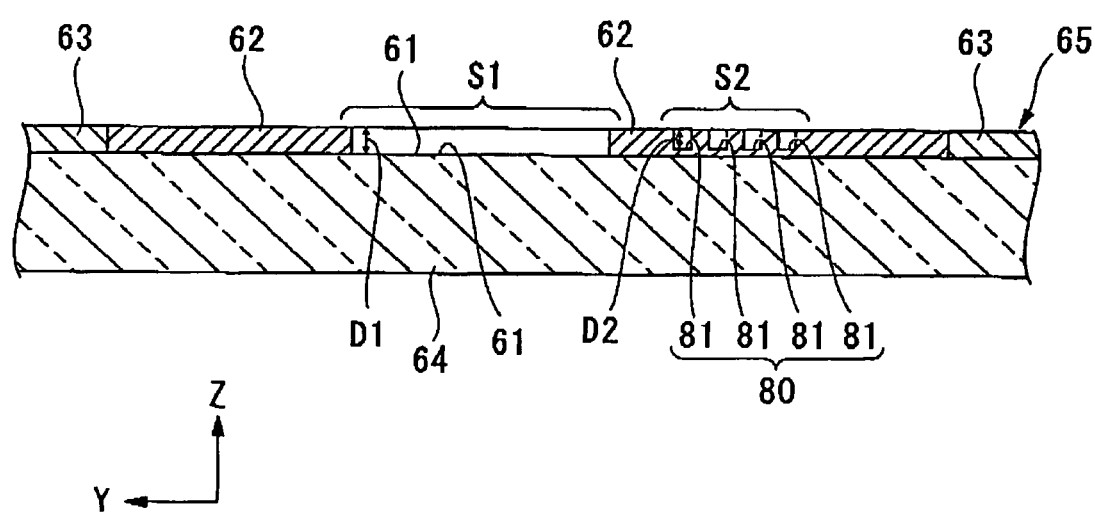
FIG. 13 is a cross sectional view of the slit plate relating to the sixth embodiment.

Next, a sixth embodiment will be explained while referring to FIG. 13. In FIG. 13, the depth D1 of the first pattern 61 and the depths D2 of line patters 81, which comprise the second pattern 80, are mutually different. Specifically, the first pattern 61 is formed to be deeper than the line patterns 81 of the second pattern 80 (D>D2). The first pattern 61 is formed by etch processing the light shielding film 62 so as to completely remove it, and the glass plate member 64 is exposed at the portion of the first pattern 61. The second pattern 80 (line patterns 81) is formed by soft h processing so as to partially remain the light shielding film 62 without completely removing it, so the second pattern 80 is formed more shallow than the depth D1 of the first pattern 61. Also, at the portion of the second pattern 80 (line patterns 81), the glass plate member 64 is covered by the light shielding film 62, which consists of chrome, without being exposed. By employing such a configuration, when the exposure light EL is irradiated to this slit plate 65, the exposure light EL passes through the first pattern 61 but does not pass through the second pattern 80 line patterns 81). Therefore, it is possible to prevent disadvantages in which the deterioration of measuring accuracy of the spatial image measuring system 60 is caused by the incidence of the exposure light EL, that has passed the second pattern 80, to the first optical element system 66.

On the other hand, in the first to fifth embodiments, etc. discussed above, the glass plate member 64 is exposed even at the portion of the second pattern 80 (line patterns 81). For this reason, when the exposure light EL is irradiated to the slit plate 65, there is concern that the exposure light EL will pass through second pattern 80 (line patterns 81) as well as the first pattern 61. However, it is possible to prevent the above nonconformities by forming the second pattern 80 with the first pattern 61 and the second pattern 80 being in a prescribed positional relationship so that when the exposure light EL is irradiated to the first pattern 61, the exposure light EL does not pass through the second pattern 80, and so that the liquid LQ that has remained and extended over the first area S1 and the second area S2 retreats from the first area S1 and collects in the second area S2.

Seventh Embodiment

Figure 14:
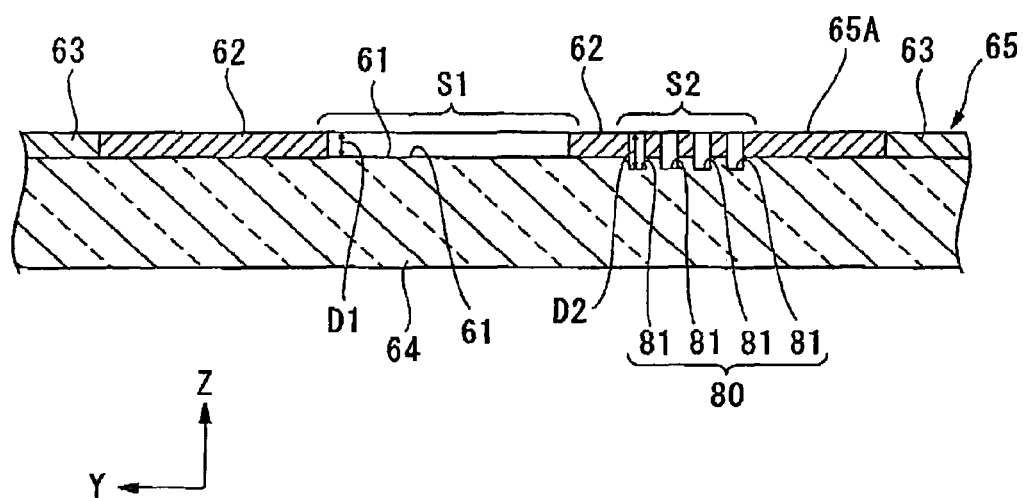
FIG. 14 is a cross sectional view of the slit plate relating to the seventh embodiment.

Next, a seventh embodiment will be explained while referring to FIG. 14. In FIG. 14, the depth D1 of the first pattern 61 and the depths D2 of the line patterns 81 that constitute the second pattern 80 are mutually different, and the line patterns 81 of the second pattern 80 are formed to be deeper than the first pattern 61 (D2>D1). In the present embodiment, a portion of the glass plate member 64 that corresponds to the second pattern 80 (line patterns 81) is etched. In this way, forte first pattern 61, which comprises a concave part formed on the surface of the first area S1, by providing the second pattern 80 (line patterns 81) having concave parts that are deeper than the first pattern 61 on the surface of the second area S2, the ability to hold the liquid LQ in the second area S2 is fisher increased, and it is possible to cause the liquid LQ that has remained and extended over the first area S1 and the second area S2 to more smoothly retreat from the first area S1 and collect in the second area S2.

Eighth Embodiment

Figure 15:
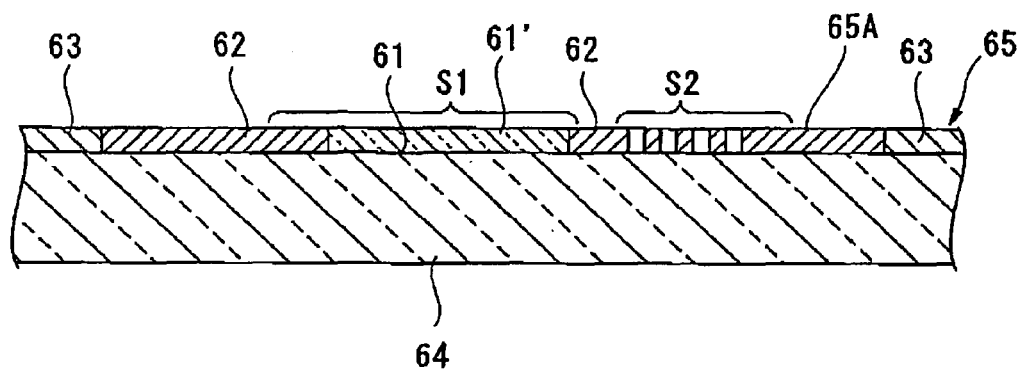
FIG. 15 is a cross sectional view of the slit plate relating to the eighth embodiment.

Next, an eighth embodiment will be explained while referring to FIG. 15. In FIG. 15, a prescribed material 61' such as $SiO_2$, for example, is arranged in a concave part that constitutes the first pattern 61. In addition, the upper surface of the prescribed material 61' arranged in the concave part is substantially flush with the upper surface of the light shielding film 62. Specifically, a vertical irregularity (concave part) is not formed in the first area S1, which includes the first pattern 61 through which the exposure light EL passes. With this configuration, it possible to more reliably prevent a nonconformity in which the liquid LQ remains in the first area S1.

Ninth Embodiment

Figure 16:
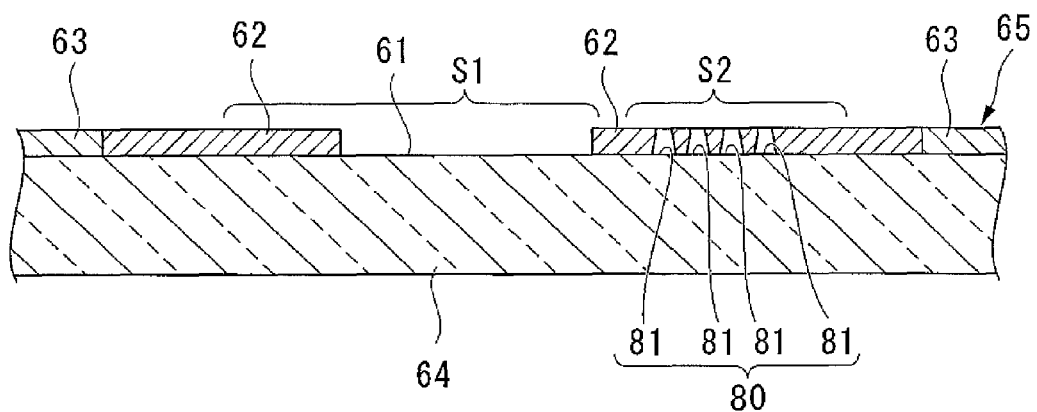
FIG. 16 is a cross sectional view of the slit plate relating to the ninth embodiment.

Next, a ninth embodiment will be explained while referring to FIG. 16. In FIG. 16, the cross sectional shape of the line patterns 81 is such that a tapered shape is formed so that there is getting gradually wider toward the lower side (glass plate member 64 side) from the upper side (the upper surface side of the light shielding film 62). By doing this, the ability to hold the liquid LQ in the second area S2, which has the line patterns 81, is further increased, and it is possible to cause the liquid LQ that has remained and extended over the first a S1 and the second area S2 to more smoothly retreat from the first area S1 and collect in the second area S2.

Tenth Embodiment

Figure 17:
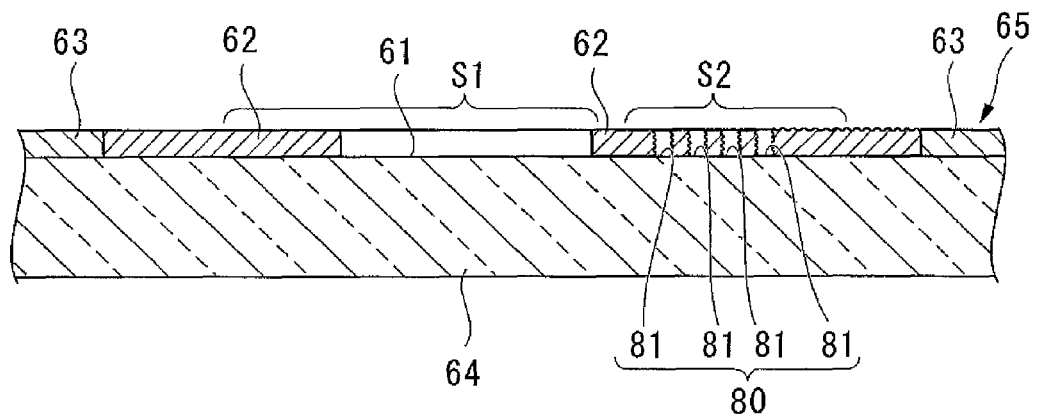
FIG. 17 is a cross sectional view of the slit plate relating to the tenth embodiment.

Next, a tenth embodiment will be explained while refer to FIG. 17. In FIG. 17, the surface of the second area S2, which includes the line patterns 81 comprising concave parts, is rougher than the surface of the first area S1. In order to roughen the surface of the second sea S2, in the present embodiment, sandblast processing is performed on the second area S2. By doing this as well, the ability to hold the liquid LQ in the second area S2 is further increased, so it is possible to cause the liquid LQ that has remained and extended over the first area S1 and the second area S2 to more smoothly retreat from the first area S1 and collect in the second area S2.

Eleventh Embodiment

Figure 18:
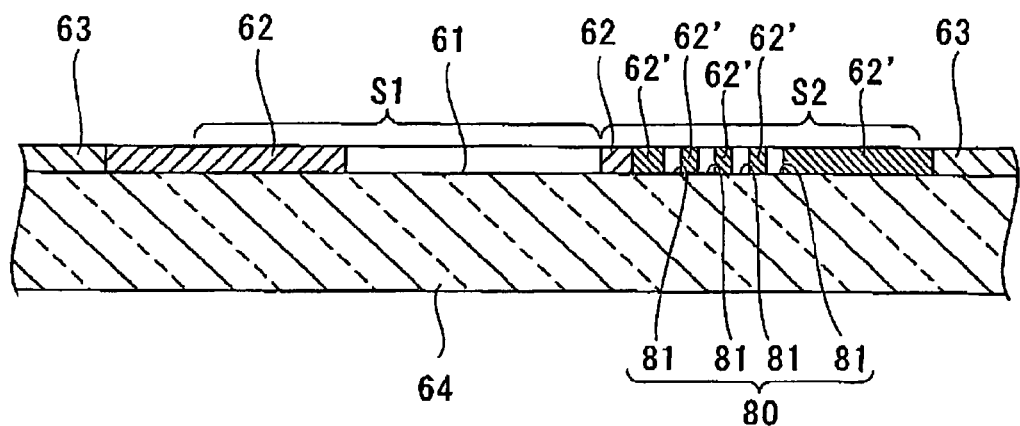
FIG. 18 is a cross sectional view of the slit plate relating to the eleventh embodiment.

Next, an eleventh embodiment will be explained while referring to FIG. 18. In FIG. 18, the light shielding film 62, which forms the first area S1, which includes the first pattern 61, and the light shielding film 62', which forms the second area S2, which includes the second pattern 80, are formed of mutually different materials. In addition, the material that forms light shielding film 62' has more lyophilicity with respect to the liquid LQ than the material that forms light shielding film 62. Due to this, the surface of the second area S2, which includes the inner wall surfaces of the line patterns 81 comprising concave parts, has more lyophilicity with respect to the liquid LQ than the surface of the first area S1, which includes the inner wall surface of the first pattern 61 comprising a concave part. By doing this, the ability to hold the liquid LQ in the second area S2 is further increased, and it is possible to cause the liquid LQ that has remained and extended over the first area S1 and the second area S2 to more smoothly retreat from the first area S1 and collect in the second area S2. Note that, as in the first to tenth embodiments, by respectively providing the light shielding film 62 in the first area Si and the second area S2 and coating a lyophilic material that has more lyophilicity than the light shielding film 62 on the surface of an area of the light shielding film 62 that corresponds to the second area S2, it is also possible to cause the surface of the second area S2 to be more lyophilic with respect to the liquid LQ than the surface of the first area. Conversely, a liquid repellent material that has more liquid repellency than the light shielding film 62 may be coated onto the surface of the area of the light shielding film 62 that corresponds to the first area S1.

Twelfth Embodiment

Figure 19:
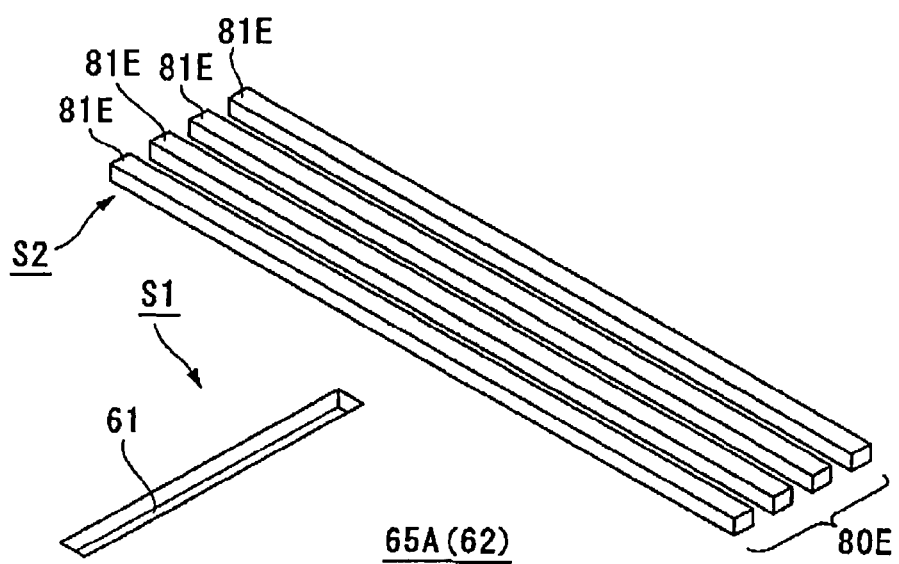
FIG. 19 is an oblique view of the slit plate relating to the twelfth embodiment

Next, a twelfth embodiment will be explained that while referring to FIG. 19. In FIG. 19, line pattern 81E, which constitutes second pattern 80E, is configured by a convex part that protrudes further upward than the upper surface 65A of the slit plate 65. In the present embodiment, a convex part consisting of $SiO_2$ is provided on the upper surface 65A of the slit plate 65 (upper surface of light shielding film 62). By employing this type of configuration as well, it is possible to cause the liquid LQ that has remained and extended over the first area S1 and the second are S2 to retreat from the first area S1 and collect in the second area S2. Of course, for the second pattern 80, the configuration may also be such that it includes convex parts and concave parts.

Thirteenth Embodiment

Figure 20:
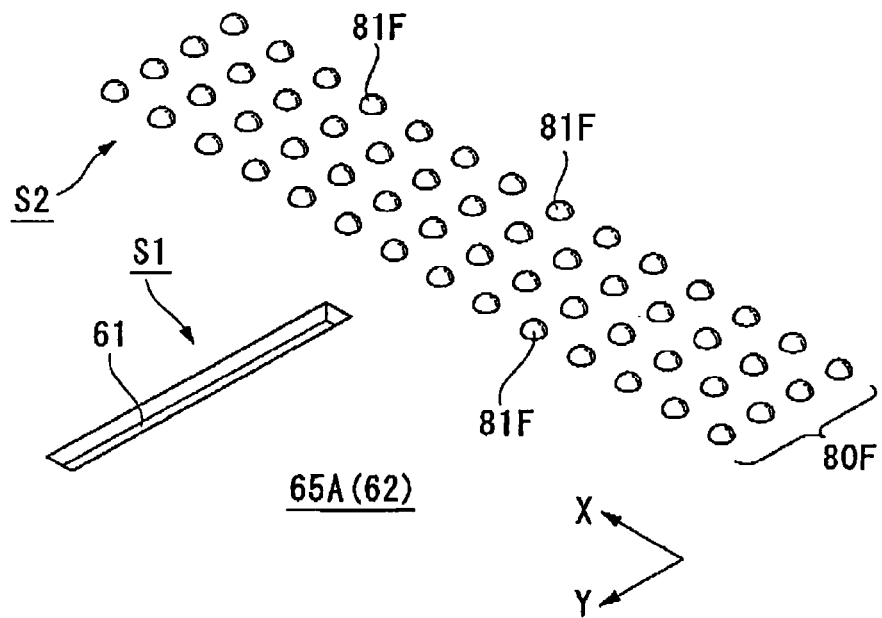
FIG. 20 is an oblique view of the slit plate relating to the thirteenth embodiment

Next, a thirteenth embodiment will be explained while referring to FIG. 20. In FIG. 20, second pattern 80F is configured by a dot shape pattern in which a plurality of small convex parts 81F with approximately circular shapes in a planar view is arrayed. By employing this type of configuration as well, it is possible to cause the liquid LQ that has remained and extended across the first area S1 and the second area S2 to retreat from the first area S1 and collect in the second area S2. Of course, for the dot shape patter, the configuration may also be such that a plurality of small concave parts with approximately circular shapes in a planar view is arrayed, and the configuration may also be such that it includes convex parts and concave parts.

Fourteenth Embodiment

Figure 21:
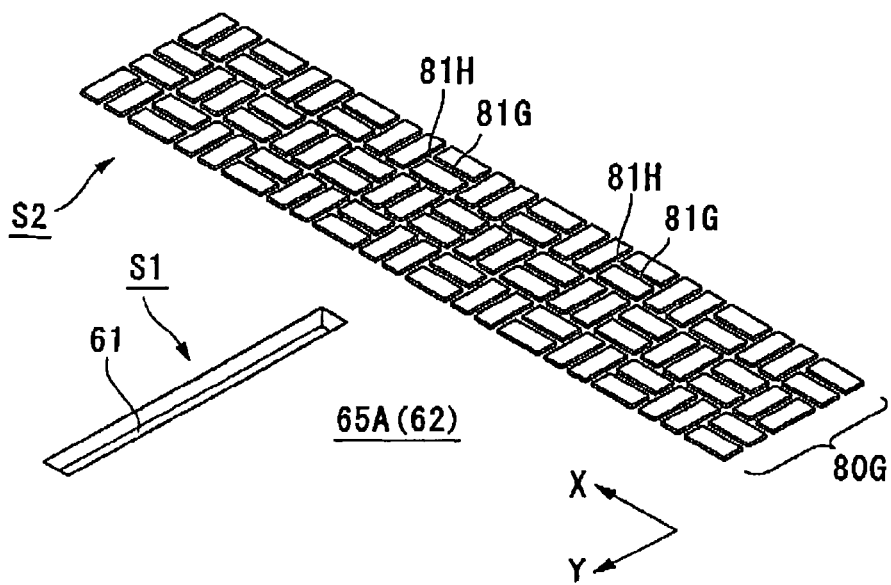
FIG. 21 is an oblique view of the slit plate relating to the fourteenth embodiment.

Next, a fourteenth embodiment will be explained while referring to FIG. 21. In FIG. 21, second pattern 80G comprises a lattice-shaped pattern that is configured by forming short groove parts 81G extending in the X axis direction, and short groove parts 81H extending in the Y axis direction, so that they are arrayed regularly with respect to the XY direction, and by mutually connecting these groove parts 81G, 81H so that they approximate a lattice shape. These groove parts 81G, 81H can be formed by etching the light shielding film 62. By employing a configuration such as this is well, it is possible to cause the liquid LQ that has remained and extended over the first area S1 and the second area S2 to retreat from the first area S1 and collect in the second area S2. Note that the lattice-shaped pattern such as that shown in FIG. 21 may also be configured by, for example, arraying a plurality of tile-shaped convex parts consisting of $SiO_2$ on the light shielding film 62.

Note that, in the first to fourteenth embodiments discussed above, the second pattern is provided in the second area S2, but it is also permissible not to provide the second pattern and merely make the affinity of the surface of the second area S2 with respect to the liquid LQ higher than the affinity of the surface of the first area S1 with respect to the liquid LQ. Specifically, a surface processing may be performed on the first area S1 or the second area S2 or both so that the contact angle of the liquid LQ at the surface of the second area S2 is smaller than the contact angle of the liquid LQ at the surface of the first area S1.

Fifteenth Embodiment

Figure 22:
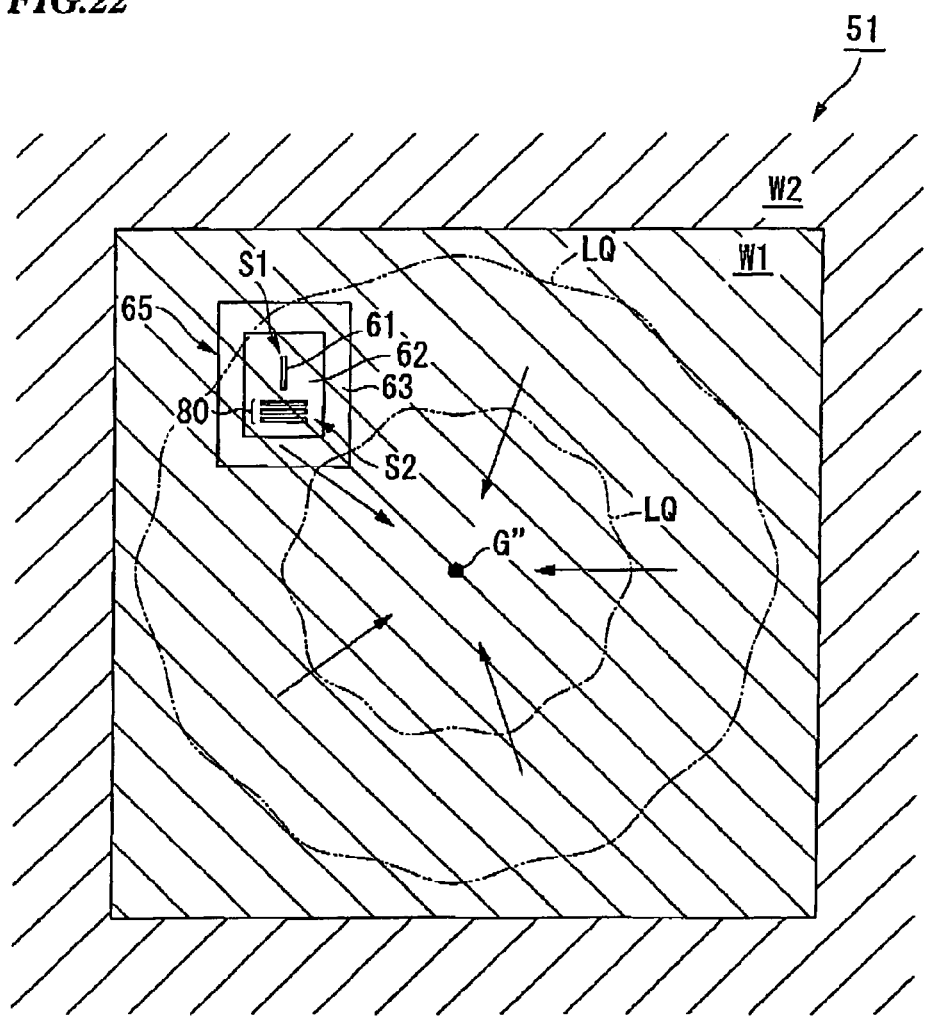
FIG. 22 is a plan view of the substrate stage relating to the fifteenth embodiment.

Next, a fifteenth embodiment will be explained while referring to FIG. 22. FIG. 22 is a plan view that shows a portion of the upper surface 51 of the substrate stage PST (Z tilt stage 52) on which the slit plate 65 is arranged. As discussed above, the upper surface 51 of the substrate stage PST has liquid repellency, but in the present embodiment, a lyophilic area W1 is provided on a portion of the upper surface 51 of the substrate stage PST that has liquid repellency, and the slit plate 65 is arranged at the inner side of that lyophilic area W1. Specifically, in FIG. 22, a lyophilic area W1 and a liquid repellent area W2, which is arranged at the outer side of that lyophilic area W1, are provided on the upper surface 51 of the substrate stage PST. Such a lyophilic area W1 and liquid repellent area W2 may be formed by removing only a partial area (area corresponding to a lyophilic area W1) of the liquid repellent coating that has been performed on the upper surface 51 of the substrate stage PST for example.

Also, the first area S1, which includes the first pattern 61 of the slit plate 65, is, within the lyophilic area W1, arranged at a position that is separated from the center (center of gravity, center of the drawing) of the lyophilic area W1. For example, in the case in which the liquid LQ has remained so that it covers substantially the entire surface of the lyophilic area W1, the liquid LQ attempts to collect in the center (center part) G" of the lyophilic area W1. Specifically, in the embodiment of FIG. 22, the lyophilic area W1 around the slit plate 65 (first area S1) also functions as the second area S2, which causes the liquid LQ that has remained to retreat from the first area S1, which includes the first pattern 61. Therefore, in the embodiment of FIG. 22 as well, it is possible to prevent the liquid LQ from retaining in the first area S1, which includes the first pattern 61.

Note that, in the fifteenth embodiment, the second area S2, which includes the second pattern 80, is formed on the slit plate 65, but the second area S2 (second pattern 80) on the slit plate 65 may be omitted. In addition, in the fifteenth embodiment, it is possible to cause the liquid LQ that has remained to more reliably retreat from the first area S1, which includes the first pattern 61, by making the affinity of the surface of the lyophilic area W1 with respect to the liquid LQ higher than that of the surface of the first area S1. In addition, since a liquid repellent film deteriorates due to the irradiation of ultraviolet light (exposure light EL), when the first pattern 61 used in measurement is coated with a liquid repellent film, there is a possibility that the liquid repellent film will deteriorate due to the irradiation of the exposure light EL, causing the accuracy of measurement using the first pattern 61 to deteriorate. However, in the present embodiment, since the liquid repellent film of a prescribed area of the upper surface 51 of the substrate stage PST that includes the first pattern 61 is partially removed, it is also possible to prevent deterioration of mea accuracy attributable to deterioration of the liquid repellent film.

Sixteenth Embodiment

Figure 23:
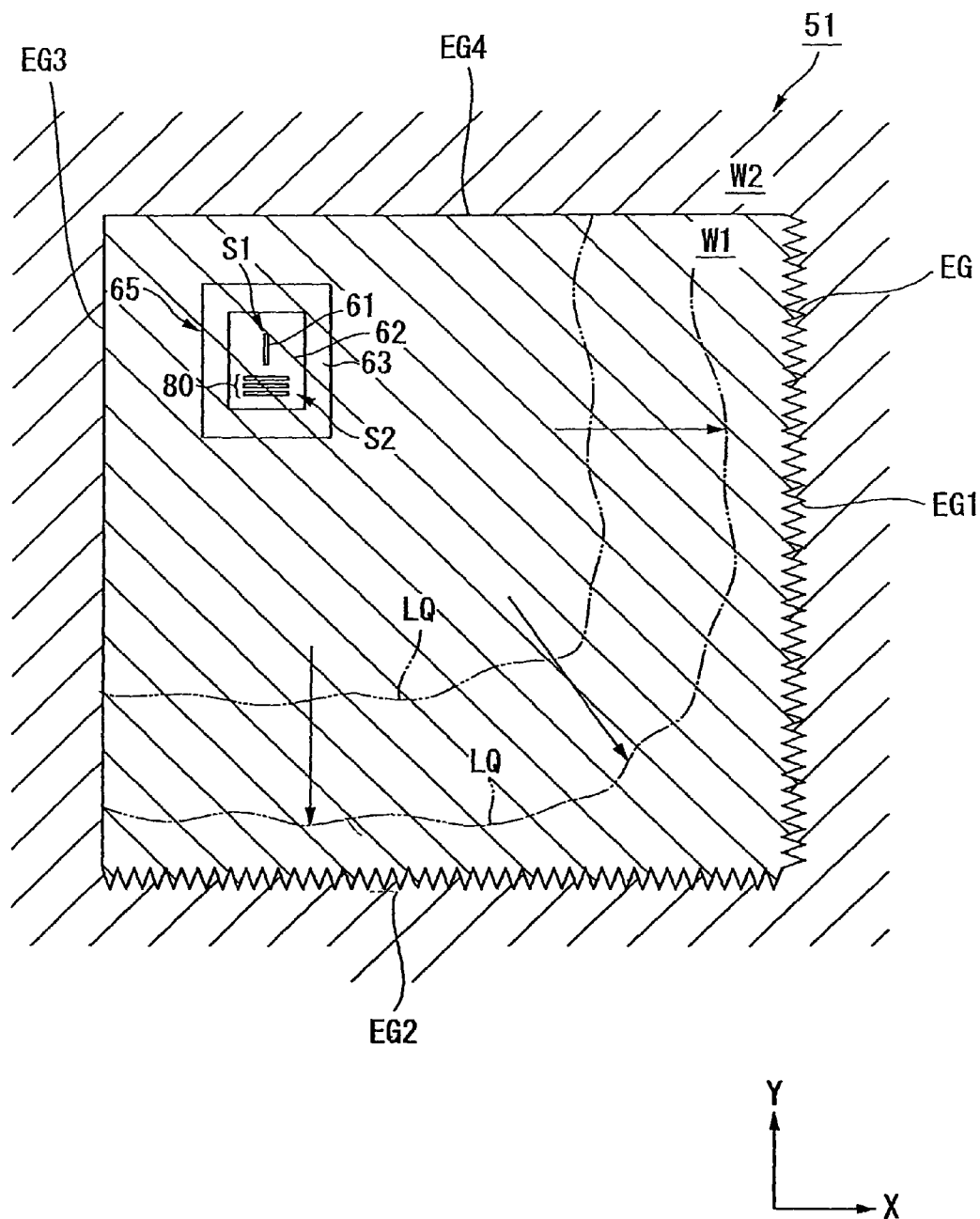
FIG. 23 is a plan view of the substrate stage relating to the sixteenth embodiment.

Next, a sixteenth embodiment will be explained while referring to FIG. 23. In FIG. 23, in the same way as in the fifteenth embodiment discussed above, a lyophilic area W1 and a liquid repellent area W2, which is arranged at the outer side of that lyophilic area W1, are provided on the upper face 51 of the substrate stage PST. The slit plate 65 is arranged at the inner side of the lyophilic area W1. The first area S1, which includes the first pattern 61 of the slit plate 65, is arranged within the lyophilic area W1 at a position that is separated from the center (center of gravity, center of the drawing) of the lyophilic area W1. In addition, among the boundary edge part EG between the lyophilic area W1 and the liquid repellent area W2, the edge shape of the boundary edge part G that is separated from the slit plate 65 (first pattern 61) is formed in a sawtooth shape in a planar view. In the present embodiment, the lyophilic area W1 is a substantially rectangular shape (square shape), the boundary edge part EG has four sides, and the boundary edge parts EG1, EG2, from among boundary edge parts EG1 to EG4 corresponding to those sides, that are separated from the slit plate 65 are formed in a sawtooth shape. In the case where the size of the area with respect to the prescribed direction is substantially the same, the edge length of the boundary edge parts formed in a sawtooth shape is longer than the edge length of the boundary edge parts not formed in a sawtooth shape. Specifically, the edge length of boundary edge part EG1 formed in a sawtooth shape from among the mutually opposing boundary edge parts EG1, EG3 whose size of the area with respect to the Y as direction is substantially the same is longer than the edge length of the opposing boundary edge part EG3. Similarly, the edge length of boundary edge part EG2 formed in a sawtooth shape from among the mutually opposing boundary edge parts EG2, EG4 whose size of the area with respect to the X axis direction is the same is longer than the edge length of the opposing boundary edge part EG4.

In this way, by making the boundary edge part EG (EG1, EG2) of a portion of the boundary edge part EG (EG1 to EG4) that is separated from the slit plate 65 into a sawtooth shape and making the edge lengths of boundary edge parts EG1 and EG2 thereof longer, it is possible to effectively increase the length of the edge of the lyophilic area W1 in those boundary edge parts EG1, EG2. Therefore, the liquid LQ that has remained extended over the lyophilic area W1 and the liquid repellent area W2 so that it covers substantially the entire surface of the lyophilic area W1 becomes unlikely to move at boundary edge parts E1 and E2 and attempts to collect at boundary edge parts EG1 and EG2. Therefore, even if the liquid LQ remains on the slit plate 65 (first area S1), which includes the first pattern 61, at a position that is separated with respect to those boundary edge parts EG1, EG2, it is possible to cause that liquid LQ to retreat.

Note that, in the present embodiment, the boundary edge parts EG1 and EG2 are formed in a sawtooth shape, but they do not need to be formed in a sawtooth shape. Specifically, in the case in which a plurality of boundary edge parts whose size of area with respect to a prescribed direction is substantially the same have been formed, the edge length of boundary edge pats EG1 and EG2 provided at a position that is separated from the slit plate 65 may be formed to be longer than the edge length of boundary edge parts EG3 and EG4 provided at a position near the slit plate 65. In addition, in the present embodiment, the boundary edge parts EG1 and EG2 of the two sides separated from the slit plate 65 from among the boundary edge part EG formed in a square shape are formed in a sawtooth shape, but it is also permissible for only one boundary edge part to be formed in a sawtooth shape. In addition, the boundary edge part EG (the lyophilic area W1) does not need to be a square shape, and it may also be any shape (round shape, elliptical shape, square shape, or a polygonal shape other than a square shape).

Note that, in the present embodiment as well, since a liquid repellent film of a prescribed area of the upper surface 51 of the substrate stage PST that includes the first pattern 61 is partially removed, it is also possible to prevent worsening of measuring accuracy attributable to deterioration of the liquid repellent film.

Seventeenth Embodiment

Figure 24:
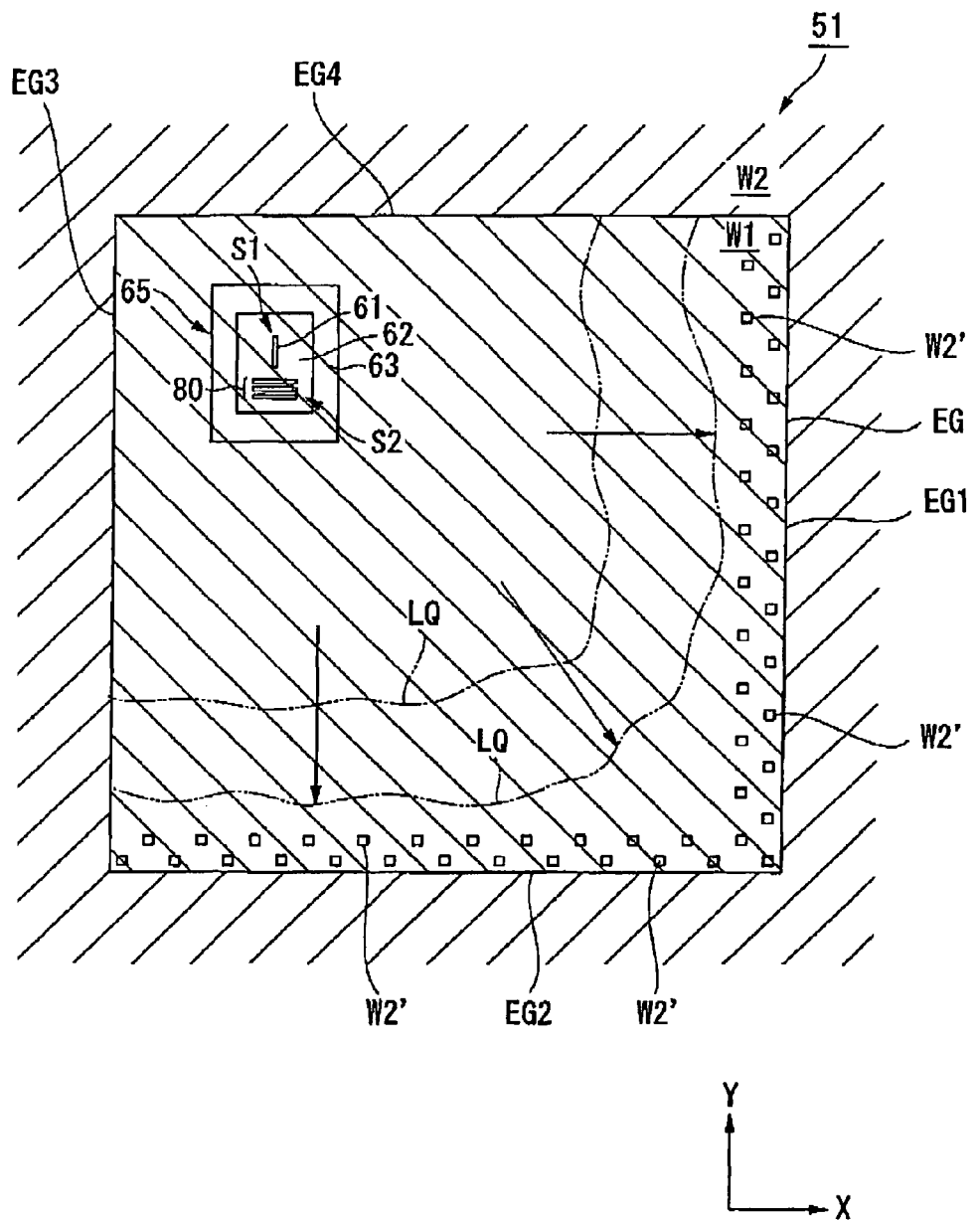
FIG. 24 is a plan view of the substrate stage relating to the seventeenth embodiment.

Next, a seventeenth embodiment will be explained while referring to FIG. 24. In FIG. 24, in the same way as in the fifteenth and sixteenth embodiments, a lyophilic area W1 and a liquid repellent area W2, which is arranged at the outer side of that lyophilic area W1, are provided on the upper surface 51 of the substrate stage PST. The slit plate 65 is arranged at the inner side of the lyophilic area W1, and the first area S1, which includes the first pattern 61 of the slit plate 65 is arranged within the lyophilic area W1 at a position that is separated from the center (center of gravity, center of the drawing) of the lyophilic area W1. Also, a plurality of minute liquid repellent areas W2' is provided in the lyophilic area W1 in the vicinity of the boundary edge part EG (EG1, EG2) that is separated from the slit plate 65 (first pattern 61), from among the boundary edge part EG (EG1 to EG4) between the lyophilic area W1 and the liquid repellent area W2. In the present embodiment, the minute liquid repellent areas W2' are formed in a rectangular shape in a planar view and are provided along boundary edge parts EG1 and EG2 within the lyophilic area W1. Note that the shape of the minute liquid repellent areas W2' is not limited to a rectangular shape, and it may be any shape, such as a circular shape.

By doing this as well, the length of the edge of the liquid repellent area W1 of those boundary edge parts EG1 and EG2 becomes essentially longer. Therefore, the liquid LQ that has remained becomes unlikely to move in the vicinity of boundary edge pans E1 and E2 and attempts to collect in the vicinity of boundary edge parts EG1 and EG2. Therefore, even if the liquid LQ remains on the slit plate 65 (first area S1), which includes the first pattern 61, at a position separated with respect to those boundary edge pans EG1, EG2, it is possible to cause that liquid LQ to retreat.

Note that, in the present embodiment as well, the liquid repellent film of a prescribed area of the surface 51 of the substrate stage PST that includes the first pattern 61 is partially removed, so it is possible to prevent worsening of measuring accuracy attributable to deterioration of the liquid repellent film.

Eighteenth Embodiment

Figure 25:
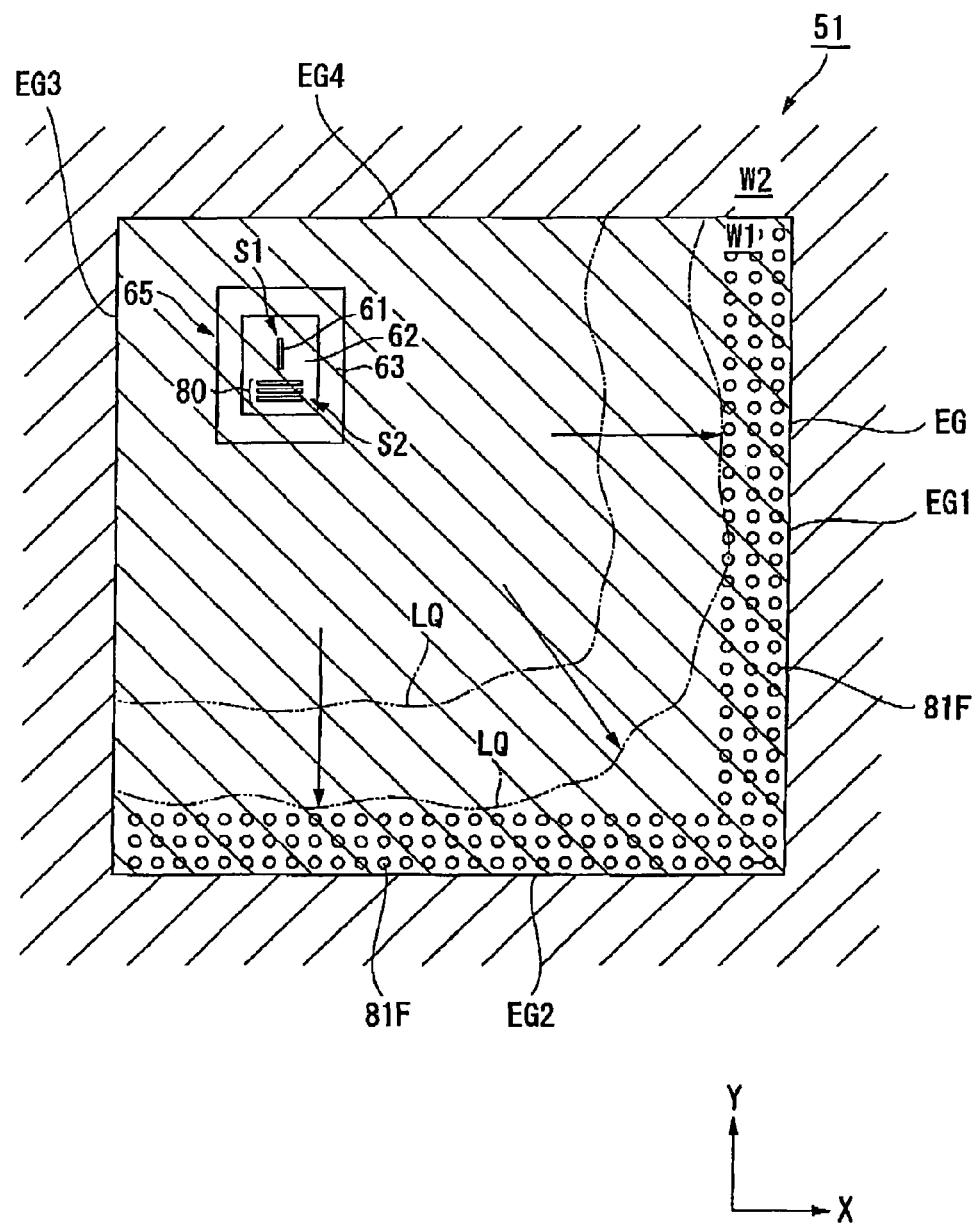
FIG. 25 is a plan view of the substrate stage relating to the eighteenth embodiment.

Next, an eighteenth embodiment will be explained while referring to FIG. 25. In FIG. 25, in the same way as in the fifteenth to seventeenth embodiments discussed above, a lyophilic area W1 and a liquid repellent area W2, which is arranged at the outer side of that lyophilic area W1, are provided. On the upper surface 51 of the substrate stage PST.

The slit plate 65 is arranged within the lyophilic area W1, and the first area S1, which includes the first pattern 61 of the slit plate 65 is arranged within the lyophilic area W1, at a position that is separated from the center (center of gravity, center of the drawing) of the lyophilic area W1. Also, a plurality of small convex parts 81F that are approximately circular in a planar view, such as those of the thirteenth embodiment explained while referring to FIG. 20, are provided in the lyophilic area W1 in the vicinity of the boundary edge part EG (EG1, EG2) that is separated from the slit plate 65 (first pattern 61), from among the boundary edge part EG (EG1 to EG4) between the lyophilic area W1 and the liquid repellent area W2. The convex parts 81F are provided along boundary edge pans EG1 and EG2 within the lyophilic area W1 and form a dot shape pattern.

By doing this, in the same way as in the thirteenth embodiment, it is possible to collect the liquid LQ that has remained in the dot shape pattern comprising the convex parts 81F. Note that, in the same way as in the thirteenth embodiment, for the dot shape pattern, the configuration may be such that a plurality of small concave parts that have an approximately circular shape in a planar view is arrayed, or it may be such that it includes convex parts and concave parts. In addition, the convex parts or concave parts are not limited to an approximately circular shape in a planar view, and they may have an appropriate shape and may be arranged at an appropriate density to the extent that they are able to collect the liquid LQ. Note that, the convex parts or the concave parts may be made of metal. In the case where the convex parts or the concave parts are made of metal, in conjunction with the lyophilicity of the metal, the liquid LQ tends not to move more effectively, and the liquid LQ that has remained becomes easier to collect.

Note that, in the present embodiment as well, the liquid repellent film of a prescribed area of the upper surface 51 of the substrate stage PST that includes the first pattern 61 is partially removed, so it is also possible to prevent worsening of measuring accuracy attributable to deterioration of the liquid repellent film.

Note that, in the first to eighteenth embodiments discussed above, a detailed explanation has been omitted, but, for the illuminance non-uniformity sensor 400 and the irradiation amount sensor 600 as well, the configuration is such that the light that has passed through the light transmission parts is incident to a condensing optical member such as the first optical element 66 without passing through the gas space.

In addition, in the lint to eighteenth embodiments discussed above, the light that has passed through the light transmission parts of the spatial image of measuring system 60, the illuminance non-uniformity sensor 400 and the irradiation amount sensor 600 may be such that it is directly incident to the light receiving element without using a condensing optical member such as the first optical element 66, and the space between the condensing optical member such as the first optical element 66 or the light receiving element and the light transmission primary be filled with a liquid with a refractive index that is higher than 1 (for example, pure water).

Nineteenth Embodiment

Next, a nineteenth embodiment will be explained while referring to FIG. 26.

Figure 26:
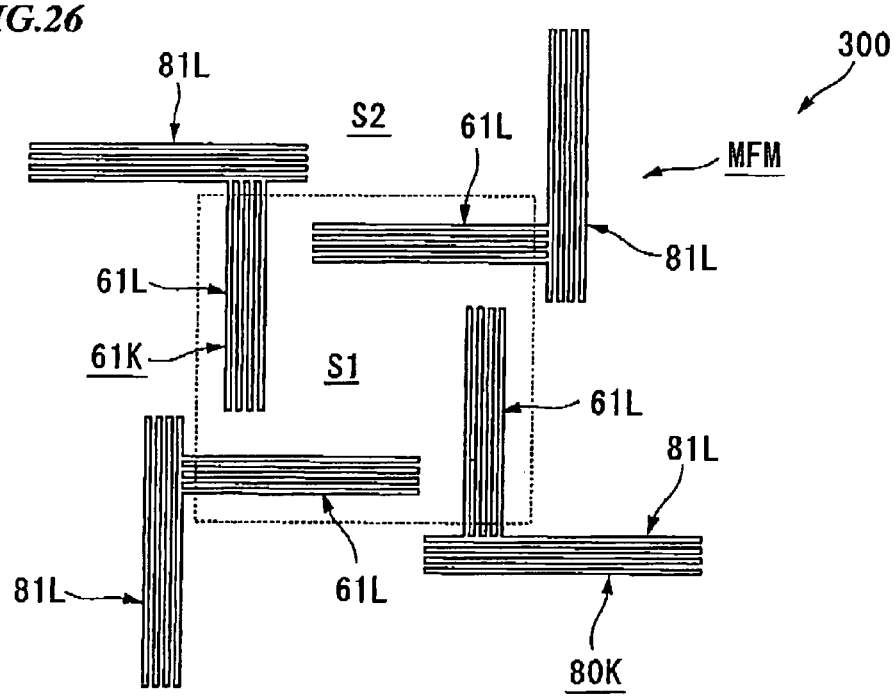
FIG. 26 is a plan view of the reference mark relating to the nineteenth embodiment.
Figure 27:
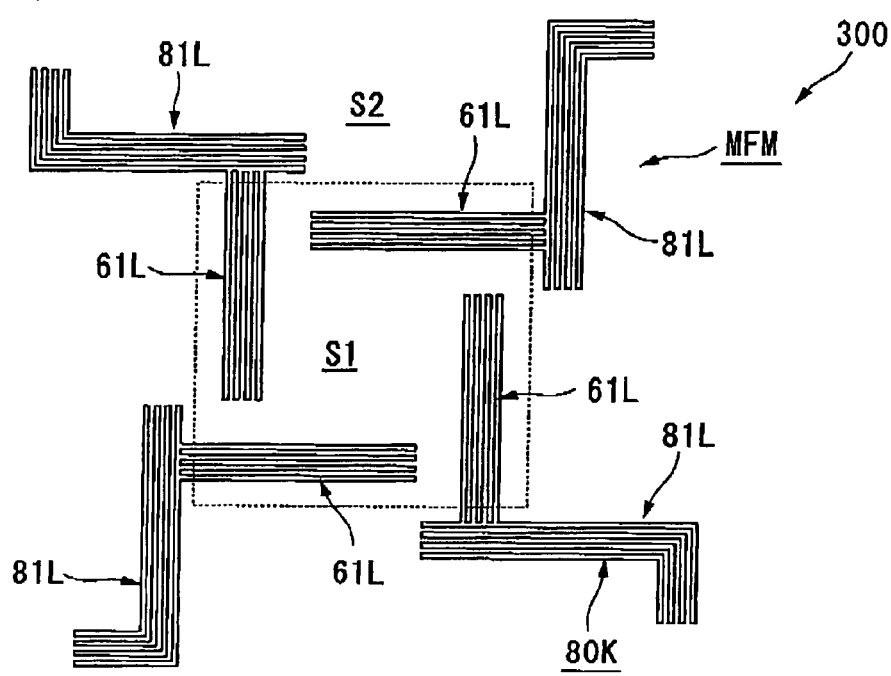
FIG. 27 is a modification example of FIG. 26.

FIG. 26 is a drawing that shows the reference mark MFM measured by the mask alignment system 360. The reference mark MFM has a first patter 61K which is measured by the mask alignment system 360, and a second pattern 80K which is connected to the first pattern 611. The first pattern 61K is configured by combining four line and space patterns 61L and is arranged in a rectangular shape and provided in the first area S1 on the reference member 300 that corresponds to the measuring area of the mask alignment system 360. The second pattern 80K also comprises line and space patterns 81L that are respectively connected to the four line and space patterns 61L of the first pattern 61K. The second pattern 80K is provided in the second area S2 of the outer side of the first area S1 and is formed to extend in a direction that separates from the first area S1. By employing this type of configuration as well, the second pattern 80K is able to cause the liquid LQ that has remained and extended across the first area S1 and the second area S2 to retreat from the first area S1 and collect in the second area S2. In addition, as shown in FIG. 27, the line and space patterns 81L that comprise the second pattern 80K may be bended.

Note that, in the case where there is a possibility that the liquid LQ will remain on reference mark PFM measured by the substrate alignment system 350, in the same way as reference mark MFM, it is possible to cause the liquid LQ that has remained to retreat from the first area S1, which includes reference mark PFM, and collect in the second area S2.

Note that, in the first to eighteenth embodiments discussed above, the case in which the liquid LQ that has remained on top of the slit plate 65 of the spatial image measuring system 60 retreats from the first area S1 was explained as an example, but as explained while referring to FIG. 2, the upper plate 401 having a pinhole part (hole pattern) 470 that constitutes a portion of the illuminance non-uniformity sensor 400, for example, is arranged on the sure stage PST, and it is also possible to cause the liquid LQ that has remained and extended over the first area, which includes the pinhole part 470, and the second area to retreat from the first area and collect in the second area in the same way as in the first to eighteenth embodiments. In addition, with respect to the upper plate 601 of the irradiation amount sensor 600 as well, in the same way as in the first to eighteenth embodiments discussed above, it is possible to cause the liquid LQ that has remained to retreat from the first area, which includes light transmission part, and collect in the second area.

In addition, also in the case in which a reflecting surface for measuring the amount of reflected light is arranged on the substrate stage PST as discussed above, in the same way as in the first to eighteenth embodiments discussed above, it is possible to cause the liquid LQ that has remained to retreat from the first area, which includes at least a portion of that reflecting surface, and collect in the second area in the vicinity thereof.

In addition, in the case where there is a possibility that the liquid LQ will remain on reference mark MFM and/or PFM on the substrate stage PST, in the same way as in the fifteenth to eighteenth embodiments discussed above, it is possible to cause the liquid LQ that has remained to retreat from the first area S1, which includes reference mark MFM and/or PFM, and collect in the second area S2 in the vicinity thereof.

Furthermore, as a measuring apparatus that is provided on the substrate stage PST, it is also possible to employ a waveform aberration measuring apparatus such as those disclosed in PCT International Patent Publication No. 99/60361 and U.S. Pat. No. 6,650,399. In this case as well, in the same way as in the first to eighteenth embodiments discussed above, it is possible to cause the liquid that has remained to retreat from the first area, which includes the light transmission part, and collect in the second area.

Note that, in the first to nineteenth embodiments discussed above, the first pattern is configured by concave parts, but it may also be convex parts, and it may also be concave parts and convex parts.

Twentieth Embodiment

Figure 28:
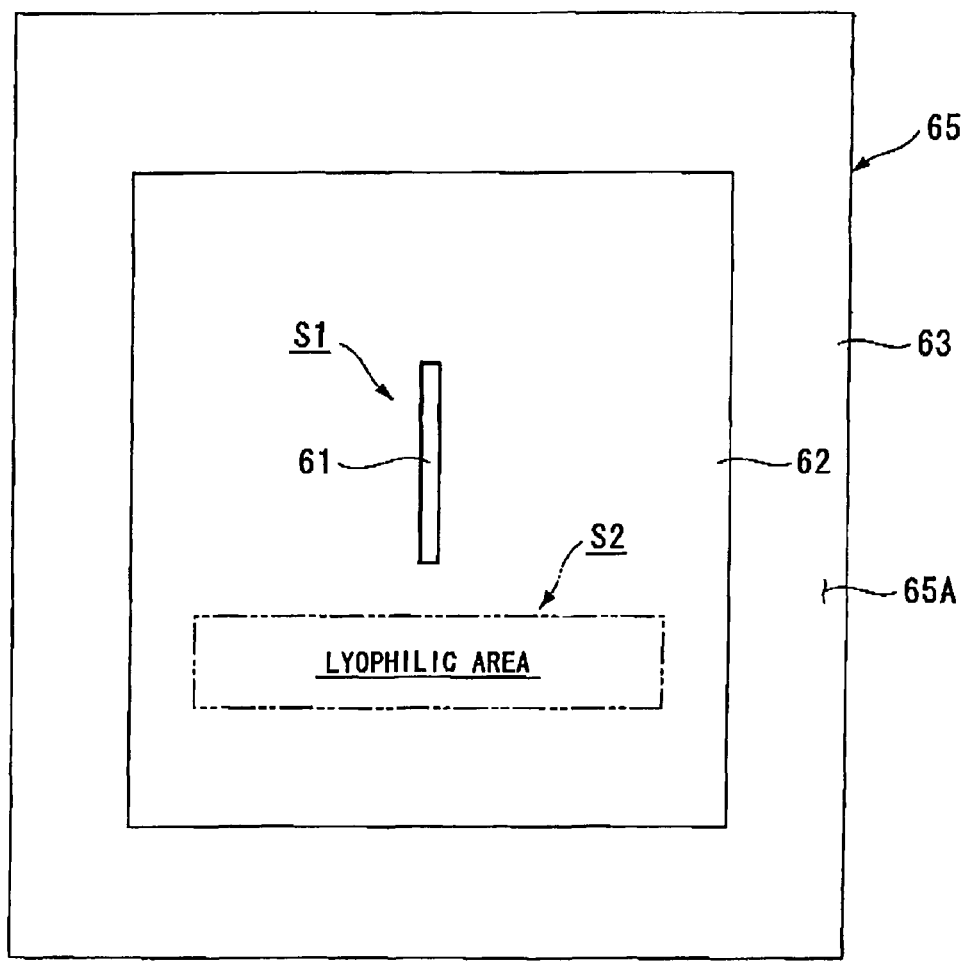
FIG. 28 is a plan view that shows an example of the slit plate relating to the twentieth embodiment.
Figure 29:
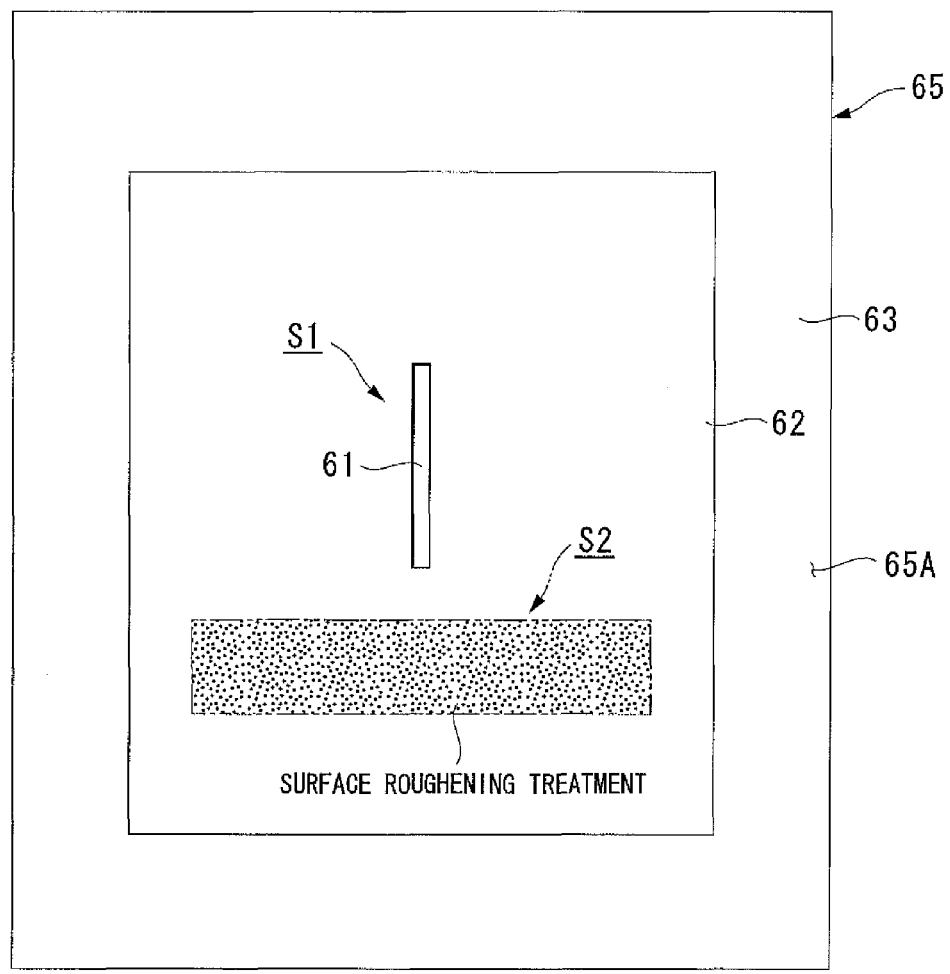
FIG. 29 is a plan view that shows another example of the slit plate relating to the twentieth embodiment.

In the respective embodiments discussed above, the second pattern 80 provided in the second area S2 is configured by concave parts or convex parts or both, but, for example, even if a second pattern 80 is not provided in the second area S2, by performing the prescribed processing on the surface of the first area S1 or the surface of the second area S2 or both, it is possible to cause the liquid LQ that has remained and extended over the first area S1 and the second area S2 to great from the first area S1 and collect in the second area S2. For example, as shown in FIG. 28, by performing lyophilicity treatment on the second area S2, which does not have concave parts and convex parts, to make it lyophilic without performing surface treatment on the first area S1, it is possible to cause the liquid LQ that has remained and extended over the first area S1 and the second area S2 to be pulled to the second area S2 side and retreat from the first area S1 to collect in the second area S2. In addition, deeding on the exposure conditions including the condition of the material used for the surface treatment, or the conditions of the exposure light EL used or the liquid LQ, even in the case in which surface treatment (liquid repellence treatment) has been performed on the first area S1, there is a possibility of controlling the advance of the deterioration over time of that liquid repellency. In such a case, using a simple configuration in which liquid repellence treatment is performed on the surface of the first area S1 using a liquid repellent material, it is possible to cause the liquid LQ that has remained and extended over the first area S1 and the second area S2 to retreat from the first area S1 and collect in the second area S2. Of course, the prescribed processing (surface treatment) may also be performed on both the first area S1 and the second area S2 in the same way that lyophilicity treatment was performed on the surface of the second area S2 and liquid repellence treatment was performed on the surface of the first area S1. Or, since the surface of the second area S2 is mainly the surface of the light shielding film 62, by using a material that has lyophilicity with respect to the liquid LQ as the material for forming the light shielding film 62 and using a material that has liquid repellency with respect to the liquid LQ as the material for forming the surface of the first area S1, it is possible to cause the liquid LQ that has remained and extended over the first area S1, and the second area S2 to retreat from the first area S1 and collect in the second area S2. In addition, here, the case in which a second pattern comprising concave parts or convex parts is not provided in the second area was explained, but as shown in FIG. 29, by performing surface roughening treatment such as sandblast processing on the surface of the second area S2, on which this second pattern is not provided to make the surface of the second area S2 more rough than the surface of the first area S1, it is possible to cause the liquid LQ that has remained and extended over the first area S1 and the second area S2 to more smoothly retreat from the first area S1 and collect at the second area S2 side.

Twenty-First Embodiment

Figure 30:
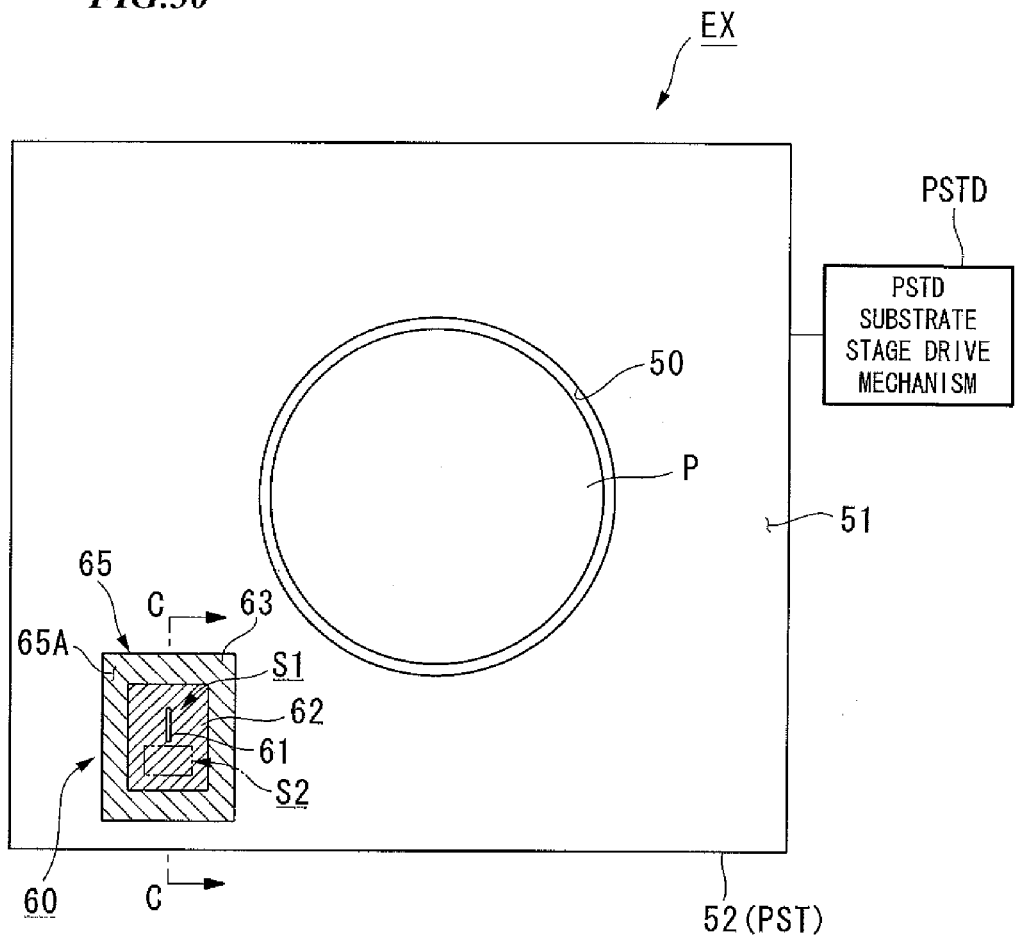
FIG. 30 is a plan view of the substrate stage relating to the twenty-first embodiment.

Next, a twenty-first embodiment will be explained. In FIG. 30, a slit plate 65, which has the first pattern 61, is provided on the substrate stage PST. Defined on the upper surface 65A (the upper surface 51 of the substrate stage PST) are a first area S1, which includes a slit part 61, and a second area S2, on which the prescribed processing is performed. The second area S2 is defined in the vicinity of the first area S1. As was explained while referring to FIG. 28, lyophilicity treat is performed on the second area S2, and the surface of the second area S2 has more lyophilicity with respect to the liquid LQ than the surface of the first area S1. The second area S2, which has lyophilicity, is defined on the light shielding film 62. Note that, in FIG. 30, the diagrams of the reference member, the upper plate of the illuminance non uniformity sensor, the upper plate of the illuminance sensor, etc. have been omitted.

Figure 31:
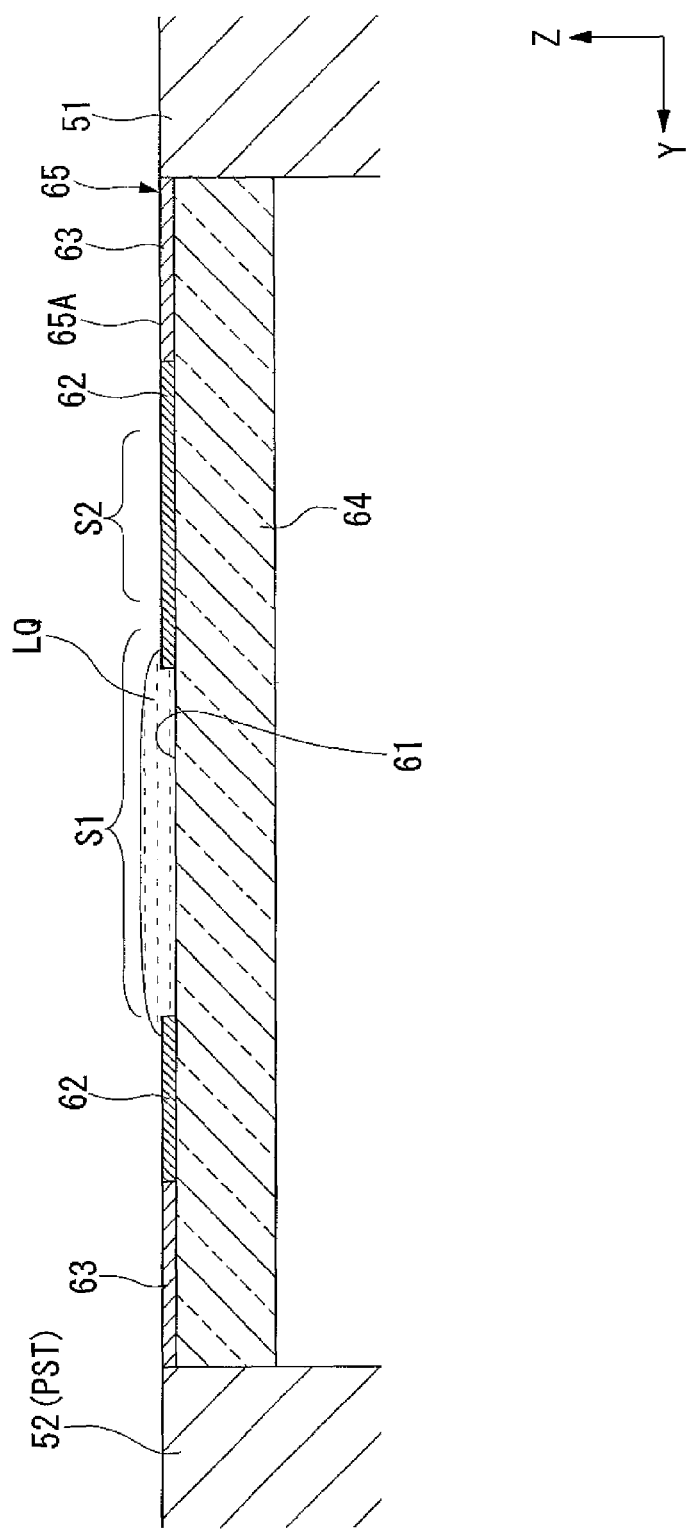
FIG. 31 is a cross sectional view at the C-C arrows of FIG. 30.

FIG. 31 is an arrow drawing of the CC cross section of FIG. 30. Shown in FIG. 31 is the status after measuring processing using the first pattern has been performed in a status in which the liquid LQ has been arranged on the upper surface 65A of the slit plate 65, which includes the first area 1. As shown in FIG. 31, the upper surface 65A of the slit plate 65 and the upper sure 51 of the substrate stage PST are substantially flush with each other. During the measuring processing that uses the first pattern 61, the upper surface 65A of the slit plate 65 and the upper surface 51 of the substrate stage PST are substantially parallel with the horizontal plane (XY plane). In addition, the measuring processing is performed in a status in which the liquid LQ has been arranged on the first area S1, which includes the first Patter 61. After the measuring processing that uses the first pawn 61 has been performed, the control apparatus CONT uses the liquid recovery mechanism 20 to recover the liquid LQ on the slit plate 65 (on the substrate stage PST). Even though the liquid LQ on the slit plate 65 has been recovered using the liquid recovery mechanism 20, as shown in FIG. 31, there is a possibility that the liquid LQ will remain on the first area S1.

The control apparatus CONT moves the substrate sage PST to a prescribed standby position that is seated from the projection optical system PL after the operation of recovering the liquid LQ on the slit plate 65 using the liquid recovery mechanism 20. Then, the control apparatus CONT causes the first area S1 on the slit plate 65 to tilt by tilting the entire substrate stage PST using the substrate stage drive mechanism PSTD.

Figure 32:
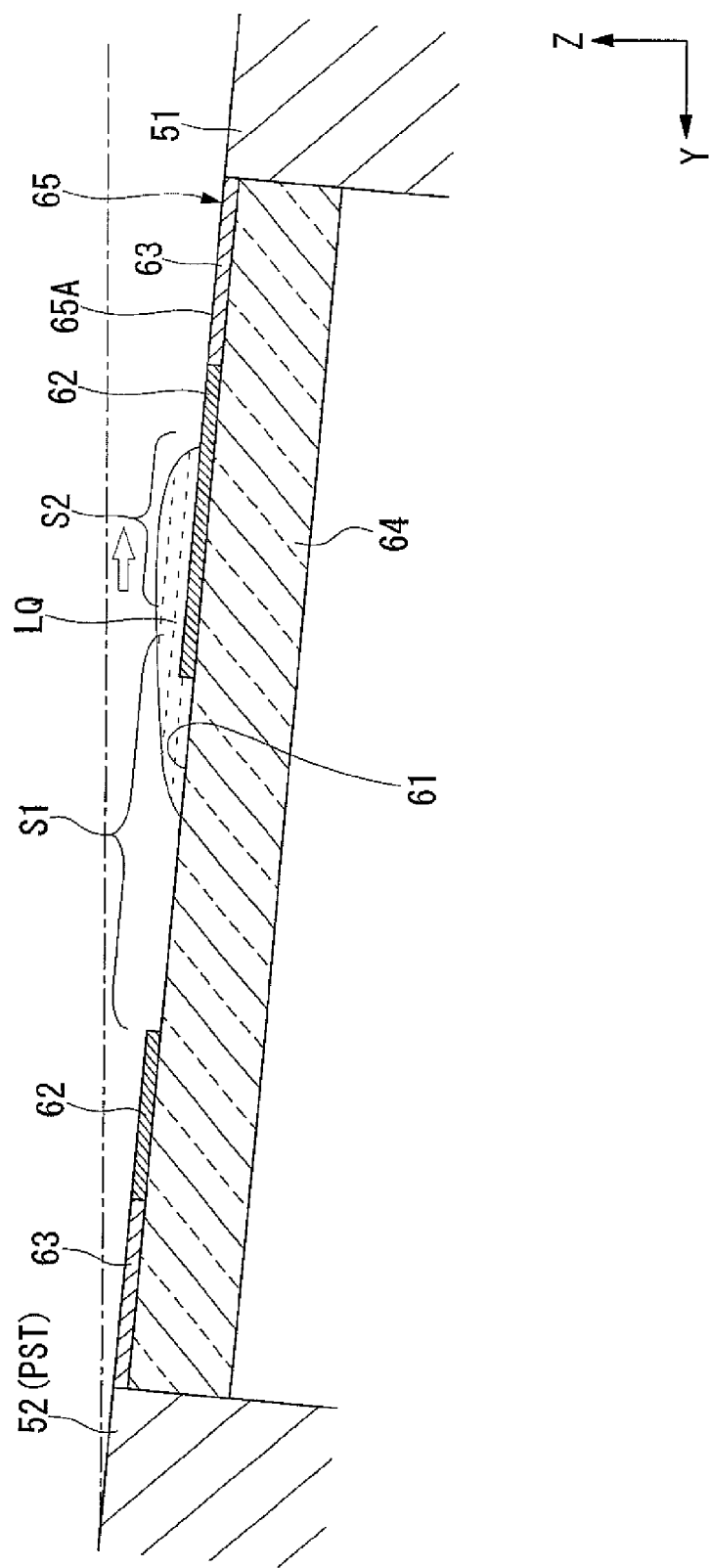
FIG. 32 is a drawing that shows a status in which the substrate stage of FIG. 31 has tilted.

FIG. 32 is a drawing that shows the status in which the upper surface 65A of the slit plate 65, which includes the first area S1, is tilted after the measuring processing has been performed. As shown in FIG. 32, the substrate stage drive apparatus PSTD tilts the upper surface 65A of the slit plate 65, which includes the first and second areas S1, S2, so that the second remained S2 is positioned below the first area S1.

Through this, the liquid LQ that has remained in the first area S1 from the surface S1 and collects in the second area S2.

In this way, it is also possible to cause the liquid LQ that has remained in the first area S1 to retreat from the first by tilting the upper surface 65A of the slit plate 65. Therefore, it is possible to prevent the liquid LQ from remaining on the first area S1, which includes the first pattern 61. In addition, the second area S2 defined in the vicinity of the first area S1 is lyophilic, so it is possible to collect the liquid LQ that has retreated from the first area S1 well using the second area S2 by tilting the upper surface 65A of the slit plate 65 so that the second area S2 becomes lower than the first area S1.

Figure 33:
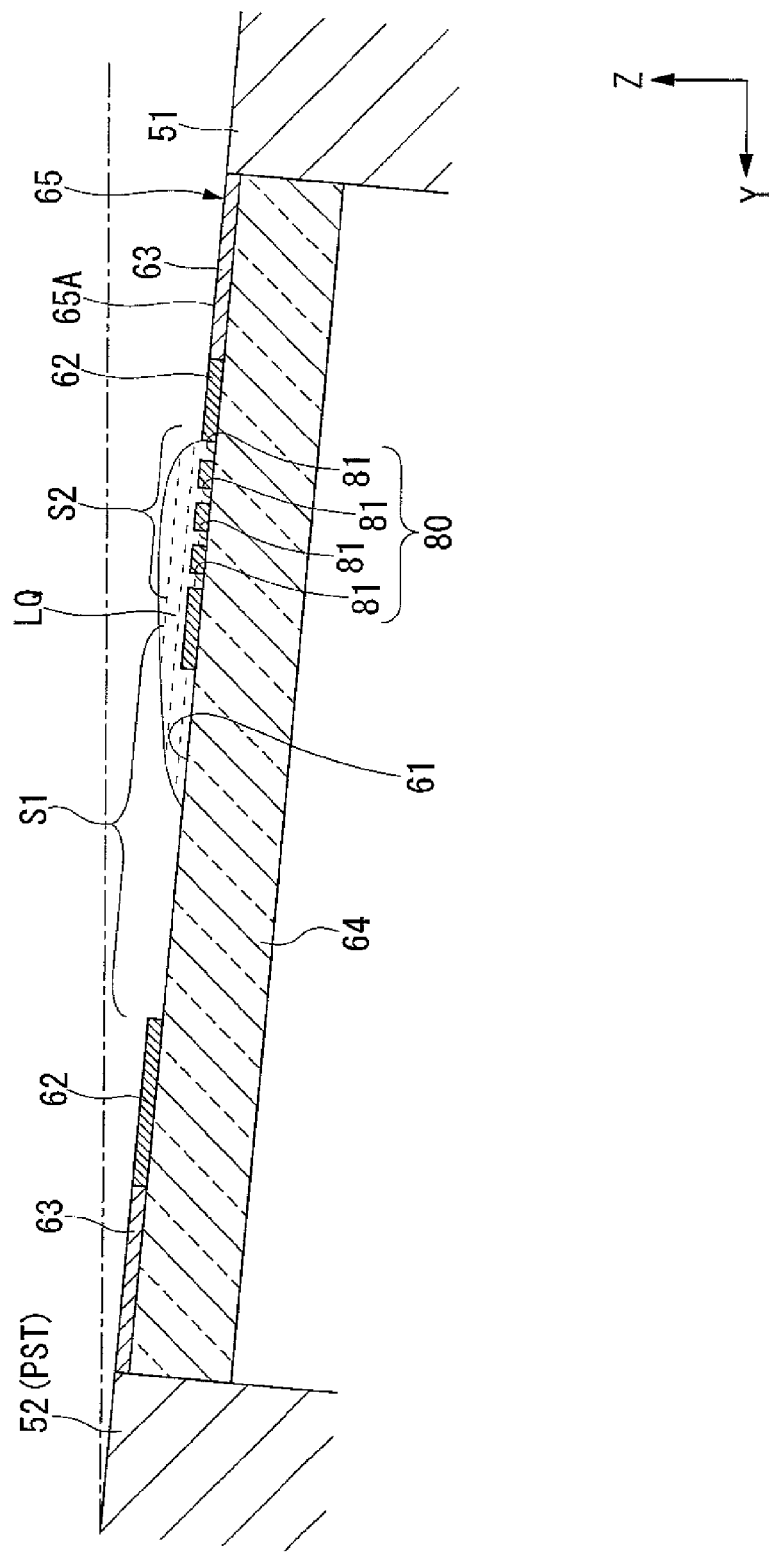
FIG. 33 is a plan view that shows another example of the slit plate relating to the twenty-first embodiment

Note that, as shown in FIG. 33, the second pattern 80, which includes a plurality of line patterns 81 comprising concave parts, may be provided on the surface of the second area S2, and tilting may be performed so that the second area S2, which includes that second pattern 80, is positioned below the first area S1. Or, convex part 81E, such as that explained using FIG. 19, may be provided on the surface of the second area S2. Or, concave parts 81, which are deeper than concave part (first pattern) 61 of the first area S1, may be formed on the surface of the second area S2 as explained using FIG. 14. Or, the surface of the second area S2 may be made rougher than the surface of the first area S1 as explained while referring to FIG. 29. By forming concave parts or convex parts in the second area S2 or performing surface roughening treatment on the second area S2, it is possible to cause the liquid LQ that has retreated from the first area S1 to collect well in the second area S2.

Note that, it is not absolutely necessary to perform prescribed processing on the second area S2, such as lyophilicity treatment, formation of concave or convex parts, or surface roughening treatment. Even if the prescribed processing is not performed on the second area S2, by tilting the first area S1, it is possible to cause the liquid LQ that has collected in the first area S1 to retreat from the first area S1.

Twenty-Second Embodiment

Figure 34:
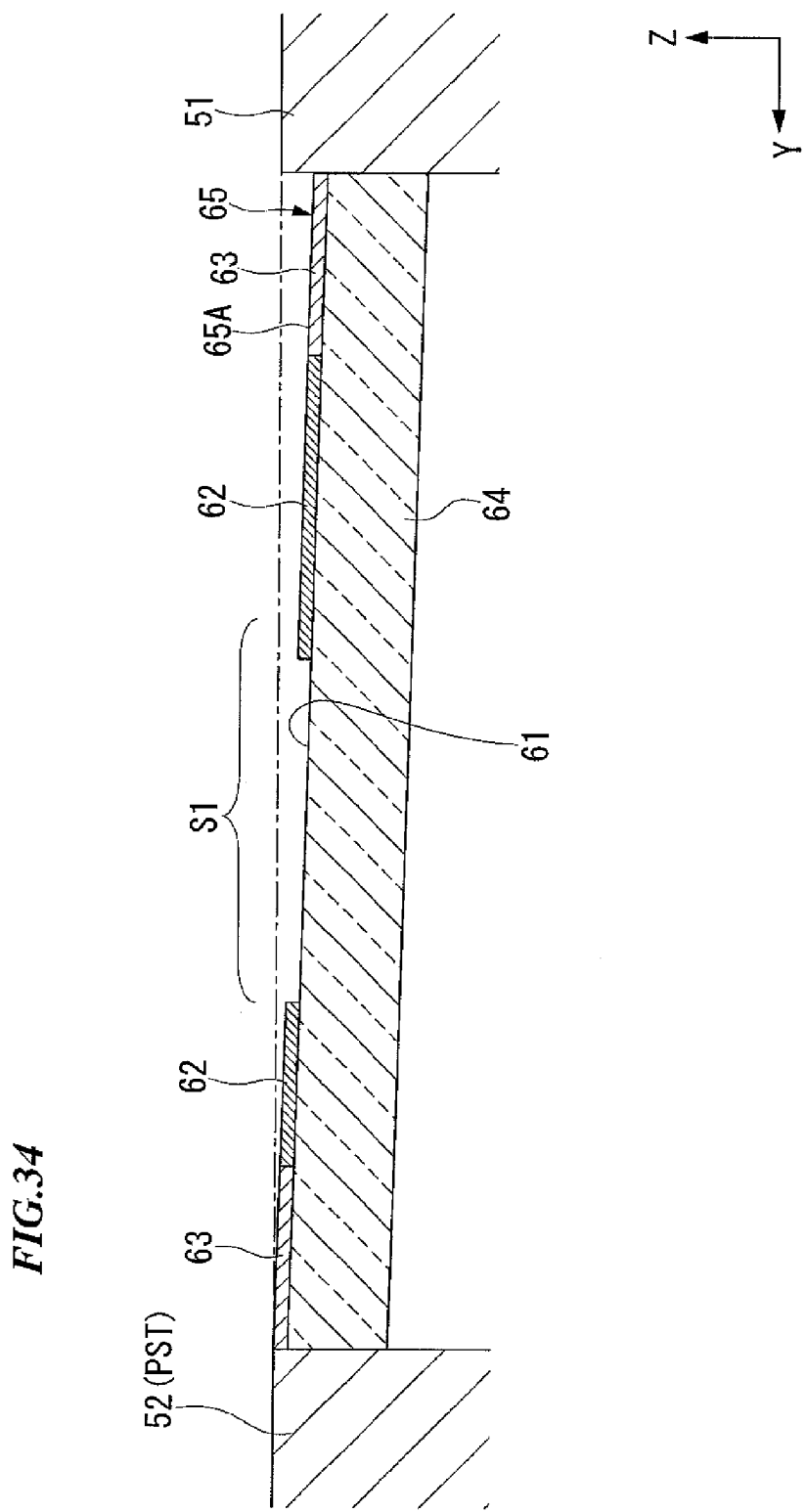
FIG. 34 is a cross sectional view of the slit plate relating to the twenty-second embodiment.

Next, a twenty-second embodiment will be explained. In the twenty-first embodiment discussed above, the upper surface 65A of the slit plate 65, which includes the first area S1, is tilted by tilting the entire substrate stage PST using the substrate stage drive mechanism PSTD. However, as shown in FIG. 34, the slit plate 65 may be attached to the substrate stage PST so that the upper surface 65A of the slit plate 65, which includes the first area S1, is tilted with respect to the upper surface 51 of the substrate stage PST. The liquid immersion area AR2 of the liquid LQ may be formed on the first area S1 by using the liquid immersion mechanism 1 in the status in which the upper surface 65A of the slit plate 65, which includes the first area S1, has been tilted with respect to the XY plane to perform the measuring processing. Or the substrate stage drive mechanism PSTD may be used to adjust the attitude of the substrate stage PST so that the upper the 65A of the slit plate 65, which includes the first area S1, and the XY plane become substantially parallel to each other during the measurement processing, and adjust the attitude of the substrate stage PST so that the upper surface 65A of the slit plate 65 is tilted after the measurement processing, Note that, in the case where the measurement processing is performed in a status in which the upper surface 65A of the slit plate 65, which includes the first area S1, is tilted with respect to the XY plane, the measurement results may be corrected according to the amount of that tilt.

Twenty-Third Embodiment

Figure 35:
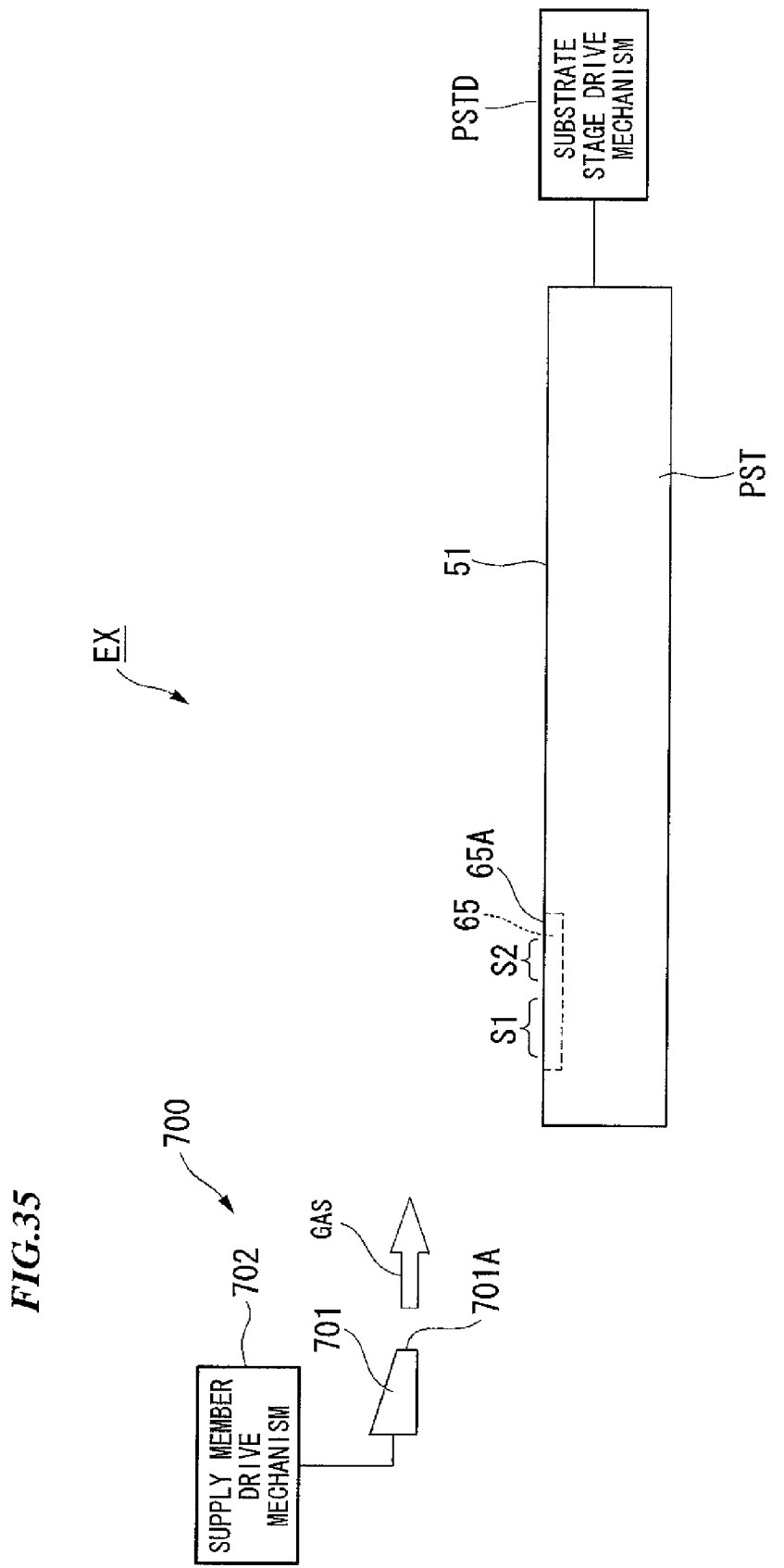
FIG. 35 is a schematic block diagram that shows an exposure apparatus relating to the twenty-third embodiment.

Next, a twenty-third embodiment will be explained while referring to FIG. 35. In FIG. 35, the exposure apparatus EX comprises a slit plate 65 provided on the substrate stage PST and a gas supply system 700 that produces a flow of gas onto the first area S1 of the upper surface 65A of the slit plate 65. The gas supply system 700 comprises a supply member 701 that has a gas supply port 701A that supplies gas. The supply member 701 is provided so that it is able to move relative to the substrate stage PST (first area S1) by means of a supply member drive mechanism 702, and the control apparatus CONT is able to adjust the relative positional relationship between the supply member 701 and the substrate stage PST by driving the supply member drive mechanism 702 or the substrate stage drive mechanism PSTD, or both.

Figure 36:
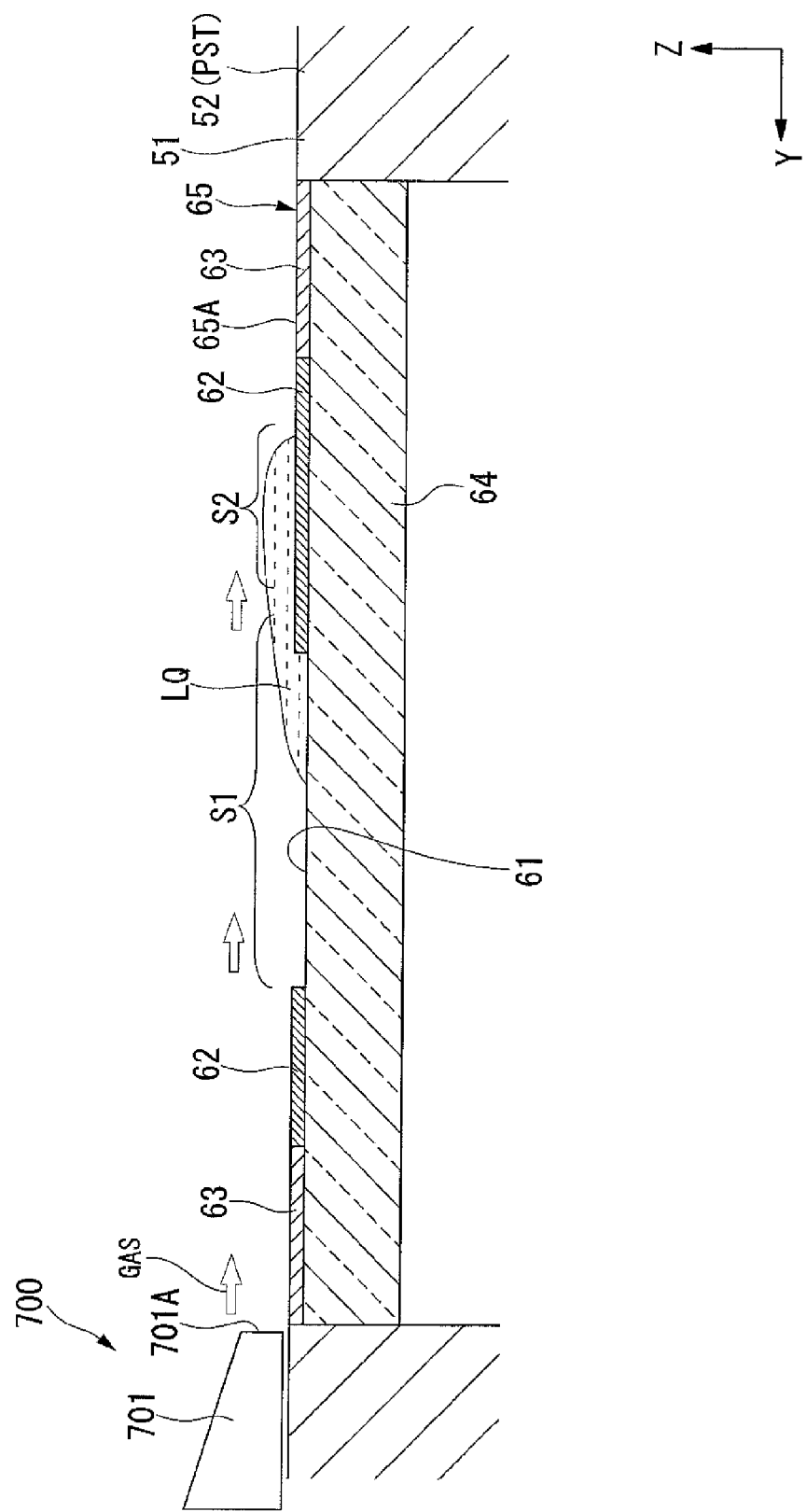
FIG. 36 is a cross sectional view of the slit plate relating to the twenty-third embodiment.

FIG. 36 is a drawing that shows the condition in which the gas supply system 700 is producing a flow of gas onto the first area S1 of the slit plate 65. As shown in FIG. 36, the control apparatus CONT is able to produce a flow of gas that is substantially parallel to the surface of the first area S1 by arranging the supply port 701A of the supply member 701 in the vicinity of the first area S1 and driving the gas supply system 700 to supply the gas from the supply port 701A. Then, it is possible to cause the liquid LQ that has remained in the first area S1 to retreat from the first area S1 by means of the flow of gas produced by this supply port 701A. In addition, the control apparatus CONT defines the positional relationship between the supply member 701 (supply port 701A) and the substrate stage PST (first area S1) so that the second area S2 is arranged on the downstream side of the flow of the gas with respect to the first area S1, and the liquid LQ that has retreated from the first area S1 collects in the second area S2 due to the flow of the gas.

In the same way as the embodiment discussed above, the surface of the second area S2 is more lyophilic with respect to the liquid LQ than the surface of the first area S1. Therefore, the second area S2 is able to collect the liquid LQ well. Note that, in the present embodiment as well, the surface of the second area S2 may be made rougher than the surface of the first area S1, concave parts or convex parts or both may be formed on the surface of the second area S2, or concave parts that are deeper than the concave parts (first pattern) formed in the first area S1 may be formed on the surface of the second area S2. Or, it is permissible not to perform the prescribed processing on the second area S2, such as lyophilicity treatment and surface roughening treatment or formation of concave or convex parts. Even if the prescribed processing is not performed on the second area S2, it is possible to cause the liquid LQ that has remained in the first area S1 to retreat from the fit area S1 by producing a flow of gas onto the first area S1.

Twenty-Fourth Embodiment

Figure 37:
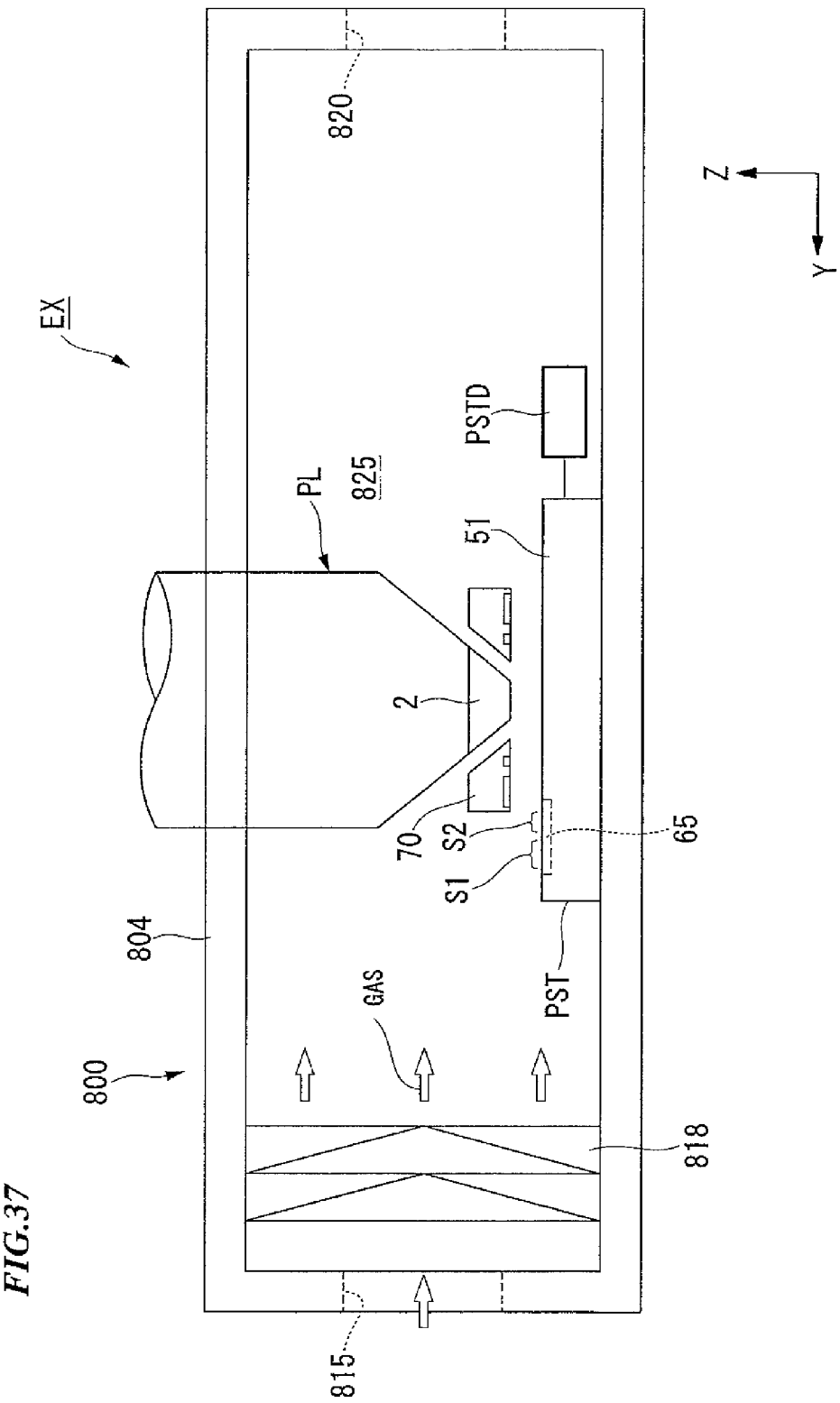
FIG. 37 is a schematic block diagram that shows an exposure apparatus relating to the twenty-fourth embodiment.

Next, a twenty-fourth embodiment will be explained while referring to FIG. 37. In FIG. 37, the exposure apparatus EX comprises an air conditioning system 800, which air-conditions the space (air conditioned space) 825 in the vicinity of the substrate stage PST, in which a portion of the projection optical system PL is provided. The air conditioned space 825 is a space in the air conditioned chamber 804, and, arranged in the air conditioned chamber 804 are at least the front end of the image plane side of the projection optical system PL and the substrate stage PST that includes the slit plate 65. Note that the entire exposure apparatus EX is accommodated in the interior of a chamber that is not shown in the drawing, and the air conditioned chamber 804 is arranged in that chamber.

An air supply port 815, through which a gas that has been thermally adjusted by a thermal adjustment apparatus that is not shown in the drawing, is supplied to the air conditioned space 825, is provided at the end part of the +Y side of the air conditioned chamber 804, and an exhaust port 820, through which gas of the interior of the air conditioned space 825 is discharged to the exterior, is provided at the end part of the −Y side. In addition, a filter unit 818 is provided on the supply port 815, and the gas that has come in firm the supply port 815 is supplied to the air conditioned space 825 after being cleaned by the filter unit 818.

The air conditioning system 800 supplies gas in the horizontal direction, in the −Y direction in the present embodiment, to an air conditioned space 825 in the vicinity of the substrate stage PST, in which a portion of the projection optical system PL is provided, and it air-conditions the air conditioned space 825. Specifically, in the air conditioned space 825, the flow of the gas produced by the air conditioning system 800 is set to substantially the −Y direction.

In the present embodiment, due to the flow of the gas produced by the air conditioning system 800, the liquid LQ that has remained in the first area S1 on the slit plate 65 retreats from the first area S1. When the liquid that has remained in the first area S1 has been caused to retreat, the control apparatus CONT controls the position or the attitude of the first area S1 on the slit plate 65 so that the surface of the fit area S1 becomes nearly parallel to the flow of the gas produced by the air conditioning system 800. Since the slit plate 65, which includes the first area S1, is held on the substrate stage PST, the control apparatus CONT is able to control the position or the attitude of the first area S1 of the slit plate 65 by driving substrate stage drive mechanism PSTD to control the position or the attitude of the substrate stage PST. The flow of gas produced by the air conditioning system 800 is set in substantially the −Y direction, so the control apparatus CONT controls the position or the attitude of the first area S1 of the slit plate 65 by controlling the position or the attitude of the substrate stage PST so that the surface of the first area S1 and the XY plane become nearly parallel.

In addition, since the second area S2 on which the prescribed processing has been performed is defined in the vicinity of the first area S1, the control apparatus CONT is able to cause the liquid LQ that has remained in the first area S1 to retreat from the first area S1 and collect well in the second area S2 by controlling the position or the attitude of the substrate stage PST so that the second area S2 is positioned on the downstream side of the flow of gas produced by the air conditioning system 800 with respect to the first area S1.

In the present embodiment as well, the surface of the second area S2 is more lyophilic with respect to the liquid LQ than the surface of the first area S1. Note that, in the present embodiment as well, the surface of the second area S2 may be made rougher than the surface of the first area S1, concave parts or convex parts or both may be formed on the surface of the second area S2, and concave parts that are deeper than the concave parts (first pattern) formed in the first area S1 may be formed on the surface of the second area S2. Or, it is permissible not to perform the prescribed processing on the second area S2, such as lyophilicity treatment and surface roughening treatment or formation of concave and convex parts. Even if the prescribed processing is not performed on the second area S2, it is possible to cause the liquid LQ that has remained in the first area S1 to retreat from the first area S1 by producing a flow of gas onto the first area S1.

Twenty-Fifth Embodiment

Next, an explanation of the twenty-fifth embodiment will be given while referring to FIG. 38A, FIG. 38B and FIG. 38C. In the present embodiment, by moving the substrate stage PST, which hold the slit plate 65, in a tint direction, which is within a plane substantially parallel to the upper surface 65A of the slit plate 65 (within the XY plane) and then moving it in a second (opposite) direction other than the first direction, the liquid LQ that has remained in the first area S1 is caused to retreat from the first area S1. Specifically, the liquid LQ is caused to retreat from the first area S1 due to the inertia of the liquid LQ. It is possible to cause the liquid LQ that has remained in the first area S1 to retreat well from the first area S1 by making the second moving velocity when moving in the second direction faster than the first moving velocity when moving in the fit direction.

Figure 38A:
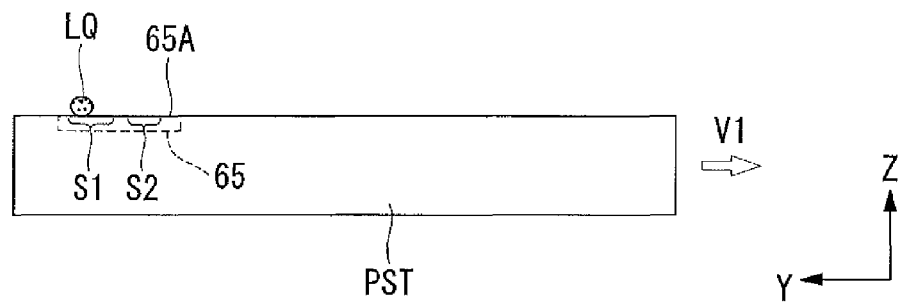
FIG. 38A is a schematic block diagram that explains the operation of the substrate stage relating to the twenty-fifth embodiment.
Figure 38B:
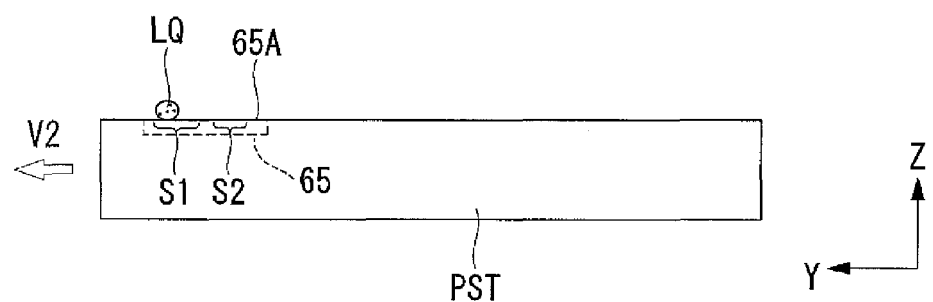
FIG. 38B is a schematic block diagram that explain the operation of the substrate stage relating to the twenty-fifth embodiment.
Figure 38C:
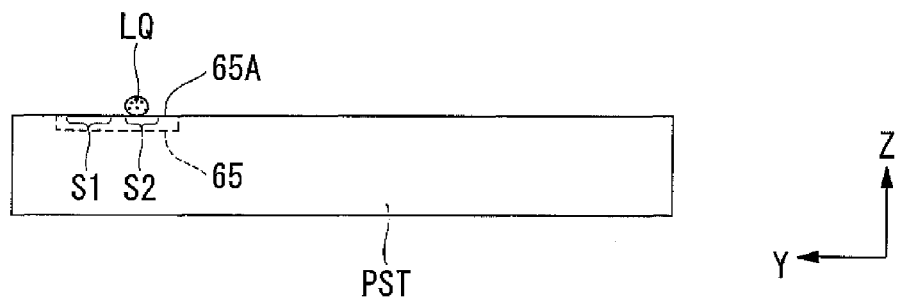
FIG. 38C is a schematic block diagram that explains the operation of the substrate stage relating to the twenty-fifth embodiment.

As shown in FIG. 38A, in the case where the liquid LQ has remained in the first area S1 of the upper surface 65A of the slit plate 65, first, the control apparatus CONT drives the substrate stage PST to move the slit plate 65 a prescribed distance at a first moving velocity v1 to the −Y side (second area S2 side) from the status shown in FIR 38A. The status after the split plate 65 has moved the prescribed distance to the −Y side is shown in FIG. 38B. Then, the control apparatus CONT moves the substrate stage PST, from the status shown in FIG. 38B, to move the slit plate 65 to the +X side at a second moving velocity v2. The second moving velocity v2 is sufficiently faster than the first moving velocity v1. As shown in FIG. 38C, doing this causes the liquid LQ to withdraw from the first area S1 due to inertia and be moved on the second area S2. In this case, it is possible to move the liquid LQ on the first area S1 more effectively in a case in which the contact angle of the first area S1 with respect to the liquid LQ is large. However, even if the contact angle of the first area S1 with respect to the liquid LQ is small, the liquid LQ is able to retreat from the first area S1 due to inertia.

In present embodiment even if the prescribed processing is not performed on the second area S2, it is possible to cause the liquid LQ that has remained in the first area S1 to retreat well from the first area S1. Of course, the prescribed processing, such as lyophilicity treatment, surface roughening treatment, or formation of concave and convex parts may be performed on the surface of the second area S2.

Twenty-Sixth Embodiment

Note that, in an exposure apparatus which has a substrate stage and a measuring stage, such as those disclosed in Japanese Unexamined Patent Application Publication No. H11-135400 and Japanese Unexamined Patent Application Publication No. 2000-164504, the present invention can be applied even in the case in which a mating part such as that discussed above (such as the respective sensors or reference members) has been arranged on the measuring stage.

Figure 39:
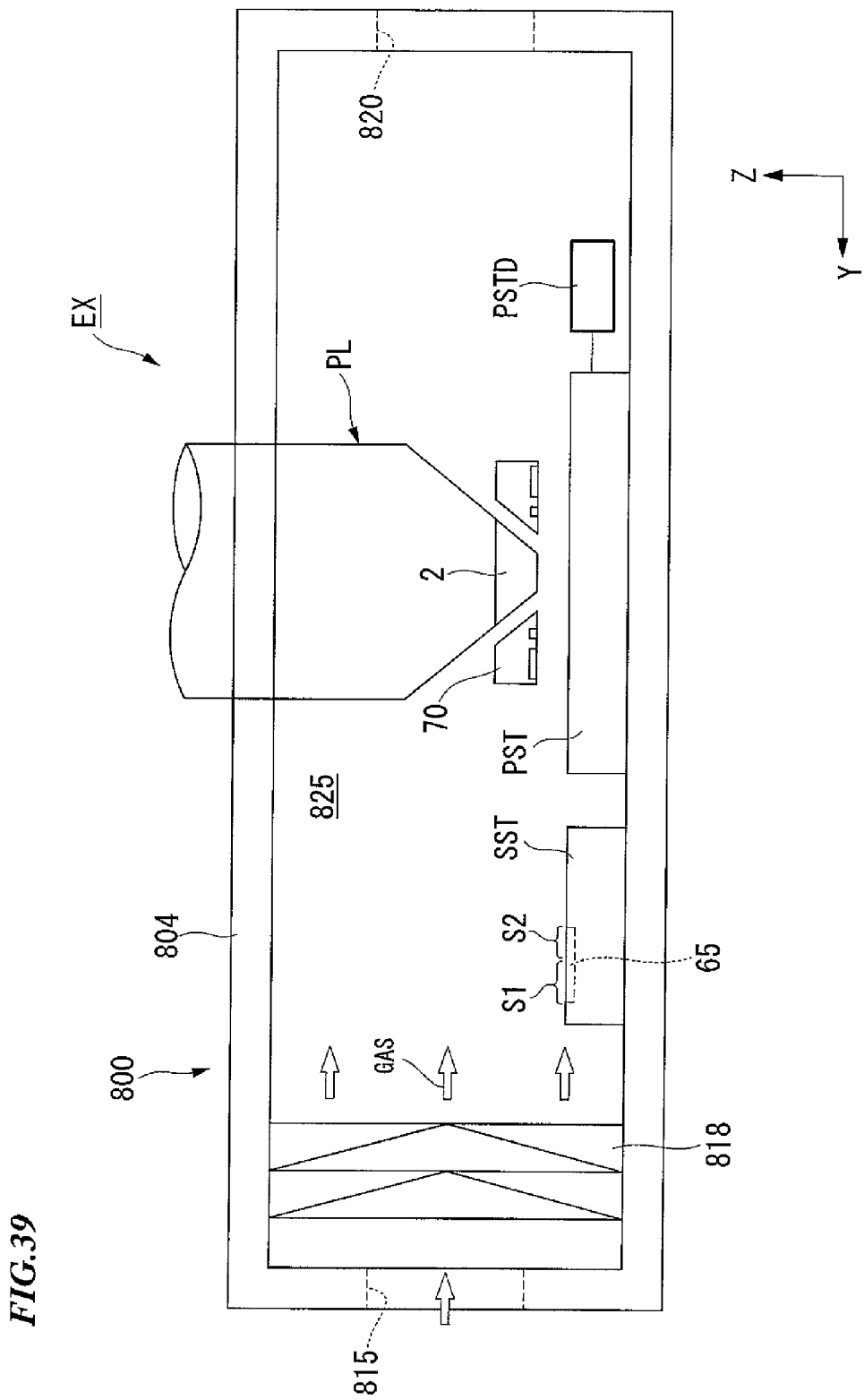
FIG. 39 is a schematic block diagram that explains the operation of the substrate stage relating to the twenty-sixth embodiment.

FIG. 39 is a drawing that shows the schematic configuration of an exposure apparatus EX comprising a substrate stage PST and a measuring stage SST. Note that identical codes are assigned to members in common with FIG. 37, and explanations have been omitted.

As shown in FIG. 39, arranged in the air conditioned chamber 804 of the exposure apparatus DE are at lean the front end part of the image plane side of the projection optical system PL, a substrate stage PST which holds the substrate P, and a measuring stage SST which includes the slit plate 65 of the spatial image measuring system 60. Though omitted from FIG. 39, arranged on the measuring stage SST are not only the spatial image measuring system 60 but the reference member 300, the illuminance non-uniformity sensor 400, and the irradiation amount sensor 600 shown in FIG. 2. Of course, a waveform aberration measuring, apparatus disclosed in, for example, PCT International Publication No, 99/60361 (corresponding to U.S. patent application Ser. No. 09/714,183), Japanese Unexamined Patent Application Publication No. 2002-71514 or U.S. Pat. No. 6,650,399 or a reflecting part disclosed in, for example, Japanese Unexamined Patent Application Publication No. S62-183522 may also be mounted on the measuring stage SST.

When the substrate stage PST has moved from directly below the projection optical system PL to perform exchange of the substrate P for example, the control apparatus CONT moves the measuring stage SST to directly below the projection optical system PL and retains the liquid LQ between the projection optical system PL and the measuring stage SST. Through this, even if the substrate stage PST has moved from directly below the projection optical system PL, it is always possible to bring the end face of the optical element 2 of the projection optical system PL into contact with the liquid LQ.

In addition, as discussed above, since the spatial image measuring system 60, etc. is mounted on the measuring sage SST, it is possible to perform measuring operations using the measuring members and sensors on the measuring stage SST, such as the spatial image measuring system 60, in a status in which the space between the measuring stage SST and the projection optical system PL has been filled with the liquid LQ, and it is possible to reflect those measurement results in subsequent exposure operations.

For example, after measurement using the spatial image measuring system 60, for example, has been performed in a status in which the space between the measuring stage SST and projection optical system PL has been filled with the liquid LQ, while the substrate stage PST is performing exchange of the substrate P, the control apparatus CONT moves the substrate stage PST to directly below the projection optical system PL and moves the measuring stage SST from directly below the projection optical system PL while filling the image plane side optical path space of the projection optical system PL with the liquid LQ.

At this time, in the same way is in the embodiments discussed above, there is a possibility that the liquid LQ will in the first area S1 of the slit plate 65 on the measuring stage SST, so the control apparatus CONT moves the measuring stage SST to a prescribed withdrawal position so that the liquid LQ that has remained in the first area S1 on the slit plate 65 is caused to retreat from the first area S1 by means of gas from the air conditioning system 800. Specifically, by moving the measuring stage SST to the withdrawal position so that the second area S2 is positioned on the downstream side of the gas flow formed by the air conditioning system 800 with respect to the first area S1, the liquid LQ that has remained in the first area S1 can be caused to retreat to the second area S2.

Twenty-Seventh Embodiment

Figure 40:
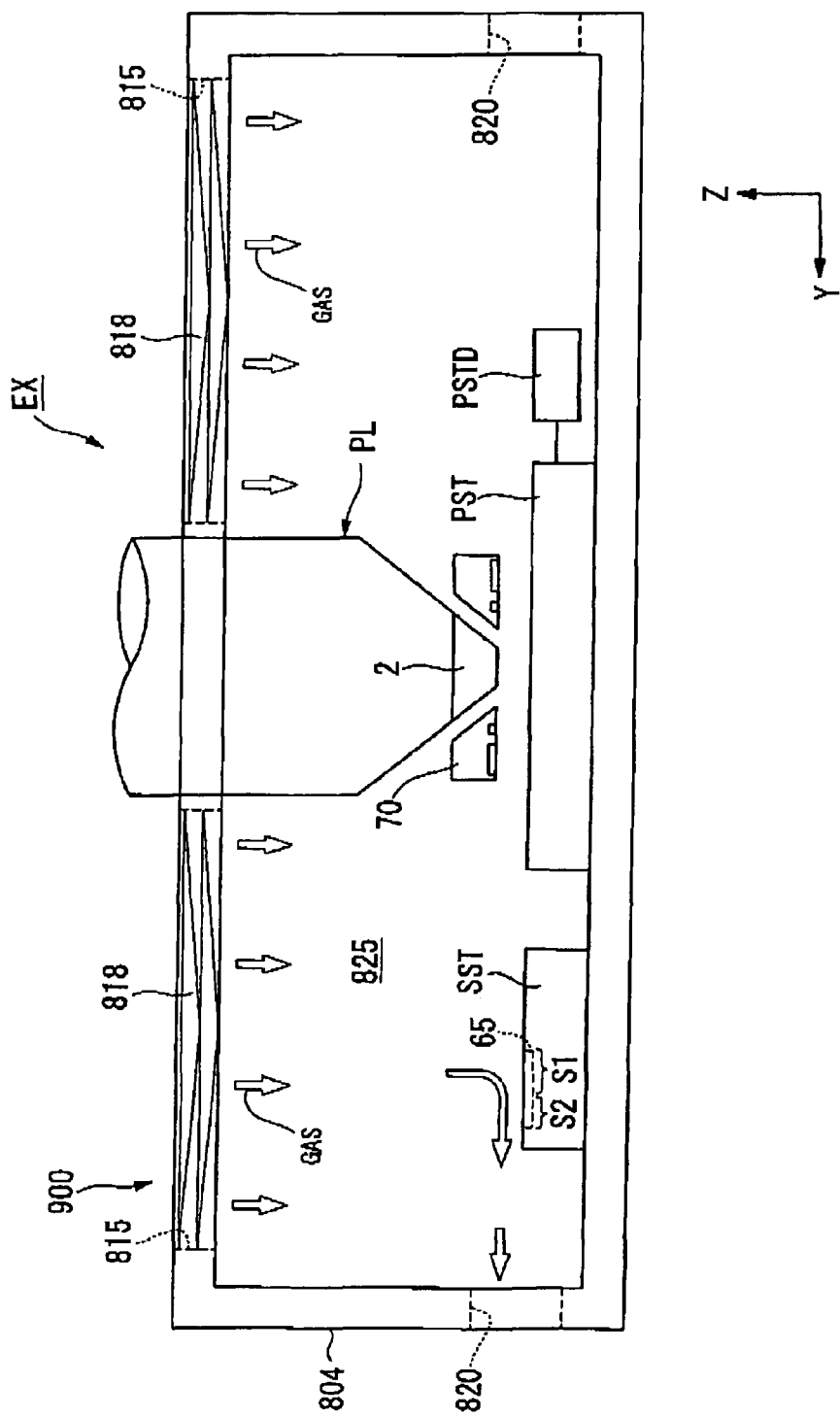
FIG. 40 is a schematic block diagram that explains the operation of the substrate stage relating to the twenty-seventh embodiment.

In addition, in the embodiment shown in FIG. 39, the side flow gas blown from air conditioning system 800 in the horizontal direction (parallel to the Y axis) is used to cause the liquid LQ that has remained to retreat from the first area S1 on the slit plate 65 of the measuring stage SST. However, as shown in FIG. 40, down flow gas blown from an air conditioning system 900 downwardly (parallel to the Z axis) may be used to cause the liquid LQ that has remained to retreat from the first area S1 on the slit plate 65 of the measuring stage SST. FIG. 40 is a schematic block diagram of an exposure apparatus EX relating to the present embodiment Note that identical codes are assigned to members that are in common with FIG. 39, and explanations have been omitted.

In the present embodiment, the control apparatus CONT moves the measuring stage SST to a prescribed withdrawal position so that the liquid LQ that has remained in the first area S1 on the slit plate 65 is caused to retreat from the fast area S1 by means of the gas from air conditioning system 900. Specifically, the measuring stage SST is moved to a prescribed withdrawal position to change the downward gas flow formed by air conditioning system 900 to a horizontal gas flow on the measuring stage SST so that the liquid LQ that has remains in the first arm S1 is caused to retreat to the second area S2 by means of that horizontal gas flow.

Twenty-Eighth Embodiment

Figure 41:
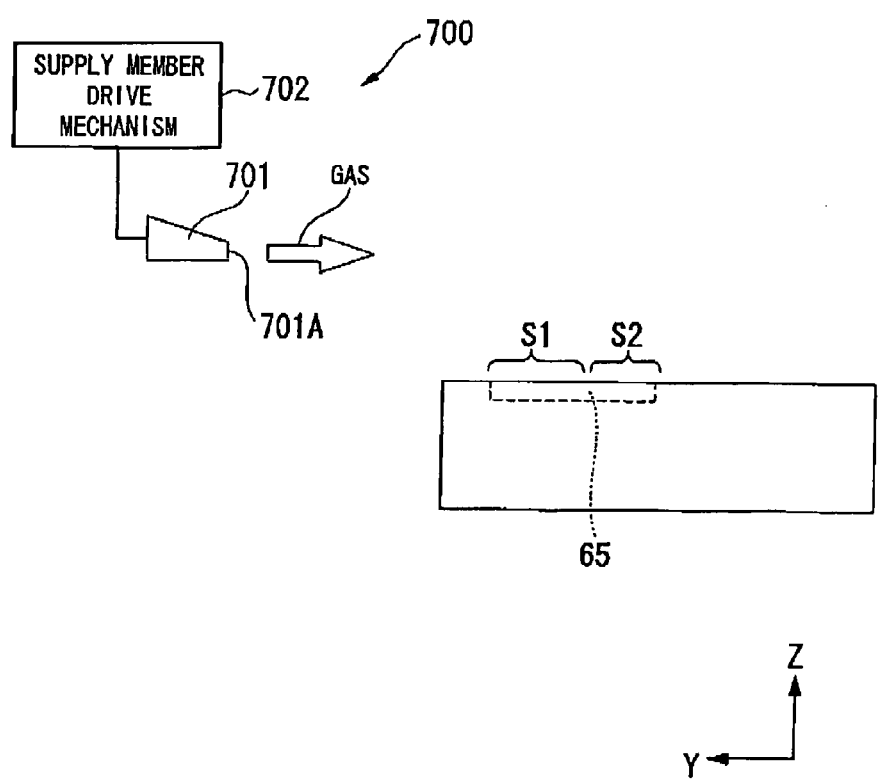
FIG. 41 is a schematic block diagram that explain the operation of the substrate stage relating to the twenty-eighth embodiment.

Also, in the embodiments shown in FIG. 39 and FIG. 40, the gas blown from an air conditioning system (300, 900) is used to cause the liquid LQ that has remained to retreat from the first area S1 on the slit plate 65 of the measuring stage SST, but an air supply system 700 such as that shown in FIG. 35 may also be provided separately from the air conditioning system (800, 900). FIG. 41 is a schematic block diagram of an exposure apparatus EX relating to the present embodiment. Note that identical codes are assigned to members that am in common with the air supply system 700 shown in FIG. 35, and explanations have been omitted.

In the present embodiment, the control apparatus CONT moves the measuring stage SST to a prescribed withdrawal position so that second area S2 is positioned on the downstream side of the gas flow formed by the gas supply system 700 with respect to the first area S1. Through this, the liquid LQ that has remained in the first area S1 on the slit plate 65 is caused to retreat to the second area S2. Note that, in the twenty-eighth embodiment, the gas supply system 700 blows gas horizontally, but it may also be such that it blows gas diagonally or downward.

Note that, in the twenty-sixth to twenty-eighth embodiments as well, the position or the attitude of the measuring stage SST may be controlled so that surface of the first area S1 is substantially parallel with the flow of the gas. Or, the attitude of the measuring stage SST may also be controlled so that the surface of the fit area S1 becomes a slight down slope toward the direction in which the gas flows.

In addition, in the twenty-Sixth to twenty-eighth embodiments as well, the surface of the second area S2 may be more lyophilic with respect to the liquid LQ than the surface of the first area S1.

In addition, in the twenty-sixth to twenty-eighth embodiments as well, degradation of measuring accuracy attributable to deterioration of the liquid repellent film resulting from irradiation of ultraviolet band light (exposure light EL), etc. may also be prevented by covering substantially the entire upper surface of the measuring stage SST with liquid repellent film and partially removing the film on the pattern used in measurement.

In addition, in the twenty-sixth to twenty-eighth embodiments as well, the slit plate 65 of the spatial image measuring system 60 was explained as an example, but it is possible to cause the liquid LQ that has remained to retreat from the first area S1 used in measurement to the second area S2, where there is no effect on measurement, for the reference member 300 and other sensors such as the illuminance non-uniformity sensor 400 in a similar manner.

As discussed above, the liquid LQ in the present embodiment is pure water. Pure water has advantages in that it can be easily obtained in large quantity at semiconductor fabrication plants, etc. and in that it has no adverse effects on the photoresist on the substrate P or on the optical elements (lenses), etc. In addition, pure water has no adverse effects on the environment and contains very few impurities, so one can also expect an action whereby the surface of the substrate P and the surface of the optical element provided on the front end surface of the projection optical system PL are cleaned. Note that, in the case where the purity of the pure water supplied from the plant, etc. is low, the exposure apparatus may be provided with an ultra pure water manufacturing equipment.

In addition, the index of refraction n of pure water (water) with respect to exposure light EL with a wavelength of approximately 193 nm is nearly 1.44, so in the case where ArF excimer laser light (193 nm wavelength) is used as the light source of the exposure light EL, on the substrate P, it is possible to shorten the wavelength to 1/n, that is, approximately 134 nm, to obtain high resolution. Also, the depth of focus is expanded by approximately n times, that is, approximately 1.44 times, compared with it being in air, so in the case where it would be permissible to ensure the same level of depth of focus as the case in which it is used in air, it is possible to further increase the numerical aperture of the projection optic system PL, and resolution improves on this point as well.

Note that, when a liquid immersion method such as that discussed above is used, the numerical aperture NA of the projection optical system PL may at times become 0.9 to 1.3. In this way, in the case in which the numerical aperture NA of the projection optical system PL becomes larger, image formation characteristics may deteriorate due to a polarization effect with the random polarized light conventionally used as the exposure light, so it is preferable that polarized light illumination be used. In that case, linear polarization illumination to match the lengthwise direction of the line pattern of the line and space pattern of the mask (reticle) is performed, and refracted light of the S polarization component (TE polarization component), that is, the polarization direction component along the lengthwise direction of the line pattern, may be irradiated from the mask (reticle) pattern in large quantities. In the case in which the space between the projection optical system PL and the resist coated onto the surface of the substrate P is filled with a liquid, the transmittivity of the refracted light of the S polarization component (TE polarization component) at the resist surface, which contributes to the improvement of contrast, is higher than that of the case in which the space between the projection optical system PL and the resist coated onto the surface of the substrate P is filled with air (gas), so high image formation performance can be obtained even in such cases as when the numerical aperture NA of the projection optical system exceeds 1.0. In addition, it is even more effective when a phase shift mask or an oblique incidence illumination method (particularly, the dipole illumination method) coordinated with the lengthwise direction of the line pattern such as that disclosed in Japanese Unexamined Patent Application Publication No. H6188169 is appropriately combined. In particular, a combination of the linear polarization illumination method and the dipole illumination method is effective in the case in which the circumferential direction of the line and space pattern is limited to a prescribed direction and in the case which the hole pattern is densely concentrated along a prescribed direction. For example, in the case in which a halftone type phase shift mask with transmittivity of 6% pattern with a half pitch of approximately 45 nm) is illuminated via the linear polarization illumination method and the dipole illumination method, when the illumination σ defined at the circumscribed circle of the two light beams that form the dipole at the pupil plane of the illumination system is 0.95, the radius of the respective light beams at that pupil plane is 0.125σ, and the numerical aperture of the projection optical system PL is NA=1.2, it is possible to increase depth of focus (DOE) approximately 150 nm more than when random polarized light is used.

In addition, a combination of linear polarization illumination and a small σ illumination method (an illumination method in which the value that indicates the ratio of the numerical aperture NA of the illumination system to the numerical aperture NAp of the projection optical system is a 0.4 or less) is also effective.

In addition, for example, in the vase when an ArF excimer laser is used as the exposure light, and a projection optical system PL with a reduction rate of approximately ¼ is used to expose a fine line and space pattern (for example, lines and spaces of approximately 25 to 50 nm) onto the substrate P, depending on the structure of the mask M (for example, the degree of fineness of the pattern and the thickness of the chrome), the mask M acts as a polarization plate due to the wave guide effect, and more refracted light of the S polarization component (TE polarization component) emerges from the mask M than refracted light of the P polarization component (IM polarization component), which reduces contrast. In this case, it is preferable that the linear polarization illumination discussed above be used, but even in the case in which the numerical aperture NA of the projection optical system PL is large at 0.9 to 1.3 even though the mask M is illuminated by random polarized light, it would be possible to obtain high resolution performance.

In addition, in a case such as one where an extremely fine line and space pattern on the mask M is exposed onto the substrate P, there is a possibility that the P polarization component (TM polarization component) will be larger than the S polarization component (TE polarization component) due to the wire grid effect but, for example, if the conditions are such that ArF excimer laser light is used as the exposure light, and a projection optical system PL with a reduction rate of approximately ¼ is used to expose a line and space pattern larger than 25 nm onto the substrate P, more refracted light of the S polarization component (TE polarization component) will emerge from the mask than refracted light of the P polarization component (TM polarization component), so it would be possible to obtain high resolution performance even in the case in which the numerical aperture NA of the projection optical system PL becomes large at 0.9 to 1.3.

In addition, as disclosed in Japanese Unexamined Patent Application Publication No. H6-53120, not only linear polarization illumination (S polarization illumination) that matches the lengthwise direction of the line pattern of the mask (reticle) but a combination of a polarization illumination method that linearly polarizes in the tangential (circumferential) direction of a circle centering on the optical axis and the grazing incidence method is also effective. In particular, in the case where not only a line pattern in which the pattern of the mask (reticle) extends in one prescribed direction but a line pattern that extends in a plurality of different directions are intended (line and space patterns with different circumferential directions are intermingled), as disclosed in the same Japanese Unexamined Patent Application Publication No. H6-53120, by jointly using a polarization illumination method that linearly polarizes in the tangential direction of a circle centering on the optical axis and the zonal illumination method, it is possible to obtain high resolution performance even in the case in which the numerical aperture NA of the projection optical system is large. For example, in the case where illumination of a halftone type phase shift mask with a transmittivity of 6% (pattern with a half pitch of approximately 63 nm) is performed by jointly using a polarization illumination method that linearly polarizes in the tangential direction of a circle centering on the optical axis and the zonal illumination method (zone ratio ¾), when the illumination a is 0.95, and the numerical aperture of the projection optical system FL is NA 1.00, it is possible to increase the depth of focus (DOF) by approximately 250 nm over when random polarized light is used, and at a numerical aperture of the projection optical system of NA=1.2 with a pattern with a half pitch of approximately 55 nm, it is possible to increase the depth of focus by approximately 100 nm.

Furthermore, in addition to the respective illumination methods discussed above, it would also be effective to apply the progressive focus exposure method disclosed in, for example, Japanese Unexamined Patent Application Publication No. H4-277612 or Japanese Unexamined Patent Application Publication No. 2001-345245 or a multi-wavelength exposure method that obtains similar effects to the progressive focus method using multi-wavelength (for example, two wavelengths) exposure light.

In the present embodiment, an optical element 2 is attached to the front end of the projection optical system PL, and it is possible to perform adjustment of the optical characteristics of the projection optical system PL, for example, aberration (spherical aberration, coma aberration, etc.) by means of this lens. Note that the optical element attached to the front end of the projection optical system PL may be an optical plate used in the adjustment of the optical chartists of the projection optical system PL. Or it may be a parallel flat surface plate that is able to transmit the exposure light EL.

Note that, in the case where the pressure between the optical element of the front end of the projection optical system PL and the substrate P generated by the flow of the liquid LQ is large the optical element may be firmly secured so that it does not move by mean of that pressure without making it possible to replace that optical element.

In addition, the exposure apparatus discussed above that applies a liquid immersion method has a configuration that exposes the substrate P by filling the optical path space of the emergence side of the optical element 2 of the projection optical system PL with a liquid (pure water), but as disclosed in PCT International Publication No. 2004/019128, the optical path space of the incidence side of the optical element 2 of the projection optical system PL may also be filled with a liquid (pure water). In this case, the optical element 2 may also be a parallel flat plate, or it may also be a lens.

Note that, in the present embodiment, it is a configuration in which the space between the projection optical system PL and that the sure of the substrate P is filled with the liquid LQ, but for example it may be a configuration in which the liquid LQ is filed in a status in which a cover glass costing of parallel flat surface plates has been attached on the surface of the substrate P, for example.

Note that the liquid LQ of the present embodiment is water, but it may be a liquid other than water, for example, in the case where the light source of the exposure light EL is an $F_2$ laser, this $F_2$ laser light does not pass through water, so the liquid LQ may be a fluorine group fluid such as perfluoropolyether (PFPE) or fluorine oil that is able to transmit $F_2$ s light. In this case, lyophilization treatment is performed by forming a thin film using a substance with the molecular structure with a small polarity that includes, for example, fluorine at the portion that comes into contact with the liquid LQ. In addition, it is also possible to use a liquid LQ that has transmittivity with respect to the exposure light EL, has as high a refractive index as possible, and is stable with respect to the photoresist that is coated onto the projection optical system PL and the surface of the substrate P (for example, cedar oil). In this case as well, surface treatment is performed according to the polarity of the liquid LQ used.

Note that, applicable as the substrate P of the aforementioned respective embodiments are not only a semiconductor wafer for the manufacture of semiconductor devices but glass substrates for display devices, ceramic wafers for thin film magnetic heads, or mask or reticle base plates, etc, (synthetic quart silicon wafer) used in exposure apparatuses.

Applicable as the exposure apparatus EX are, in addition to step and scan system scanning exposure apparatuses (scanning steppers) that synchronously move the mask M and the substrate P to scan expose the pattern of a mask M, step and repeat system projection exposure apparatuses (steppers) that full-field expose the pattern on the mask M in a status in which the mask M and the substrate P have been made stationary and sequentially step-move the substrate P.

In addition, application to an exposure apparatus of a system that full field exposes a reduced image of a first pattern onto a substrate P using as the exposure apparatus EX a projection optical system (for example, a refracting projection optical system that does not include a reflecting element and whose reduction ratio is ⅛) in a status in which both the first pattern and the substrate P have been made nearly stationary is also possible. In this case, it is also applicable to a stitch system full field exposure apparatus that subsequently full field exposes a reduced image of the second pattern onto a substrate P so that it is partially superposed with the first pattern using that projection optical system in a status in which the second pattern and the substrate P have been made nearly stationary. In addition, for the stitch system exposure apparatus, application to a step and stitch system exposure apparatus that partially superposes at least two patterns on the substrate P and sequentially moves the substrate P is also possible.

In addition, the present invention is also applicable to a twin-stage type exposure apparatus disclosed in, for example, Japanese Unexamined Pate Application Publication No. H10-163099, Japanese Unexamined Patent Application Publication No. H10-214783, and Published Japanese Translation No. 2000-505958 of PCT International Application.

Note that, in the case of a twin-stage type exposure apparatus, measuring members and measuring apparatuses such as a spatial image measuring system 60 and an illumination intensity nonuniformity sensor 400 may all be mounted to both stages, but it is also possible to mount some of the sensors (for example, the spatial image measuring system 60) on one of the stages and provide the sensors (the illumination intensity nonuniformity sensor 400, the irradiation amount sensor 600, etc.) on the other stage.

In addition, in the embodiments discussed above, an exposure apparatus that locally fills liquid between the projection optical system PL and the substrate P is employed, but the present invention may also be applied to a liquid immersion exposure apparatus that performs exposure of the substrate in a status in which the entire surface of the substrate subject to exposure is covered by liquid as disclosed in, for example, Japanese Unexamined Patent Application Publication No. H06-124873.

In addition, the exposure apparatus of the present invention can also be applied to a type of exposure apparatus that does not have a projection optical system. In this case, the exposure light from the light source passes through the optical elements and is irradiated to the liquid immersion area. In addition, it is also possible to apply the present invention to an exposure apparatus (lithography system) that exposes a line and space pattern onto a substrate P by forming interference fringes on the substrate P as disclosed in PCT International Publication No. 2001/035168.

The types of exposure apparatuses EX are not limited to exposure apparatuses for semiconductor device fabrication that expose a semiconductor device pattern on a subdue P but are also widely applicable to exposure apparatuses for the manufacture of liquid crystal display elements and for the manufacture of displays, and exposure apparatuses for the manufacture of thin film magnetic heads, image pickup elements (CCDs), or reticles or masks.

In the case where a Linear motor is used in the substrate stage PST or the mask stage MST (see U.S. Pat. Nos. 5,623, 853 or 5,528,118), an air floating type that uses air bearings or a magnetic levitation type that uses Lorentz's force or reactance force may be used. In addition, the respective stages PST, MST may be the types that move along a guide or may be the guideless type in which a guide is not provide.

For the drive mechanisms of the respective stages PST, MST, a planar motor that places in opposition a magnet unit that two-dimensionally arranges magnets and an armature unit that arranges oils two-dimensionally and drives the respective stages PST, MST by electromagnetic force may be used. In such a case, either the magnet unit or the armature unit is connected to the stage PST, MST, and the other from among the magnet unit and the armature unit may be provided on the moving surface side of the stage PST, MST.

The reaction force generated by the movement of the substrate stage PST may be caused to mechanically escape to the floor (ground) using a frame member so that it is not transmitted to the projection optical system PL as described in Japanese Unexamined Patent Application Publication No. H8-166475 (corresponding to U.S. Pat. No. 5,528,118).

The reaction force generated by the movement of the mask stage MST may be caused to mechanically escape to the floor (ground) using a frame member so that it is not transmitted to the projection optical system PL as described in Japanese Unexamined Patent Application Publication No. H8-330224 (U.S. Pat. No. 5,874,320).

As discussed above, the exposure apparatus EX of the present embodiment is manufactured by assembling various subsystems, including the respective constituent elements presented in the Scope of Patents Claim of the present application, so that the prescribed mechanical precision, electrical precision and optical precision can be maintained. To sure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly of the various subsystems to the exposure apparatus has ended, overall adjustment is performed, and the various precisions are ensured for the exposure apparatus as a whole. Note that it is preferable that the manufacture of the exposure apparatus, be performed in a clean room in which the temperature, the degree of cleanliness, etc. are controlled.

Figure 42:
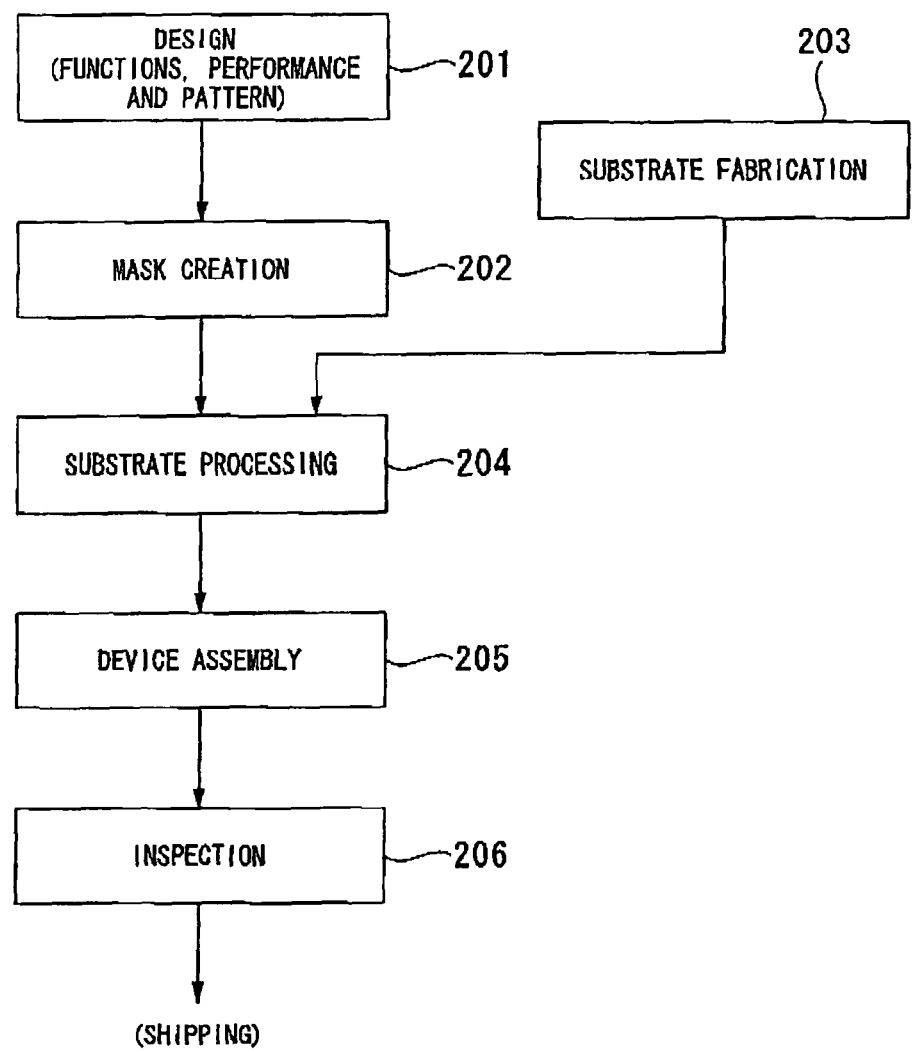
FIG. 42 is a flow chart that shows an example of the semiconductor device manufacturing process.

As shown in FIG. 42, microdevices such as semiconductor devices are manufactured by going through a step 201 that performs microdevice function and performance design, a step 202 that creates the mask (reticle) based on this design step, a step 203 that manufactures the substrate that is the device base material, a substrate processing step 204 that exposes the pattern on the mask onto a substrate by means of an exposure apparatus EX of the embodiments discussed above, a device assembly step (including the dicing process, bonding process and packaging process) 205, an inspection step 206, etc.

The invention claimed is:

1. An exposure apparatus that exposes a substrate via a liquid, comprising:
   a measuring system, which has a first pattern formed on a prescribed surface; and
   second area defined in a vicinity of a first area on the prescribed surface, the first area including the first pattern, and
   wherein a second pattern is formed in the second area so that the liquid that has remained and extended over the first area and the second area retreats from the first area and collects in the second area.

2. An exposure apparatus according to claim 1, wherein a position of the center of the drawing formed by the first pattern and the second pattern on the prescribed surface is outside the first pattern.

3. An exposure apparatus according to claim 1, wherein the first pattern and the second pattern are connected.

4. An exposure apparatus according to claim 1, wherein
   the first pattern includes a first line pattern that extends in a first direction, and
   the second pattern includes a plurality of second line patterns that extend in a second direction that intersects the first direction and are arrayed in the first direction.

5. An exposure apparatus according to claim 4, wherein the second line pattern is longer than the first line pattern.

6. An exposure apparatus according to claim 4, wherein a distance between an end part of the second line pattern and a connection position, at which the end part of the first line pattern or the extended line thereof and the second line pattern are connected, is longer than the first line pattern.

7. An exposure apparatus according to claim 6, wherein the distance between the connection position and one end part of the second line pattern is longer than a distance between the connection position and an other end part of the second line pattern.

8. An exposure apparatus according to claim 4, wherein second line pattern is bent in a middle thereof.

9. An exposure apparatus according to claim 1, wherein the second pattern includes a dot shape pattern.

10. An exposure apparatus according to claim 1, wherein the second pattern includes a lattice-shaped pattern.

11. An exposure apparatus according to claim 1, wherein a surface of the second area is more lyophilic with respect to the liquid than a surface of the first area.

12. An exposure apparatus according to claim 1, wherein a surface of the second area is rougher than a surface of the first area.

13. An exposure apparatus according to claim 1, wherein a lyophilic area and a lyophobic area arranged outside of the lyophilic area are provided on the prescribed surface, and the first area and the second area are provided in an area separated from a center of the lyophilic area.

14. An exposure apparatus according to claim 1, wherein the first pattern includes a line pattern.

15. An exposure apparatus according to claim 1, wherein the first pattern includes a hole pattern.

16. An exposure apparatus according to claim 1, wherein at least one of the first pattern or the second pattern has a concave part or a convex part or both.

17. An exposure apparatus according to claim 1, wherein the measuring system has a light receiving element that receives light via the first pattern.

18. A device manufacturing method comprising:
exposing a substrate with the exposure apparatus according to claim 1; and
developing the exposed substrate to produce the device.

19. An exposure apparatus that exposes a substrate via a liquid, comprising:
a measuring system, in which a measuring part is arranged on a prescribed surface;
a first area defined on the prescribed surface so as to include the measuring part; and
a second area defined in the vicinity of the first area on the prescribed surface, and
wherein a prescribed processing is performed on a surface of the first area or a surface of the second area or both so that the liquid that has remained and extended over the first area and the second area retreats from the first area and collects in the second area.

20. An exposure apparatus according to claim 19, wherein the surface of the second area is more lyophilic with respect to the liquid than the surface of the first area.

21. An exposure apparatus according to claim 19, wherein the surface of the second area is rougher than the surface of the first area.

22. An exposure apparatus according to claim 19, wherein a concave part or a convex part or both are formed on the surface of the second area.

23. An exposure apparatus according to claim 22, wherein a concave part is formed on the surface of the first area, and the concave part that is deeper than the concave part of the first area is formed on the surface of the second area.

24. An exposure apparatus according to claim 22, further comprising:
a projection optical system; and
a movable stage on an image plane side of the projection optical system, and
wherein an upper surface of the stage includes the prescribed surface.

25. An exposure apparatus according to claim 24, further comprising:
a liquid immersion mechanism that forms a liquid immersion area of the liquid between the projection optical system and the stage, and
wherein the measuring system receives light that has passed through the projection optical system and the liquid of the liquid immersion area.

26. An exposure apparatus that exposes a substrate via a liquid, comprising:
a measuring system, in which a measuring part is arranged on a prescribed surface;
a first area defined on the prescribed surface so as to include the measuring part; and
a second area defined on the prescribed surface that is larger than the first area so as to surround the first area, and
wherein the first area is defined at a position separated from a center of the second area so that the liquid that has remained and extended over the first area and the second area retreats from the first area and collects in the second area.

27. An exposure apparatus according to claim 26, wherein the surface of the second area is more lyophilic with respect to the liquid than the surface of the first area.

28. An exposure apparatus that exposes a substrate via a liquid comprising:
a measuring system, in which a measuring part is arranged on a prescribed surface; and
a first area defined on the prescribed surface so as to include the measuring part, and
wherein a flow of gas is produced onto the first area so that the liquid that has remained in the first area retreats from the first area, and
a gas supply port that produces the gas flow that is substantially parallel to a surface of the first area is provided in a vicinity of the first area.

29. An exposure apparatus according to claim 28, further comprising an air conditioning system that air-conditions a space in which the prescribed surface is provided, and
wherein the liquid that has remained in the first area retreats from the first area due to the flow of gas produced by the air conditioning system.

30. An exposure apparatus according to claim 29, further comprising a control apparatus that controls a position or an attitude of the first area so that the surface of the first area becomes substantially parallel to the gas flow produced by the air conditioning system.

31. An exposure apparatus according to claim 30, further comprising a stage that holds the measuring part and is movable, and
wherein an upper surface of the stage includes the prescribed surface, and the control apparatus controls the position or the attitude of the first surface by controlling the position or the attitude of the stage.

32. An exposure apparatus according to claim 28, further comprising a second area that is defined on the downstream side of the gas flow with respect to the first area on the prescribed surface, and for which a prescribed processing has been performed.

33. An exposure apparatus according to claim 32, wherein a surface of the second area is more lyophilic with respect to the liquid than the surface of the first area.

34. An exposure apparatus according to claim 32, wherein a surface of the second area is rougher than the surface of the first area.

35. An exposure apparatus according to claim 32, wherein concave parts or convex parts or both are formed on a surface of the second area.

36. An exposure apparatus according to claim 32, wherein concave parts are formed on the surface of the first area, and concave parts that are deeper than the concave parts of the first area are formed on a surface of the second area.

37. An exposure apparatus that exposes a substrate via a liquid, comprising:
a measuring system, in which a measuring part is arranged on a prescribed surface;
a first area defined on the prescribed surface so as to include the measuring part; and
a second area in a vicinity of the first area, and
wherein a liquid repellent film is formed on the surface of the second area, and a liquid repellent film is not formed on the surface of the first area.

38. An exposure apparatus according to claim 37, wherein the liquid repellent film is removed in the first area.

39. An exposure apparatus according to claim 37, wherein the first area is surrounded by the second area.

40. An exposure apparatus according to claim 37, wherein ultraviolet light is irradiated onto at least a part of the first area, but not onto the second area.

41. An exposure apparatus according to claim 40, wherein the substrate is exposed with exposure light from a projection optical system, and the ultraviolet light comprises the exposure light from the projection optical system.

42. An exposure apparatus according to claim 41, further comprising:
a moving element that is capable of moving relative to the projection optical system, wherein
the prescribed surface comprises an upper surface of the moving element.

43. An exposure apparatus according to claim 42, wherein the moving element is capable of moving below the projection optical system while supporting the substrate.

44. An exposure apparatus according to claim 37, wherein the liquid repellent film comprises a fluorine resin film.

45. An exposure apparatus according to claim 37, wherein exposure light is irradiated onto the first area via the liquid.

46. An exposure apparatus according to claim 45, wherein the liquid is in contact with a surface of the first area and a surface of the second area.

47. An exposure apparatus according to claim 37, further comprising:
a receiving element that receives exposure light via the measuring part at the first area.

48. An exposure apparatus according to claim 47, wherein an optical characteristic of a projection optical system is obtained based on a light receiving result of a light receiving element.

49. An exposure apparatus according to claim 48, wherein the optical characteristic comprises an image formation characteristic of the projection optical system.

50. An exposure apparatus according to claim 37, wherein at least a part of a surface of the first area comprises a surface of a transparent member.

51. An exposure apparatus according to claim 50, wherein the transparent member comprises a glass member.

52. An exposure apparatus according to claim 50, wherein at least a part of the surface of the first area comprises a surface of a light shielding film that is provided on the transparent member.

53. An exposure apparatus according to claim 37, wherein at least a part of a surface of the first area comprises a surface of a light shielding member.

54. An exposure apparatus according to claim 52, wherein the light shielding film comprises a chrome film.

55. An exposure apparatus according to claim 54, wherein the measuring part comprises an aperture pattern that is formed in a light shielding film.

56. An exposure apparatus according to claim 55, wherein the aperture pattern comprises a line pattern.

57. An exposure apparatus according to claim 37, wherein at least a part of a surface of the first area comprises a surface of a reflecting film.

58. An exposure apparatus according to claim 57, wherein the reflecting film comprises an aluminum film.

* * * * *